United States Patent
Shin et al.

(10) Patent No.: US 9,977,327 B2
(45) Date of Patent: May 22, 2018

(54) PHOTOSENSITIVE COATING COMPOSITION, COATING CONDUCTIVE FILM USING PHOTOSENSITIVE COATING COMPOSITION, AND METHOD FOR FORMING COATING CONDUCTIVE FILM

(71) Applicant: KOREA ELECTRONICS TECHNOLOGY INSTITUTE, Seongnam-si, Gyeonggi-do (KR)

(72) Inventors: Kwonwoo Shin, Hwaseong-si (KR); Jisun Park, Yongin-si (KR); Jinwoo Cho, Seongnam-si (KR); Yoonjin Kim, Suwon-si (KR)

(73) Assignee: KOREA ELECTRONICS TECHNOLOGY INSTITUTE, Seongnam-si, Gyeonggi-do (KR)

( * ) Notice: Subject to any disclaimer, the term of this patent is extended or adjusted under 35 U.S.C. 154(b) by 227 days.

(21) Appl. No.: 14/760,089

(22) PCT Filed: Mar. 12, 2014

(86) PCT No.: PCT/KR2014/002057
§ 371 (c)(1),
(2) Date: Jul. 9, 2015

(87) PCT Pub. No.: WO2014/157856
PCT Pub. Date: Oct. 2, 2014

(65) Prior Publication Data
US 2015/0355540 A1 Dec. 10, 2015

(30) Foreign Application Priority Data

Mar. 25, 2013 (KR) .......... 10-2013-0031600
Jul. 25, 2013 (KR) .......... 10-2013-0087791

(Continued)

(51) Int. Cl.
*G03F 7/038* (2006.01)
*B82Y 30/00* (2011.01)
(Continued)

(52) U.S. Cl.
CPC .......... *G03F 7/038* (2013.01); *B82Y 30/00* (2013.01); *C09D 5/24* (2013.01); *G03F 7/0047* (2013.01)

(58) Field of Classification Search
CPC ...... G03F 7/004; G03F 7/0043; G03F 7/0045; G03F 7/0047; G03F 7/038; H01B 5/14; C09D 5/24; C09D 7/12; B82Y 30/00
(Continued)

(56) References Cited

U.S. PATENT DOCUMENTS

| | | | |
|---|---|---|---|
| 2011/0177332 A1* | 7/2011 | Park | B29C 47/0021 428/364 |
| 2011/0192633 A1* | 8/2011 | Allemand | C09D 11/101 174/128.1 |

(Continued)

FOREIGN PATENT DOCUMENTS

| | | |
|---|---|---|
| CN | 102804064 A | 11/2012 |
| JP | 05092955 A1 | 4/1993 |

(Continued)

OTHER PUBLICATIONS

English-language abstract of KR 2004-106947 (Dec. 2004).*
(Continued)

*Primary Examiner* — John A McPherson
(74) *Attorney, Agent, or Firm* — Hauptman Ham, LLP

(57) ABSTRACT

The present invention relates to a photosensitive coating composition, a conductive coating film using the photosensitive coating composition, and a method for forming the conductive coating film. The present invention provides photosensitive coating composition for forming a conduc- (Continued)

tive coating film, the composition containing a conductive nanomaterial and a photosensitive material. Further, the present invention provides a conductive coating film formed on a substrate, the conductive coating film formed using a photosensitive coating liquid. Here, after the photosensitive coating liquid is coated on the substrate, an exposed region and a non-exposed region are formed by exposure and washing, wherein the non-exposed region has at least two times the conductivity of the exposed region.

16 Claims, 33 Drawing Sheets

(30) Foreign Application Priority Data

| | | |
|---|---|---|
| Sep. 13, 2013 | (KR) | 10-2013-0110212 |
| Oct. 10, 2013 | (KR) | 10-2013-0120311 |
| Dec. 26, 2013 | (KR) | 10-2013-0164539 |
| Dec. 27, 2013 | (KR) | 10-2013-0165527 |

(51) Int. Cl.
  *C09D 5/24* (2006.01)
  *G03F 7/004* (2006.01)

(58) Field of Classification Search
  USPC .................................................. 430/270.1
  See application file for complete search history.

(56) References Cited

U.S. PATENT DOCUMENTS

| | | | | |
|---|---|---|---|---|
| 2014/0034360 A1* | 2/2014 | Tanaka | ...................... | H01B 1/22 174/251 |
| 2015/0165755 A1* | 6/2015 | Jin | ......................... | H05K 3/182 101/483 |
| 2016/0326388 A1* | 11/2016 | Petcavich | ............. | C09D 11/101 |

FOREIGN PATENT DOCUMENTS

| | | | |
|---|---|---|---|
| JP | 9160240 | A | 6/1997 |
| JP | 2009294648 | A | 12/2009 |
| JP | 2011018636 | A | 1/2011 |
| JP | 2012169072 | A | 9/2012 |
| JP | 2013010977 | A | 1/2013 |
| JP | 2013518974 | A | 5/2013 |
| KR | 1019990025818 | B1 | 4/1999 |
| KR | 1020040106947 | A | 12/2004 |
| KR | 1020080053834 | A | 12/2009 |
| KR | 10-2012-0038438 | A | 4/2012 |
| KR | 1020120038438 | A | 4/2012 |
| KR | 1020120061487 | A | 6/2012 |
| KR | 1020130002320 | A | 1/2013 |
| WO | 2011097470 | A2 | 8/2011 |

OTHER PUBLICATIONS

International Search Report for PCT/KR2014/002057 dated Jun. 24, 2014.
Office Action issued for corresponding Korean Application No. 10-2013-0031600 dated Apr. 28, 2014.
Notice of Allowance issued for corresponding Korean Application No. 10-2013-0031600 dated Sep. 24, 2014.
Notice of Allowance issued for corresponding Korean Application No. 10-2013-0087791 dated Nov. 20, 2014.
Notice of Allowance issued for corresponding Korean Application No. 10-2013-0120311 dated Feb. 23, 2015.
Korean Office Action for application No. 10-2013-0110212 dated Aug. 26, 2015.
Korean Notice of Allowance dated May 8, 2016 corresponding to Korean Application No. 10-2013-0110212.
Zhengwei Chen, "Printing and Packaging Materials and Suitability", Chemical Industry Press, pp. 226-228.
Chinese Office Action dated on Feb. 13, 2017 for Chinese Patent Application No. 201480009151.1.

* cited by examiner

PHOTOSENSITIVE COATING COMPOSITION, COATING CONDUCTIVE FILM USING PHOTOSENSITIVE COATING COMPOSITION, AND METHOD FOR FORMING COATING CONDUCTIVE FILM

CROSS REFERENCE TO RELATED APPLICATIONS

This application claims the priority of Korean Patent Application No. 10-2013-0031600 filed on Mar. 25, 2013 in the Korean Intellectual Property Office, Korean Patent Application No. 10-2013-0087791 filed on Jul. 25, 2013 in the Korean Intellectual Property Office, Korean Patent Application No. 10-2013-0110212 filed on Sep. 13, 2013 in the Korean Intellectual Property Office, Korean Patent Application No. 10-2013-0120311 filed on Oct. 10, 2013 in the Korean Intellectual Property Office, Korean Patent Application No. 10-2013-0164539 filed on Dec. 26, 2013 in the Korean Intellectual Property Office, and Korean Patent Application No. 10-2013-0165527 filed on Dec. 27, 2013 in the Korean Intellectual Property Office. Further, this application is the National Phase application of International Application No. PCT/KR2014/002057 filed on Mar. 12, 2014, which is incorporated herein by reference in its entirety.

TECHNICAL FIELD

The present invention relates to a conductive coating film. More specifically, the present invention relates to a photosensitive coating composition capable of forming an electrical interconnection pattern by forming a coating film of a composition including a conductive nanomaterial, such as metal nanowires or nanocarbon, through a wet coating process, and exposing and washing the coating film, a conductive coating film using the photosensitive coating composition, and a method of fabricating the conductive coating film.

BACKGROUND ART

A conductive thin film including metal nanowires or nanocarbon is a conductive film in which conductive nanomaterials having the shape of wires, tubes, or nanoparticles are continuously connected, and is formed as a coating on a substrate. Since the conductive film including the metal nanowires or nanocarbon is formed by coating various substrates with the dispersions formed through a simple solution process, and thereby has electrical conductivity, it may be used as a transparent electrode and a circuit electrode of a touch panel, a display, or the like.

In order to use the conductive film including the metal nanowires or nanocarbon as a transparent electrode and a circuit electrode, it is necessary to flow current in a specific pattern by controlling electrical connection and disconnection in a local area of the conductive film.

Normally, interconnection patterns may be formed in a substrate including a conductive film by a photolithography process or a laser etching method. In the photolithography process, interconnection patterns may be formed by forming a photoresist pattern on the conductive film by coating a conductive film with a photoresist, exposing the photoresist to UV light, and developing the exposed photoresist, and then etching the conductive film in a specific pattern by a wet etching or dry etching method. In addition, in the laser etching method, interconnection patterns may be formed by etching the conductive layer in a specific pattern using a laser.

In such methods, fine patterns may be formed in the conductive film using the well-known processes. However, problems in which differences in light reflectance, light transmittance, and haze are induced due to a difference in distribution of metal nanowires or nanocarbon between an etched region and a non-etched region of the conductive film including interconnection patterns, and interconnection patterns of the conductive film are visible due to a difference in height between the etched region and the non-etched region, may occur.

In addition, in the photolithography process, since an additional process is required to form the interconnection patterns in the conductive film, processing costs may be additionally required and productivity may be reduced.

DISCLOSURE

Technical Problem

Accordingly, the present invention is directed to a photosensitive coating composition capable of forming an interconnection pattern through which currents flow in a specific pattern by generating a difference in electrical conductivity in a local area of a conductive film using a simple exposure process without directly etching the conductive film including a conductive nanomaterial, a conductive coating film using the photosensitive coating composition, and a method of fabricating the conductive coating film.

The present invention is also directed to a photosensitive coating composition in which a conductive nanomaterial corresponding to a conductive filler of a conductive film are distributed in similar densities in areas having different electrical conductivities and uniformly distributed throughout the conductive film, a conductive coating film using the photosensitive coating composition, and a method of fabricating the conductive coating film.

The present invention is also directed to a photosensitive coating composition which is not chemically and physically etched to form a pattern in a specific area of a conductive film, not chemically oxidized or sulfurized, and not physically damaged, a conductive coating film using the photosensitive coating composition, and a method of fabricating the conductive coating film.

The present invention is also directed to a photosensitive coating composition capable of ensuring insulation stability in an insulating region of a conductive film, a conductive coating film using the photosensitive coating composition, and a method of fabricating the conductive coating film.

The present invention is also directed to a photosensitive coating composition capable of improving optical characteristics, visibility, environmental stability, and insulating characteristics of a conductive film formed by an exposure and washing process, a conductive coating film using the photosensitive coating composition, and a method of fabricating the conductive coating film.

The present invention is also directed to a photosensitive coating composition capable of improving insulation stability and pattern accuracy of an insulating region of a conductive film formed by an exposure and washing process, a conductive coating film using the photosensitive coating composition, and a method of fabricating the conductive coating film.

Technical Solution

According to an aspect of the present invention, there is provided a photosensitive coating composition for fabricating a conductive coating film, including a conductive nanomaterial, a photosensitive material, and a solvent.

In an embodiment of the present invention, the photosensitive coating composition may include the conductive nanomaterial in an amount of 0.01 to 5 wt % and the photosensitive material in an amount of 0.01 to 3 wt %.

In another embodiment of the present invention, the photosensitive coating composition may further include a binder in an amount of 1 wt % or less.

In still another embodiment of the present invention, the photosensitive coating composition may further include nanoparticles in an amount of 0.01 to 0.5 wt %, and the nanoparticles may include oxide nanowires, oxide nanoparticles, metal nanoparticles, or carbon nanoparticles.

In still another embodiment of the present invention, the photosensitive coating composition may further include an interconnecting agent in an amount of 0.01 to 3 wt %, and the interconnecting agent may include an acid, a photo acid-generator, a thermal acid-generator, or a dichromate.

In still another embodiment of the present invention, the interconnecting agent of the photosensitive coating composition may be one of the photo acid-generator in an amount of 0.01 to 3 wt %, the thermal acid-generator in an amount of 0.01 to 3 wt, the dichromate in an amount of 0.01 to 1 wt %, and the acid configured to control pH of the photosensitive coating composition to be in the range of 3 to 6.

In still another embodiment of the present invention, the photosensitive coating composition may further include a volume shrinkage inhibitor in an amount of 0.001 to 30 wt %, and the volume shrinkage inhibitor may be one selected from the group consisting of ethylene glycol, diethylene glycol, triethylene glycol, polyethylene glycol, polyethylene glycol derivatives, polyethylene oxide, polyvinyl alcohol, poly(hydroxyethyl methacrylate), poly(hydroxymethyl methacrylate), and a water-soluble or alcohol-soluble hydrogel.

In still another embodiment of the present invention, the solvent of the photosensitive coating composition may include water or alcohol.

In still another embodiment of the present invention, the conductive nanomaterial of the photosensitive coating composition may include metal nanowires or nanocarbon.

According to another aspect of the present invention, there is provided a conductive coating film formed on a substrate, including a conductive nanomaterial and a photosensitive material, and having an exposed region and a non-exposed region formed by an exposure and washing process. An electrical conductivity of the non-exposed region is twice that of the exposed region or more.

According to still another aspect of the present invention, there is provided a conductive coating film formed on a substrate by coating the substrate with a photosensitive coating solution including a conductive nanomaterial in an amount of 0.01 to 5 wt % and a photosensitive material in an amount of 0.01 to 3 wt %. The conductive coating film includes an exposed region and a non-exposed region formed by an exposure and washing process. An electrical conductivity of the exposed region is different from that of the non-exposed region.

In an embodiment of the present invention, the photosensitive coating solution of the conductive coating film may further include a binder in an amount of 1 wt % or less.

In another embodiment of the present invention, the photosensitive coating solution of the conductive coating film may further include nanoparticles in an amount of 0.01 to 0.5 wt %.

In still another embodiment of the present invention, the photosensitive coating solution of the conductive coating film may further include an interconnecting agent in an amount of 0.01 to 3 wt %.

In still another embodiment of the present invention, the photosensitive coating solution of the conductive coating film may further include a volume shrinkage inhibitor in an amount of 0.001 to 30 wt %.

In still another embodiment of the present invention, the conductive coating film may further include a topcoating layer obtained by coating the conductive coating film with a polymer or an inorganic material.

According to still another aspect of the present invention, there is provided a method of fabricating a conductive coating film including forming a photosensitive thin film including a conductive nanomaterial and a photosensitive material on a substrate, exposing a portion of the photosensitive thin film, and forming a conductive coating film including an interconnection pattern by washing the exposed photosensitive thin film with a solvent and thereby generating a difference in electrical conductivity between an exposed region and a non-exposed region.

In the method of fabricating a conductive coating layer according to the embodiment of the present invention, in the process of forming the conductive coating film, the difference in electrical conductivity between the exposed region and the non-exposed region may be generated by a difference in solubility between the exposed region and the non-exposed region in the solvent, and one of the exposed region and the non-exposed region, which has a higher solubility during the washing process, may form the interconnection pattern.

In the method of fabricating a conductive coating layer according to the embodiment of the present invention, the forming of the photosensitive thin film may include one of forming the photosensitive thin film as a single layer including the conductive nanomaterial and the photosensitive material and forming the photosensitive thin film by forming a conductive nanomaterial layer on the substrate and then forming a photosensitive material layer on the conductive nanomaterial layer.

The method of fabricating a conductive coating layer according to the embodiment of the present invention may further include forming a topcoating layer with a polymer or an inorganic material on the conductive coating film.

Advantageous Effects

According to the embodiment of the present invention, an interconnection pattern including an exposed region and a non-exposed region having different electrical conductivities may be formed by forming a photosensitive thin film including a conductive nanomaterial and a photosensitive material on a substrate, exposing the photosensitive thin film according to an interconnection pattern to be formed, and washing the exposed photosensitive thin film.

That is, a photosensitive coating composition for forming the photosensitive thin film includes the conductive nanomaterial, the photosensitive material, a binder, and other compositions. When the photosensitive thin film is exposed to UV light, physical or chemical bonds between the photosensitive materials or between the photosensitive material and other compositions may be formed or broken, and thus a difference of solubility in a specific solvent may be generated. When in contact with a solvent, a region where more of the photosensitive material and other compositions are removed may have a higher electrical conductivity, and a region where less of the photosensitive material and other compositions are removed may have a lower electrical conductivity. For example, when the photosensitive thin film is exposed and washed with the solvent, the photosensitive material and other compositions are more removed in the non-exposed region than in the exposed region, and electrical conductivities of the exposed region and the non-exposed region may become sufficiently different from each other for a pattern for flowing currents to be formed.

Thus, according to the present invention, an interconnection pattern capable of flowing currents in a specific pattern can be formed by generating a difference in electrical conductivity in a local area of a conductive coating film using a simple exposure process without directly etching a conductive coating film including a conductive nanomaterial.

According to the present invention, although a local area of a conductive coating film has a different electrical conductivity by forming an interconnection pattern using an exposure and washing process, a conductive nanomaterial corresponding to a conductive filler of the conductive coating film are distributed to have similar structures and densities in both areas having different electrical conductivities and have similar distribution structures and distribution densities.

In addition, according to the present invention, a conductive coating film including a conductive nanomaterial which is not chemically and physically etched to form a pattern in a specific area of the conductive coating film, not chemically oxidized or sulfurized, and not physically damaged, may be provided. Accordingly, electrical characteristics of the conductive nanomaterial can be controlled without directly etching the conductive coating film, a pattern visibility problem due to a difference in distribution of the conductive nanomaterial can be solved, and a process of forming the conductive coating film and an interconnection pattern thereof may be simplified.

Further, since an exposed region of the conductive coating film according to the present invention includes nanoparticles, it provides structural stability compared to an exposed region that does not include nanoparticles. Thus, the conductive coating film may provide insulation stability, reliability against external impacts or environmental variations, and improved pattern accuracy, based on the structural stability in an insulating region.

Further, since the conductive coating film according to the embodiment of the present invention includes an acid, a photo acid-generator, a thermal acid-generator, or a dichromate interconnecting agent, the exposed region thereof may be structurally stable compared to the exposed region that does not include the interconnecting agent. Thus, the conductive coating film may provide insulation stability, reliability against external impacts or environmental variations, and improved pattern accuracy, based on the structural stability in the insulating region.

In addition, in the conductive substrate patterned by the exposure and washing process according to the present invention, hazes of the conductive coating film may be reduced, a pattern visibility problem may be improved, the difference in level of the insulating region may be reduced so that pressure generated by an external contact is not concentrated on the insulating region, and environmental stability of silver nanowires may be ensured. In addition, insulation stability can be additionally ensured by preventing volume changes in the insulating region due to environmental variations.

In particular, according to the present invention, the difference in level of the patterned region can be reduced by forming a topcoating layer on the conductive coating film. When the difference in level is reduced due to the topcoating layer, a problem in which the pattern is shown due to the level difference may be prevented, and a phenomenon in which insulating characteristics are degraded since pressure caused by an external impact is concentrated on a portion having the level difference and generates changes in volume of the insulating region may be suppressed. In addition, since the topcoating layer is coated on the entire conductive coating film, impurities and residues generated during the pattern forming process are covered by the topcoating layer, and hazes caused by surface scattering of the conductive coating film can be reduced.

In addition, the photosensitive coating composition according to the present invention may further include a volume-shrinkage inhibitor. The volume-shrinkage inhibitor is a material which is dissolved in a solvent, such as water or alcohol, to form a photosensitive coating composition and absorbs moisture in a normal atmospheric humidity environment or increases a volume according to temperature variations. When the volume-shrinkage inhibitor is added as a photosensitive coating composition, coats a substrate, and is dried at a high temperature, it shrinks since moisture is desorbed during the drying process at the high temperature, and expends when washed with water or alcohol after a UV exposure process and exposed to a normal atmospheric environment. Here, the volume-shrinkage inhibitor included in the exposed region may widen distances between the metal nanowires and improve insulating characteristics. The volume-shrinkage inhibitor existing in the non-exposed region may be partially or fully removed during the washing process. Thus, conductive characteristics of the non-exposed region may be maintained.

MODES FOR CARRYING OUT THE INVENTION

Figure 1:
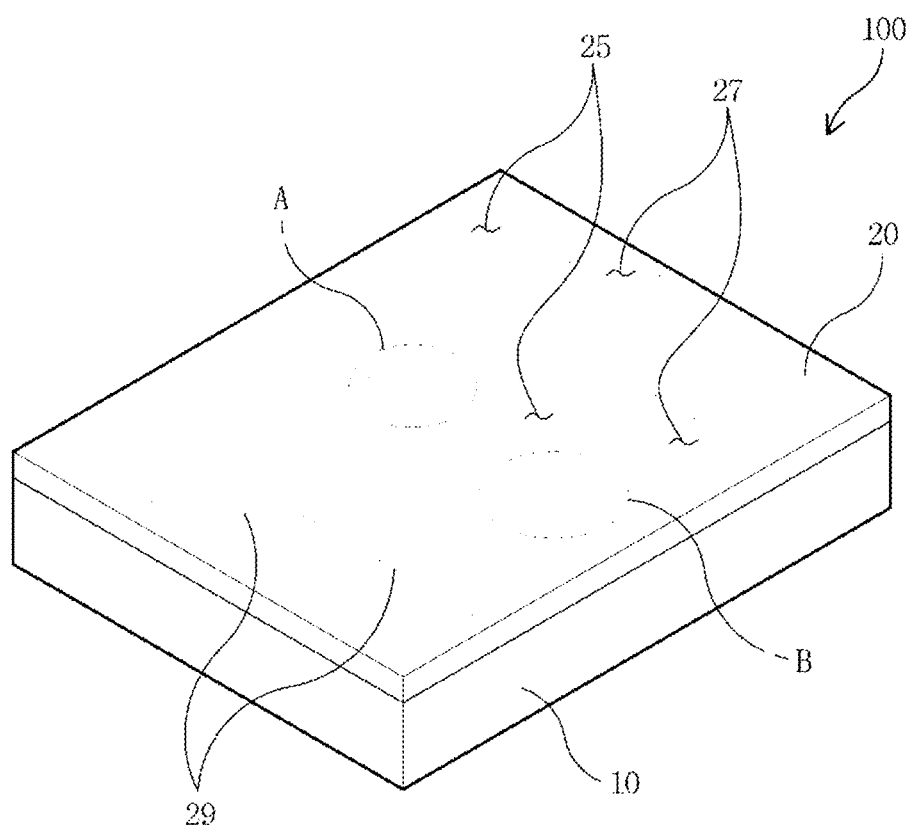
FIG. 1 is a perspective view illustrating a conductive coating film including a conductive nanomaterial according to a first embodiment of the present invention.

The objects, features, and advantages of the present invention will be more clearly understood from the following detailed descriptions of embodiments taken in conjunction with the accompanying drawings. In the following description, detailed descriptions of related known functions or elements that may unnecessarily make the gist of the present invention obscure will be omitted.

The terms and words used in the specification and claims should not be construed with common or dictionary meanings, but construed as meanings and conception coinciding the spirit of the invention based on a principle that the inventors can appropriately define the concept of the terms to explain the invention in the optimum method. Therefore, embodiments described in the specification and the configurations shown in the drawings are not more than the most preferred embodiments of the present invention and do not fully cover the spirit of the present invention. Accordingly, it should be understood that there may be various equivalents and modifications that can replace those when this application is filed.

Hereinafter, various embodiments will now be described more fully with reference to the accompanying drawings.

[First Embodiment]

Figure 2:
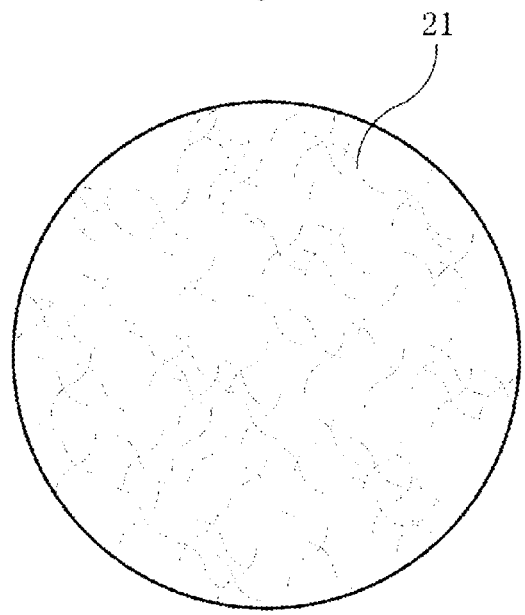
FIG. 2 is an enlarged view of the part A in FIG. 1.

FIG. 1 is a perspective view illustrating a conductive substrate including a conductive nanomaterial according to a first embodiment of the present invention. FIG. 2 is an enlarged view of an area A in FIG. 1.

Referring to FIGS. 1 and 2, a conductive substrate 100 according to the first embodiment of the present invention includes a substrate 10 and a conductive coating film 20 formed on the substrate 10, including a conductive nanomaterial 21 and a photosensitive material, and having an interconnection pattern 29 formed by an exposure and washing process.

Here, the substrate 10 may be fabricated by a transparent material having a light-transmitting property. For example, the substrate 10 may include one of glass, quartz, a transparent plastic substrate, and a transparent polymer film. The transparent polymer film may include polyethylene terephthalate (PET), polystyrene (PC), polyethylene naphthalate (PEN), polyethersulfone (PES), polymethylmethacrylate (PMMA), polyimide (PI), polyetheretherketone (PEEK), or the like, but is not limited thereto. The substrate 10 formed of the transparent polymer film may have a thickness of 10 to 100,000 μm. Alternatively, the substrate 10 may be a non-transparent substrate, such as a silicon wafer, a ceramic substrate, or a non-transparent plastic substrate.

In addition, the conductive coating film 20 may include the conductive nanomaterial 21 and the photosensitive material, and may further include other compositions, such as a dispersant, a binder, and an additive.

The conductive nanomaterial 21 may include metal nanowires or nanocarbon. Here, the metal nanowires may have a nanoribbon or nanotube shape as well as a nanowire shape. For example, the metal nanowires may include silver nanowires or gold nanowires, but is not limited thereto. The metal nanowires may have diameters of 300 nm or less and lengths of 1 μm or more.

The nanocarbon may include carbon nanotubes, graphene, carbon nanoplates, carbon black, but is not limited thereto.

In addition, the photosensitive material may be a material forming cross-links under ultraviolet (UV) exposure, and may form a region having a relatively low electrical conductivity since it has a low solubility in a solvent during a washing process after the exposure process. The photosensitive material is preferably a material exposed to radiation from one or more energy sources, such as light (infrared light, visible light, or ultraviolet light), heat, laser, or the like. However, the energy source is not limited thereto.

For example, the photosensitive material may include a water-soluble material having a photosensitivity with respect to UV light. The water-soluble material may be a polyvinyl alcohol material having a photosensitive functional group, such as sbq-PVA short for "poly(vinyl alcohol), N-methyl-4(4'-formylstyryl)pyridinium methosulfate acetal." Alternatively, a material forming chemical bonds under exposure may be used as a water-soluble photosensitive material or a water-insoluble photosensitive material. The photosensitive material may include a photosensitive resin or a non-photosensitive resin having a hydroxyl group or a carboxyl group. That is, the non-photosensitive resin and a photo-initiator may be included instead of the photosensitive resin to form a UV photosensitive material. Here, the conductive coating film 20 may include the photosensitive resin or non-photosensitive resin in an amount of 0.1 to 5 wt %.

The photosensitive material may have a different concentration depending on target resistances of an exposed region 25 and a non-exposed region 27. For example, when forming a pattern of a transparent electrode, the concentration of the photosensitive material is preferably 0.1 to 1 wt %. However, when the photosensitive material is added too much, the transparent electrode may be damaged or a resistance thereof may be increased since the conductive nanomaterial 21 is removed together with the photosensitive material from the non-exposed region 27 during the washing process after the exposure process.

The conductive coating film 20 includes the conductive nanomaterial 21 uniformly formed on the substrate 10. The conductive coating film 20 includes the exposed region 25 and the non-exposed region 27, and the non-exposed region 27 may configure the interconnection pattern 29. The electrical conductivity of the exposed region 25 may be twice that of the non-exposed region 27 or more.

In addition, the conductive coating film 20 may be formed as a single layer including the conductive nanomaterial 21 and the photosensitive material, or may have a structure in which a photosensitive material layer is formed on a conductive nanomaterial layer.

A difference in electrical conductivity between the exposed region 25 and the non-exposed region 27 in the conductive coating film 20 according to the first embodiment of the present invention may occur for the following reason. Before the conductive coating film 20 is formed, that is, before the exposure and washing process, a photosensitive thin film including the conductive nanomaterial 21 and the photosensitive material has a significantly low electrical conductivity due to the photosensitive material and other compositions.

However, when the photosensitive thin film is exposed, physical or chemical bonds between the photosensitive materials or between the photosensitive material and the other compositions may be formed or broken, and thus a difference of solubility in a specific solvent may be generated. On the other hand, there is little change in chemical and physical characteristics of the conductive nanomaterial 21 during the exposure process. Here, the specific solvent may be a solvent having a high solubility selectively in the photosensitive material. For example, when a water-soluble photosensitive material is used as the photosensitive material, a difference of solubility in water may be generated.

That is, the photosensitive material has a high solubility in a specific solvent when it is not exposed, however, has a low solubility in the solvent when it is exposed and cured. According to the embodiment of the present invention, the interconnection pattern 29 may be formed using a different solubility of the photosensitive material in the specific solvent.

Accordingly, the exposed region 25 and the non-exposed region 27 of the photosensitive thin film have different solubilities in the specific solvent. In particular, when the photosensitive thin film includes a large amount of other compositions, the difference in electrical conductivity between the two regions becomes sufficiently large for patterns of a transparent electrode and a circuit electrode to be formed. Normally, when in contact with the solvent, a region where more of the photosensitive material and other compositions are removed may have a higher electrical conductivity, and a region where less of the photosensitive material and other compositions are removed may have a lower electrical conductivity.

For example, when the non-exposed region 27 has a higher solubility in the solvent than the exposed region 25, the non-exposed region 27 may be formed as the interconnection pattern 29.

Meanwhile, an example in which the non-exposed region 27 has a higher solubility than the exposed region 25 is disclosed in the embodiment of the present invention. However, the opposite characteristics may occur depending on types of the photosensitive material. That is, when the exposed region 25 has a higher solubility than the non-exposed region 27, the exposed region 25 may be formed as the interconnection pattern 29.

Widths of the exposed region 25 and the non-exposed region 27 forming the conductive coating film 20 may be 1 μm or more, and a shape of the interconnection pattern 29 may be determined under exposure. Normally, the shape of the interconnection pattern 29 may be determined according to a shape of a mask used in the exposure.

Figure 3:
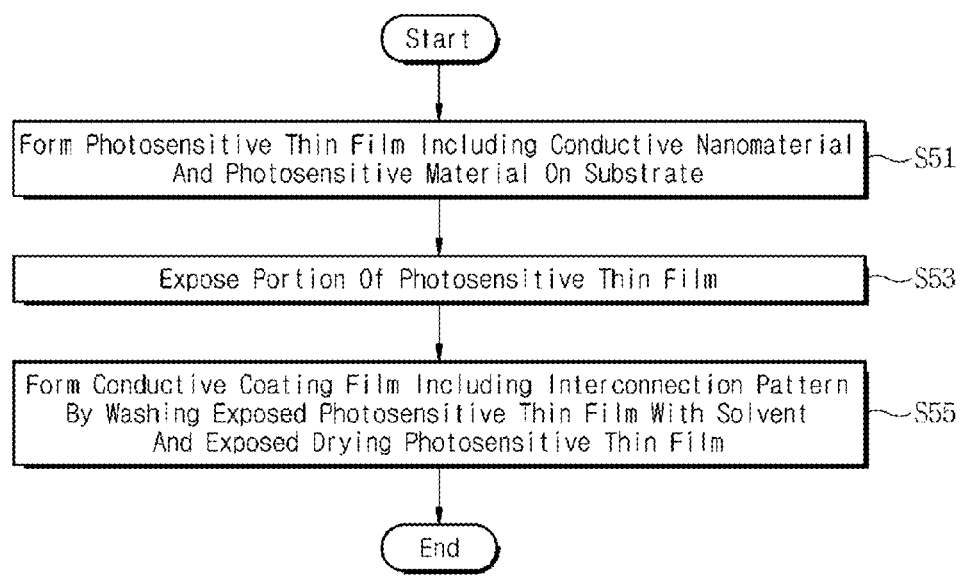
FIG. 3 is a flowchart illustrating a method of fabricating the conductive coating film of FIG. 1 according to the first embodiment of the present invention.

A method of fabricating the conductive substrate 100 according to the first embodiment of the present invention will be described with reference to FIGS. 1 to 7. Here, FIG. 3 is a flowchart illustrating the method of fabricating the conductive substrate 100 of FIG. 1. In addition, FIGS. 4 to 7 are views illustrating process steps according to the method described in FIG. 3.

Figure 4:
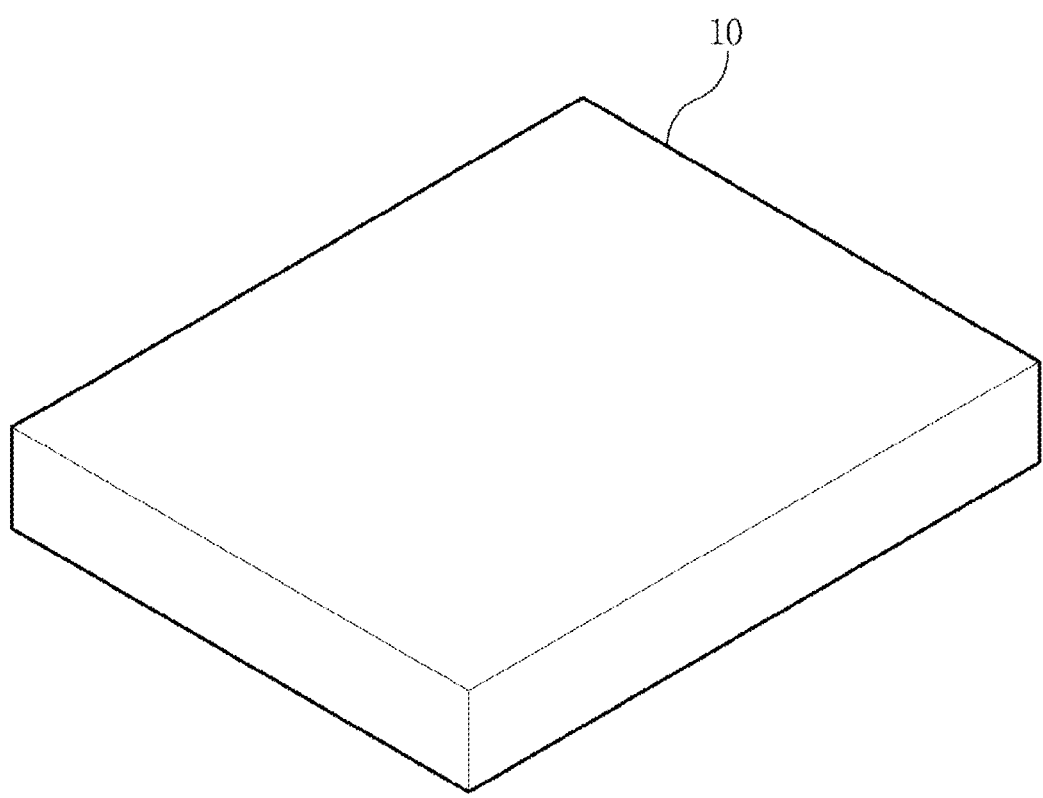
FIGS. 4 to 7 are views illustrating process steps according to the fabricating method of FIG. 3.

First, as illustrated in FIG. 4, a substrate 10 for forming a conductive coating film 20 is prepared.

Figure 5:
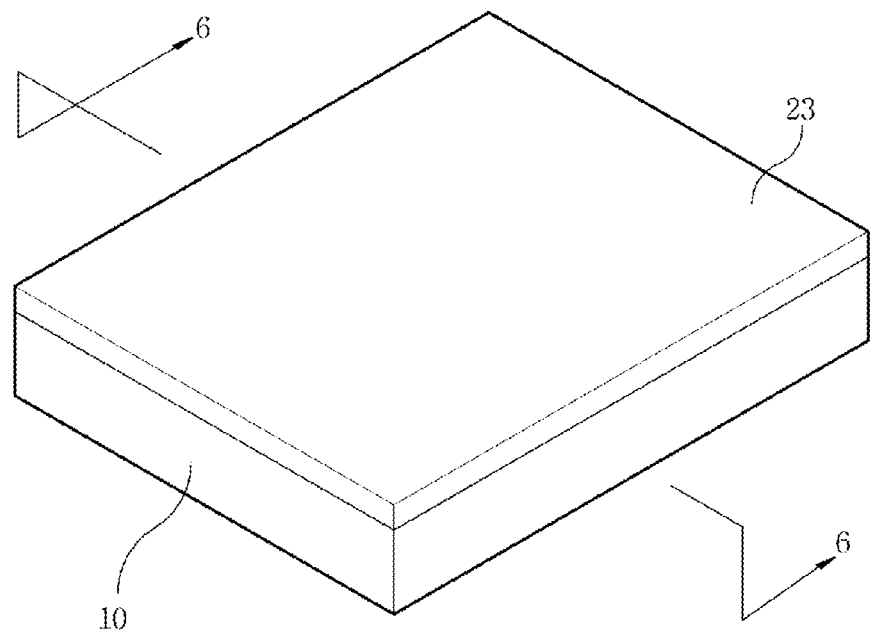

Next, as illustrated in FIG. 5, a photosensitive thin film 23 including a conductive nanomaterial and a photosensitive material is formed on the substrate 10 in a process step S51.

Here, the photosensitive thin film 23 may be formed as a single layer including the conductive nanomaterial and the photosensitive material, or may have a structure in which a photosensitive material layer is formed on a conductive nanomaterial layer. When the photosensitive thin film 23 is the single layer as described in the former, the photosensitive thin film 23 may further include other compositions, such as the dispersant, the binder, and the additive. When the photosensitive thin film 23 has the structure described in the latter, the other compositions, such as the dispersant, the binder, and the additive, may be included in the conductive nanomaterial layer.

Figure 6:
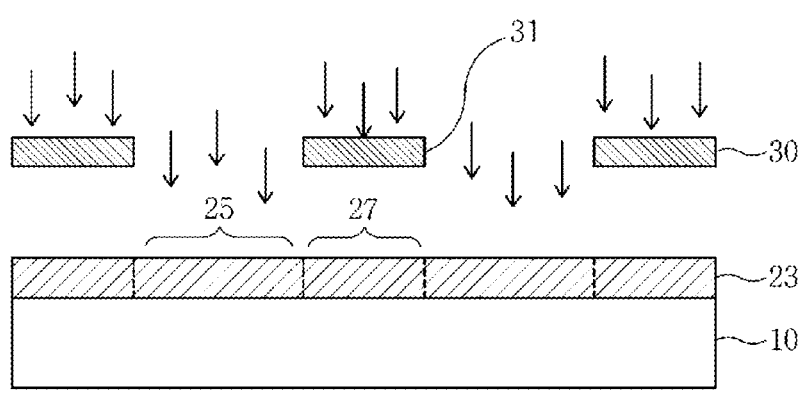

Next, as illustrated in FIG. 6, a portion of the photosensitive thin film 23 is exposed in a process step S53. That is, the photosensitive thin film 23 is exposed using a mask 30 in which a pattern hole 31 corresponding to a region to be exposed is formed.

Figure 7:
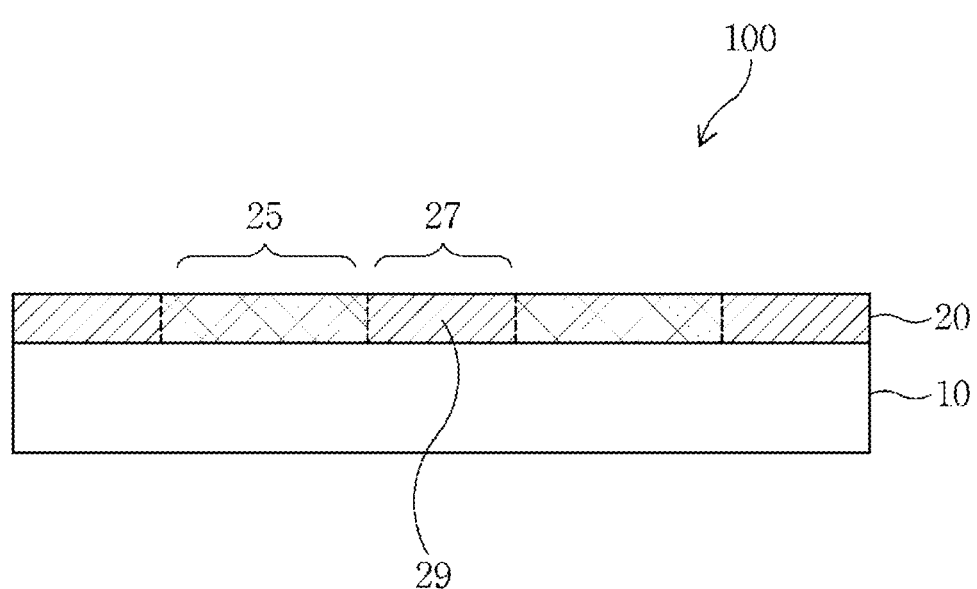

Next, as illustrated in FIG. 7, the exposed photosensitive thin film 23 is washed with a solvent and dried in a process step S55, to form the conductive coating film 20 including an interconnection pattern 29. That is, since a non-exposed region 27 has a relatively higher solubility in the solvent than an exposed region 25, more of the photosensitive material and other compositions are removed in the non-exposed region 27.

In the conductive substrate 100 fabricated by the method according to the embodiment of the present invention, the conductive coating film 20 may not be directly etched. Further, the conductive coating film 20 having the interconnection pattern 29 capable of flowing currents by controlling an electrical conductivity of a specific region may be formed without damage or a chemical change of the conductive nanomaterial, a conductive filler of the conductive coating film 20.

The photosensitive thin film 23 according to the first embodiment of the present invention may include the conductive nanomaterial, the photosensitive material, and the other compositions, such as the binder, the dispersant, or the additive. A surface resistance of the photosensitive thin film 23 is 10,000 Ω/sq or more, and a resistance of a region exposed in the UV exposure process may be 10,000 Ω/sq or more. When the exposed photosensitive thin film 23 is washed in a solvent of the photosensitive material and a solvent of other compositions, the difference in solubility of the photosensitive material and other compositions between the non-exposed region 27 and the exposed region 25 may generate a difference in electrical conductivity between the non-exposed region 27 and the exposed region 25. One of the exposed region 25 and the non-exposed region 27, which has a higher solubility of the other compositions, may have a high electrical conductivity and a low sheet resistance of 2,000 Ω/sq or less.

Thus, by forming the photosensitive thin film 23 including the conductive nanomaterial and the photosensitive material on the substrate 10, exposing the photosensitive thin film 23 according to the shape of the interconnection pattern 29 to be formed, and washing the exposed photosensitive thin film 23, the interconnection pattern 29 may be formed using different electrical conductivities between the exposed region 25 and the non-exposed region 27 in the conductive substrate 100 according to the first embodiment of the present invention.

That is, the photosensitive thin film 23 may include other compositions, such as the dispersant, the binder, and the additive, in addition to the conductive nanomaterial. When the photosensitive thin film 23 is exposed to light, physical or chemical bonds between the photosensitive material and the other compositions may be formed or broken, and thus a difference of solubility in a specific solvent such as water may be generated. When in contact with the solvent, a region where more of the photosensitive material and other compositions are removed may have a higher electrical conductivity, and a region where less of the photosensitive material and other compositions are removed may have a lower electrical conductivity. For example, when the photosensitive thin film is exposed and washed with the solvent, more of the photosensitive material and other compositions may be removed in the non-exposed region 27 than in the exposed region 25. Accordingly, electrical conductivities of the exposed region 25 and the non-exposed region 27 may become sufficiently different from each other for a pattern for flowing currents to be formed.

According to the embodiment of the present invention, the conductive coating film 20 including the conductive nanomaterial may not be directly etched, and the interconnection pattern 29 capable of flowing currents in a specific pattern may be formed by generating a difference in electrical conductivity in a specific region of the conductive coating film 20 by a simple exposure method.

In addition, in the conductive substrate 100 according to the embodiment of the present invention, although the conductive coating film 20 having a different electrical conductivity in a local area is formed by forming the interconnection pattern 29 using the exposure and washing process, the conductive nanomaterial corresponding to the conductive filler of the conductive coating film 20 may be uniformly distributed throughout the conductive coating film 20 with no difference in distribution density even in regions having different electrical conductivities.

Further, according to the embodiment of the present invention, the conductive substrate 100 including the conductive nanomaterial, which is not chemically and physically etched, not chemically oxidized or sulfurized, and not physically damaged in a specific region of the conductive coating film 20, may be provided.

Characteristics of the conductive coating film 20 of the conductive substrate 100 according to the embodiment of the present invention will be described as following specific experimental examples.

EXPERIMENTAL EXAMPLE 1-1

A conductive substrate according to the experimental example 1-1 of the present invention includes a PET film as a substrate and nanowires as a conductive nanomaterial.

That is, in the experimental example 1-1, a pattern including a region having a high conductivity and a region having a low conductivity is formed using aqueous silver nanowire dispersions and a water-soluble photosensitive material. In the aqueous silver nanowire dispersions, silver nanowires have diameters of 25 to 40 nm and lengths of 10 to 50 μm, and a water-soluble dispersant, a binder, and a nanoparticle additive for improving coatability are further included. As a water-soluble photosensitive material, "poly(vinyl alcohol), N-methyl-4(4'-formylstyryl)pyridinium methosulfate acetal" may be used. The PET film is coated with the aqueous silver nanowire dispersions using a bar coating method. The coated substrate is dried at a temperature of 120° C. for 5 minutes.

A sheet resistance of the dried photosensitive thin film is 10 MΩ/sq or more, which is a value exceeding a measurement limit of an instrument. The dried photosensitive thin film is locally irradiated with UV light using the mask, and washed and dried.

Electrical resistances of the UV exposed region and the UV non-exposed region are measured, and a surface of the conductive coating film is observed in an interface between the UV exposed region and the UV non-exposed region using scanning electron microscopy (SEM) and optical microscopy (OM).

As a result of the measurement of electrical resistances, the UV exposed region has an electrical resistance of 10 MΩ/sq or more, that is, has a significantly low electrical conductivity exceeding a measurement limit of an instrument, and the UV non-exposed region has an electrical resistance of less than 0.2 kΩ/sq, that is, has a high electrical conductivity.

Figure 8:
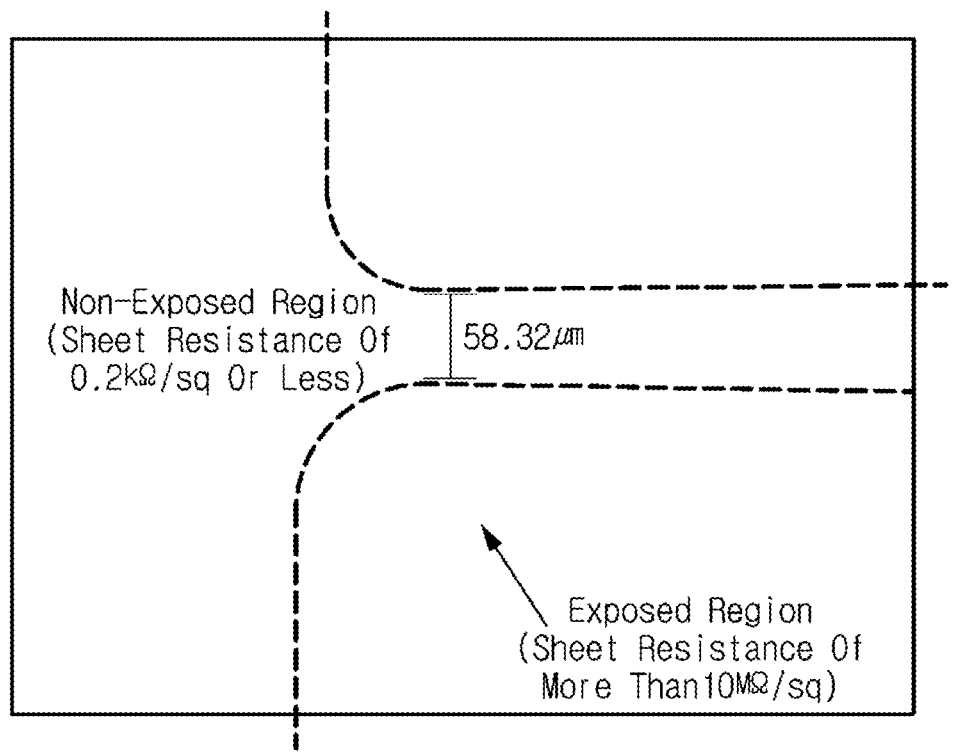
FIGS. 8 and 9 are photographs showing a conductive substrate fabricated according to the experimental example 1-1 of the present invention.
Figure 9:
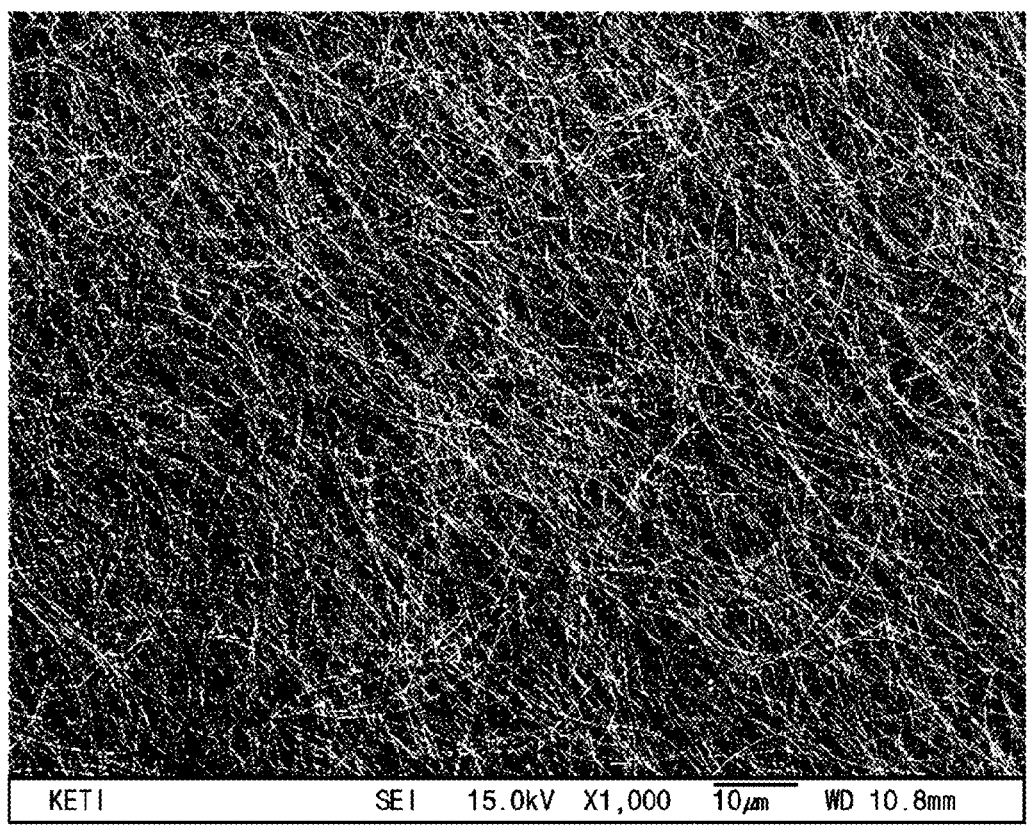

An OM photograph of FIG. 8 and a SEM photograph of FIG. 9 illustrate the UV exposed region and the UV non-exposed region. Interfaces between the UV exposed region and the UV non-exposed region are faintly shown in the OM photograph. However, the interfaces between the UV exposed region and the UV non-exposed region are not shown in the SEM photograph, and nanowires exist continuously regardless of the regions and the difference in shapes of the conductive coating film is not significant between the two regions.

EXPERIMENTAL EXAMPLE 1-2

As the experimental example 1-2, a pattern consisting of a high conductive region and a low conductive region is formed using carbon nanotubes/aqueous silver nanowire dispersions and a water-soluble photosensitive material. The carbon nanotubes/aqueous silver nanowire dispersions include single-wall carbon nanotubes having diameters of 25 to 40 nm and nanowires having lengths of 10 to 50 μm. Further, the carbon nanotubes/aqueous silver nanowire dispersions include a water-soluble dispersant, a binder, and a nanoparticle additive for improving coatability. "poly(vinyl alcohol),N-methyl-4(4'-formylstyryl)pyridinium methosulfate acetal" may be included as a water-soluble photosensitive material. A PET film is coated with the carbon nanotubes/aqueous silver nanowire dispersions using a bar coating method. The coated substrate is dried at a temperature of 120° C. for 5 minutes.

The sheet resistance of the coated photosensitive thin film is 1 MΩ/sq or more. The photosensitive thin film is locally irradiated with UV light using a mask, and washed and dried.

Electrical resistances of the UV exposed region and the UV non-exposed region are measured, and a surface of the conductive coating film is observed in an interface between the UV exposed region and the UV non-exposed region by SEM and OM.

As a result of the measurement of electrical resistances, the UV exposed region has an electrical resistance of 1 MΩ/sq or more, that is, has a significantly low electrical conductivity, and the UV non-exposed region has an electrical resistance of less than 0.3 kΩ/sq, that is, has a high electrical conductivity.

Figure 10:
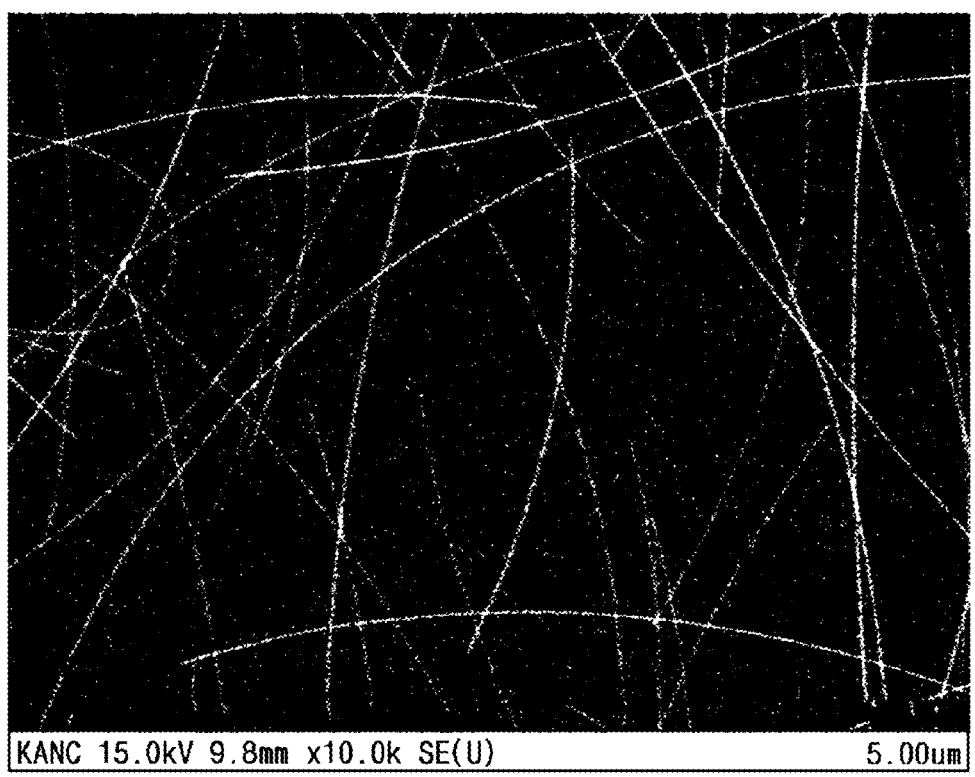
FIGS. 10 and 11 are photographs showing a conductive substrate fabricated according to the experimental example 1-2 of the present invention.
Figure 11:
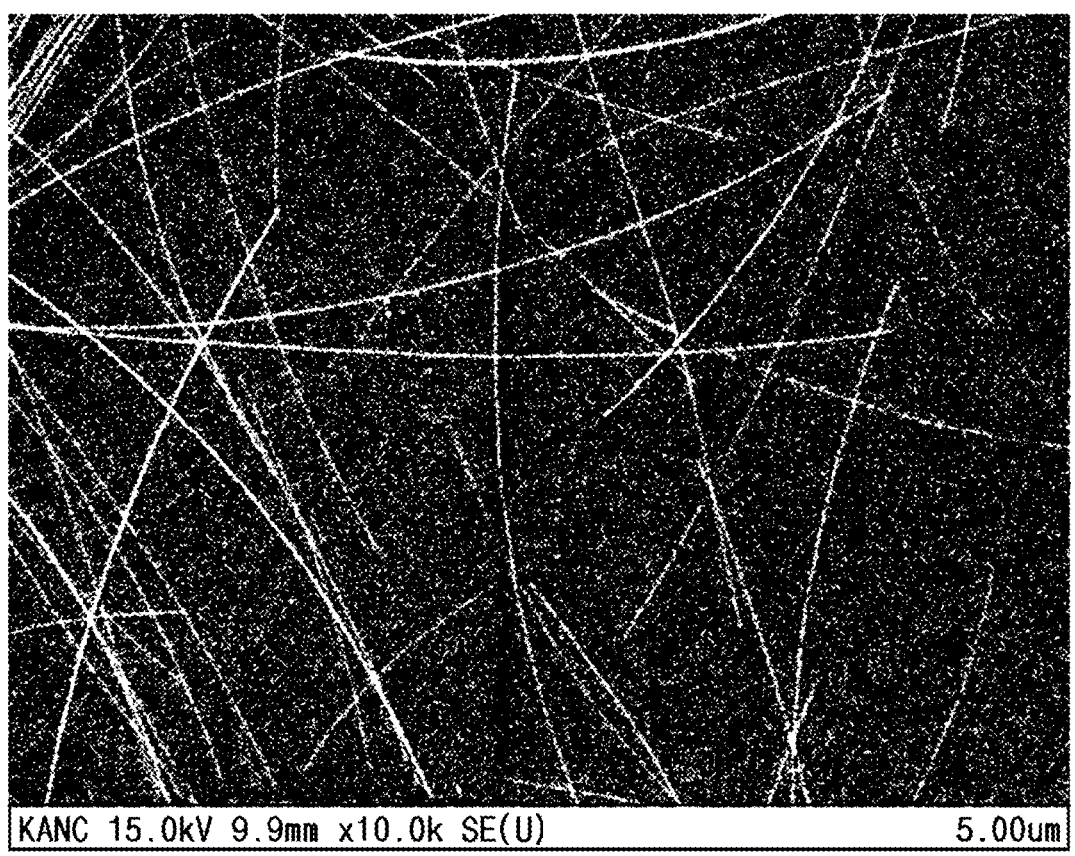

SEM photographs of FIGS. 10 and 11 illustrate the UV exposed region (FIG. 10) and the UV non-exposed region (FIG. 11). Carbon nanotubes/silver nanowires exist continuously in both of the UV exposed region and the UV non-exposed region, and the difference in shapes of the conductive coating film is not significant between the two regions.

EXPERIMENTAL EXAMPLE 1-3

As the experimental example 1-3, a pattern consisting of a high conductive region and a low conductive region is formed using aqueous carbon nanotube dispersions and a water-soluble photosensitive material. The aqueous carbon nanotube dispersions include single-wall carbon nanotubes, and a water-soluble dispersant, a binder, and a nanoparticle additive for improving coatability. As the water-soluble photosensitive material, "poly(vinyl alcohol),N-methyl-4 (4'-formylstyryl)pyridinium methosulfate acetal" may be included. A PET film is coated with the aqueous carbon nanotube dispersions by a bar coating method, and the coated substrate are dried at a temperature of 120° C. for 5 minutes to form a photosensitive thin film.

The photosensitive thin film has a sheet resistance of about 100 kΩ/sq. The photosensitive thin film is locally irradiated with UV light using a mask, and washed and dried.

Electrical resistances of a UV exposed region and a UV non-exposed region are measured, and a surface of the conductive coating film is observed in an interface between the UV exposed region and the UV non-exposed region by SEM.

As a result of the measurement of electrical resistances, the UV exposed region has an electrical resistance of about 10 MΩ/sq, that is, a low electrical conductivity, and the UV non-exposed region has an electrical resistance of less than 1 kΩ/sq, that is, a high electrical conductivity.

Figure 12:
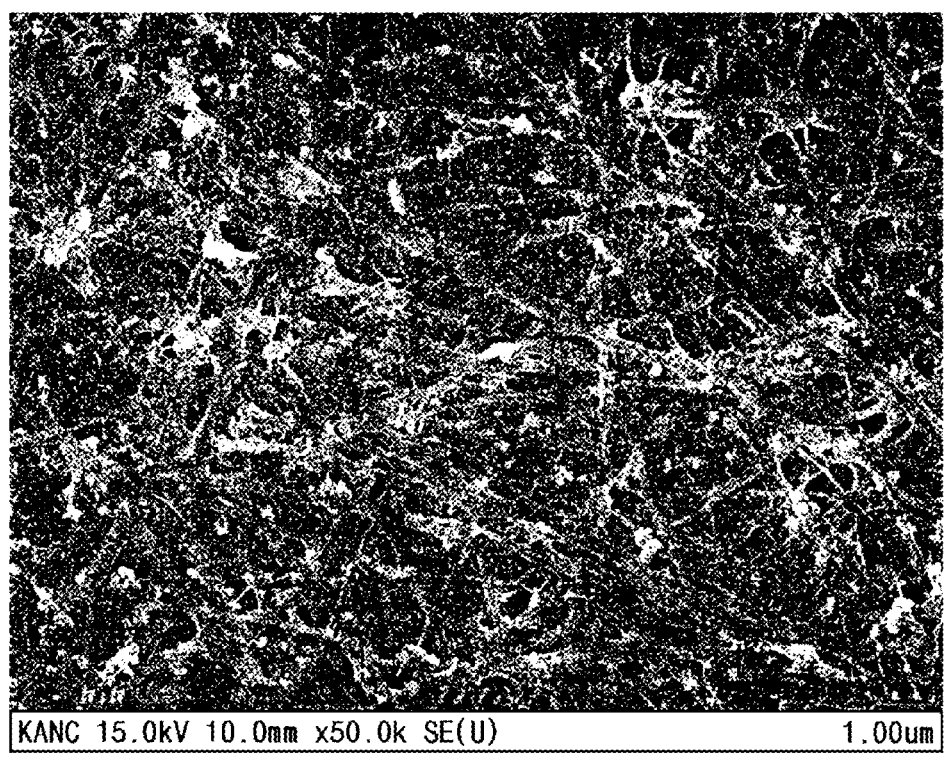
FIGS. 12 to 14 are photographs showing a conductive substrate fabricated according to the experimental example 1-3 of the present invention.
Figure 13:
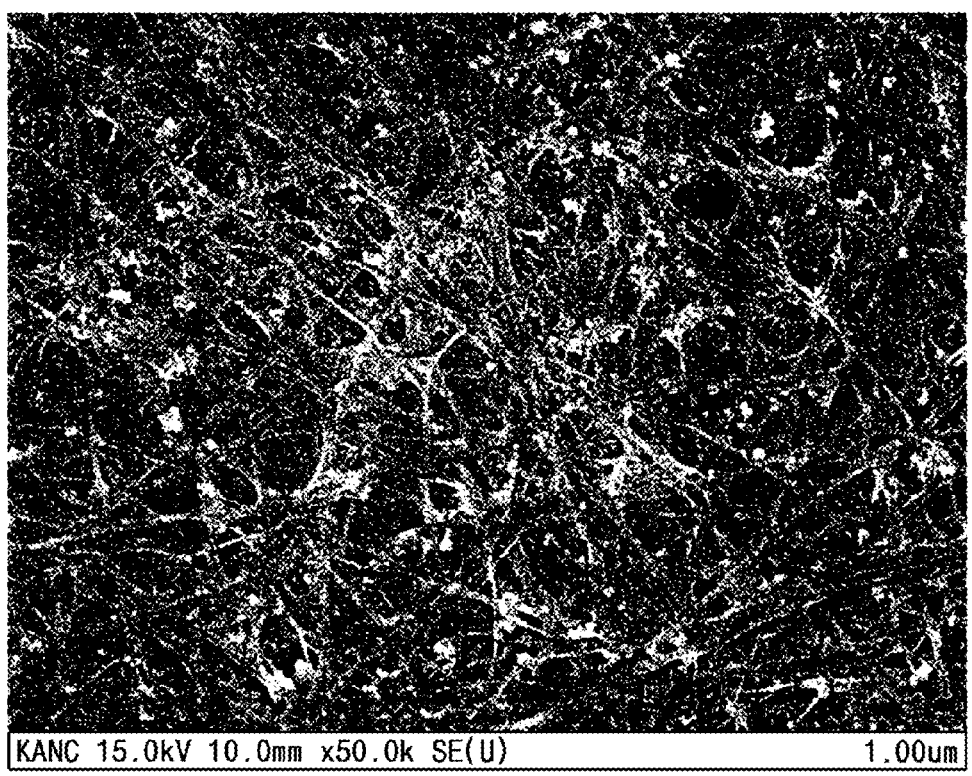
Figure 14:
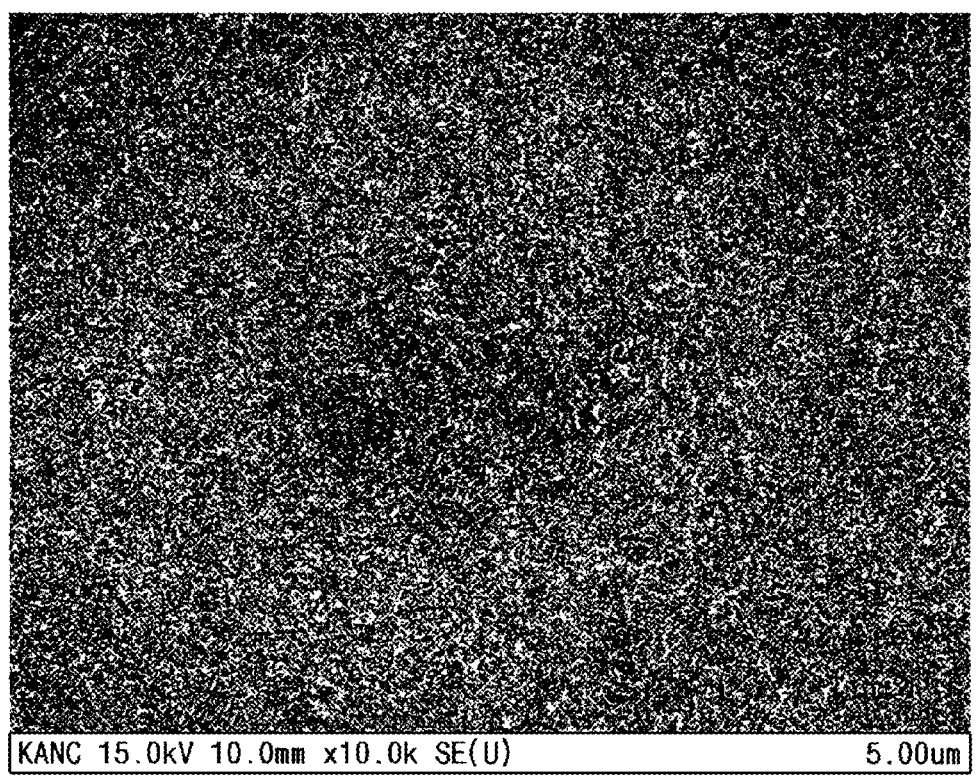
Figure 15:
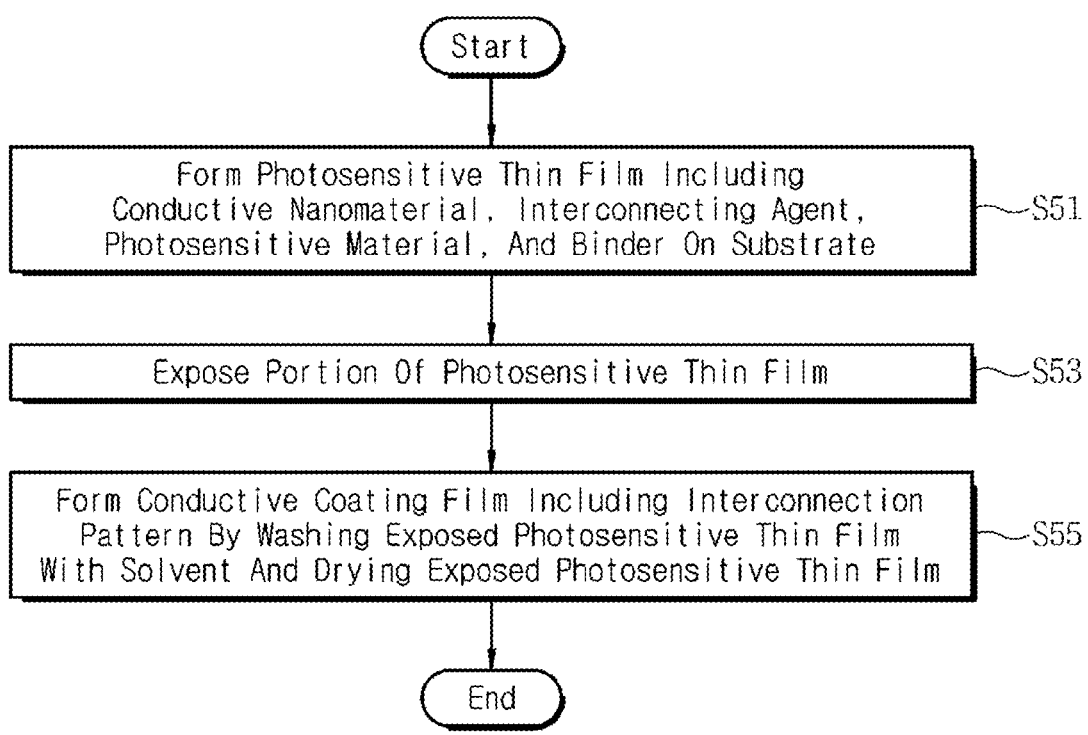
FIG. 15 is a flowchart according to the experimental example 2-2 of a method of fabricating a conductive coating film including a conductive nanomaterial according to the second embodiment of the present invention.

SEM photographs of FIGS. 12 to 14 illustrate the UV exposed region (FIG. 12), the UV non-exposed region (FIG. 13), and both of two regions (FIG. 14). Carbon nanotubes continuously exist in both regions, and the difference in distribution density thereof is not significant. In addition, in the photograph of FIG. 14 illustrating the two regions, boundaries between the two regions are vague and there is little distinction between the two regions.

EXPERIMENTAL EXAMPLE 1-4

In the experimental examples 1-1 to 1-3, a conductive coating film formed in a single layer including a conductive nanomaterial and a photosensitive material was disclosed. However, in the experimental example 1-4, a conductive coating film having a structure in which a photosensitive material layer is formed on the conductive nanomaterial layer will be disclosed.

That is, in the experimental example 1-4, a pattern consisting of a high conductive region and a low conductive region is formed using carbon nanotubes/aqueous silver nanowire dispersions and a water-soluble photosensitive material. The carbon nanotubes/aqueous silver nanowire dispersions include single-wall carbon nanotubes and silver nanowire having diameters of 25 to 40 nm and lengths of 10 to 50 μm, and further include a water-soluble dispersant, a binder, and a nanoparticle additive for improving coatability. A PET film may be coated with the carbon nanotubes/ aqueous silver nanowire dispersions using a bar coating method. The coated substrate is dried at a temperature of 120° C. for 5 minutes.

In addition, the carbon nanotubes/nanowire is over-coated with PVC as a water-soluble photosensitive material to form a photosensitive thin film.

A sheet resistance of the photosensitive thin film is about 100 kΩ/sq. The photosensitive thin film is locally irradiated with UV light using a mask, and washed and dried.

As a result of the measurement of electrical resistances, a UV exposed region has an electrical resistance of about 1 MΩ/sq, that is, a low electrical conductivity, and a UV non-exposed region has an electrical resistance of less than 2 kΩ/sq, that is, a high electrical conductivity.

According to the embodiment of the present invention, a conductive coating film including an interconnection pattern may be formed by exposing and washing the photosensitive thin film including the conductive nanomaterial and the photosensitive material. In particular, since the exposed photosensitive thin film is not directly etched when the conductive coating film is formed, the conductive nanomaterial may be uniformly distributed throughout the fabricated conductive coating film. In addition, since an etch-induced height difference between the UV exposed region and the UV non-exposed region in the conductive coating film is not significant, a phenomenon in which the interconnection pattern is shown may be prevented.

Meanwhile, since a conductive substrate according to a second embodiment to a sixth embodiment of the present invention is implemented to have a similar structure to the conductive substrate 100 according to the first embodiment illustrated in FIG. 1, the conductive substrate according to the second embodiment to the sixth embodiment of the present invention will be described with reference to FIG. 1 or 2. In addition, since a method of fabricating a conductive coating film according to the second embodiment to the sixth embodiment of the present invention is similar to that according to the first embodiment, the method of fabricating the conductive coating film according to the second embodiment to the sixth embodiment of the present invention will be described with reference to FIGS. 3 to 7.

[Second Embodiment]

A conductive substrate 100 according to the second embodiment of the present invention includes, as illustrated in FIGS. 1 and 2, a substrate 10 and a conductive coating film 20 formed on the substrate 10, including a conductive nanomaterial 21, a photosensitive material, a binder, and a solvent, and having an interconnection pattern 29 formed by an exposure and washing process.

Here, materials described in the first embodiment of the present invention may be used as the substrate 10 and the conductive nanomaterial.

In addition, the conductive nanomaterial 21, the photosensitive material, and the binder may be included as the photosensitive coating composition to form the conductive coating film 20, and other compositions, such as a dispersant and an additive may be further included. For example, the photosensitive coating composition may include the conductive nanomaterial in an amount of 0.01 to 5 wt %, the photosensitive material in an amount of 0.01 to 3 wt %, and the binder in an amount of 1 wt % or less, and the water may occupy the rest. In addition, the photosensitive coating composition may further include the additive in an amount of 5 wt % or less.

Here, as a concentration of the conductive nanomaterial included in the photosensitive coating solution increases, a resistance of the conductive coating film 20 may be decreased since the electrical conductivity thereof increases. However, when the concentration of the conductive nanomaterial is too high, that is, more than 5 wt %, it may be difficult to disperse the conductive nanomaterial in the solution. Accordingly, the conductive nanomaterial is preferably used in an amount of 0.1 to 0.5 wt %.

In addition, a material exposed to radiation from one or more energy sources, such as light (infrared light, visible light, or ultraviolet light), heat, laser, or the like, is preferably used as the photosensitive material. However, the energy source may not be limited thereto.

For example, the photosensitive material may include a water-soluble material having a photosensitivity with respect to infrared light. The water-soluble material may be a polyvinyl alcohol material having a photosensitive functional group, such as sbq-PVA short for "poly(vinyl alcohol), N-methyl-4(4'-formylstyryl)pyridinium methosulfate acetal," but is not limited thereto.

The photosensitive material may have a different concentration depending on target resistances of an exposed region 25 and a non-exposed region 27. For example, when forming a pattern of a transparent electrode, the concentration of the photosensitive material is preferably 0.1 to 1 wt %. However, when the photosensitive material is added too much, the transparent electrode may be damaged or a resistance thereof may be increased since the conductive nanomaterial 21 is removed together with the photosensitive material in the non-exposed region 27 during the washing process after the exposure process.

As the binder, water-dispersible polyurethanes or cationic polyelectrolytes may be used. For example, poly(diallyldimethylammonium chloride), poly(allylamine hydrochloride), poly(3,4-ethylenedioxythiophene) (PEDOT), poly(2-vinylpyridine), poly(ethyleneimine), poly(acrylamide-co-diallylmethylammonium chloride), cationic polythiophene, polyaniline, poly(vinyl alcohol), or a derivative thereof may be used as the cationic polyelectrolytes.

The reasons for using such a binder are that there is no precipitation of the compositions when water-dispersible polyurethanes or cationic polyelectrolytes are used as the binder since poly(vinyl alcohol) used as the photosensitive material generate positive charges in an aqueous solution, and it is easy to remove poly(vinyl alcohol) of the non-exposed region 27 in the washing process after the exposure process since electrical or chemical bonds are not generated between the photosensitive poly(vinyl alcohol) and the binder.

In addition, the binder may serve to fix the conductive nanomaterial 21 corresponding to a conductive filler not to fall off from the conductive coating film 20 during the washing process of the solvent for fabricating the conductive coating film 20. That is, if the binder is not included in the photosensitive coating solution, the conductive nanomaterial 21 may be removed together with the photosensitive material during the washing process of the solvent for fabricating the conductive coating film 20, the conductive coating film 20 may not be formed, or the uniformity in resistance of the conductive coating film may be significantly degraded.

Further, anionic polyelectrolytes may not be used as the binder because, if the anionic polyelectrolytes is used as the binder, precipitation occurs in the photosensitive coating solution, and the electrical conductivity of the non-exposed region 27 is lowered since the photosensitive material of the non-exposed region 27 is not removed during the washing process of the conductive coating film after the exposure process.

As described above, the binder may be added to the photosensitive coating solution in an amount of 1 wt % or less in order to prevent the conductive nanomaterial 21 from falling off from the substrate 10 during the washing process after the exposure process. Here, when the concentration of the binder is high, adhesion of the conductive nanomaterial 21 with respect to the substrate 10 may increase, but the resistance of the conductive coating film 20 may increase, too. In addition, when the concentration of the binder is significantly low or zero, the conductive nanomaterial 21 may fall away from the substrate 10 during the washing process, resulting in degradation of characteristics of the conductive coating film 20. Meanwhile, when the concentration of the photosensitive material is significantly low, that is, 0.1 wt % or less, the adhesion of the conductive nanomaterial 21 with respect to the substrate 10 may be maintained even without the binder, the conductive coating film 20 according to the embodiment of the present invention may be fabricated.

The dispersant may be classified as a dispersant for metal nanowires and a dispersant for nanocarbon according to the conductive nanomaterial 21 to be used. For example, hydroxy propyl methyl cellulose (HPMC), carboxymethyl cellulose (CMC), 2-hydroxy ethyl cellulose (HC), or the like may be used as a dispersant for silver nanowires. Sodium dodecyl sulfate (SDS), lithium dodecyl sulfate (LDS), sodium dodecyl benzene sulfonate (SDBS), dodecyl trimethyl ammonium bromide (DTAB), cetyl trimethyl ammonium bromide (CTAB), Brij-series, Tween-series, Triton X-series, poly(vinylpyrrolidone), or the like may be used as a dispersant for carbon nanotubes.

In addition, the additive may be selectively used to improve coatability and dispersibility of the photosensitive coating solution, prevent corrosion of the metal nanowires, and improve endurance of the conductive coating film 20. For example, the additive may promote the stability of the photosensitive coating solution (e.g. an oil dispersant), improve wetting and coating properties (e.g. a surfactant or a solvent additive), assist the formation or division of secondary particles, or prevent formation of a phase-separated structure during the formation of the conductive coating film 20, or promote drying of the conductive coating film 20.

The conductive coating film 20 according to the second embodiment of the present invention may include the conductive nanomaterial 21 uniformly formed on the substrate 10. The conductive coating film 20 may include the exposed region 25 and the non-exposed region 27, and the interconnection pattern 29 may be formed in the non-exposed region 27. The electrical conductivity of the non-exposed region 27 may be twice that of the exposed region 25 or more.

In addition, the conductive coating film 20 may be formed as a single layer including the conductive nanomaterial 21, the photosensitive material, and the binder, or may have a structure in which a photosensitive material layer is formed on a conductive nanomaterial layer.

A difference in electrical conductivity between the exposed region 25 and the non-exposed region 27 in the conductive coating film 20 according to the second embodiment of the present invention occurs for the following reason. Before the conductive coating film 20 is formed, that is, before the UV exposure and washing process, the photosensitive thin film including the conductive nanomaterial 21, the photosensitive material, and the binder has a very low electrical conductivity due to the photosensitive material and the binder.

Then, when the photosensitive thin film is exposed to UV light, physical or chemical bonds between the photosensitive materials or between the photosensitive material and other compositions may be formed or broken, and thus a difference of solubility in a specific solvent may be generated. However, there is little change in chemical and physical characteristics of the conductive nanomaterial 21 during the exposure process. Here, the specific solvent may be a solvent having a high solubility selectively in the photosensitive material. For example, when a water-soluble photosensitive material is used as the photosensitive material, the water-soluble photosensitive material may have a different solubility in water.

That is, the photosensitive material may have a high solubility in the specific solvent before the exposure process, but have a low solubility in the specific solvent after the exposure process since it is cured. That is, according to the embodiment of the present invention, the interconnection pattern 29 may be formed using the different solubility of the photosensitive material in the specific solvent.

Accordingly, the exposed region 25 and the non-exposed region 27 of the photosensitive thin film may have different solubilities in the specific solvent. In particular, when the photosensitive thin film includes a large amount of other compositions, the difference in electrical conductivity between the two regions becomes sufficiently large for a transparent electrode and a circuit electrode to be formed. Normally, when in contact with the solvent, a region where more of the photosensitive material and other compositions are removed may have a higher electrical conductivity, and a region where less of the photosensitive material and other compositions are removed may have a lower electrical conductivity.

For example, when the non-exposed region 27 has a higher solubility in the solvent than the exposed region 25, the non-exposed region 27 may be formed as the interconnection pattern 29.

Meanwhile, the non-exposed region 27 is described as having a higher solubility than the exposed region 25 in the embodiment of the present invention. However, the opposite characteristics may occur depending on types of the photosensitive material. That is, when the exposed region 25 has a higher solubility than the non-exposed region 27, the exposed region 25 may be formed as the interconnection pattern 29.

Widths of the exposed region 25 and the non-exposed region 27 forming the conductive coating film 20 may be 1 μm or more, and a shape of the interconnection pattern 29 may be determined under the exposure process. Normally, the shape of the interconnection pattern 29 may be determined according to a shape of a mask used in the exposure process.

A method of fabricating the conductive coating film 20 according to the second embodiment will be described with reference to FIGS. 1 to 7, and FIG. 15.

First, as illustrated in FIG. 4, a substrate 10 for forming a conductive coating film 20 is prepared.

Next, as illustrated in FIG. 5, a photosensitive thin film 23 including a conductive nanomaterial, a photosensitive material, and a binder is formed on the substrate 10, in a process step S51. That is, the photosensitive thin film 23 is formed by coating the substrate 10 with a photosensitive coating composition according to the embodiment of the present invention. Here, the photosensitive coating composition may include the conductive nanomaterial, the photosensitive material, the binder, and water, and further include other compositions. For example, the photosensitive coating composition may include the conductive nanomaterial in an amount of 0.01 to 5 wt %, the photosensitive material in an amount of 0.01 to 3 wt %, the binder in an amount of 1 wt % or less, and other compositions in an amount of 5 wt % or less, and the water may occupy the rest.

Meanwhile, the photosensitive thin film 23 may be formed as a single layer including the conductive nanomaterial, the photosensitive material, and the binder, or may have a structure in which a photosensitive material layer is formed on a conductive nanomaterial layer. When the photosensitive thin film 23 is the single layer as described in the former, the photosensitive thin film 23 may further include other compositions, such as the dispersant and the additive. When the photosensitive thin film 23 has the structure described in the latter, the other compositions, such as the dispersant, the binder, and the additive, may be included in the conductive nanomaterial layer.

Next, as illustrated in FIG. 6, portions of the photosensitive thin film 23 are exposed in a process step S53. That is, the photosensitive thin film 23 is exposed to UV light using a mask 30 in which a pattern hole 31 corresponding to a region to be exposed is formed.

During the exposure process, the UV exposure time may be normally several minutes, preferably several seconds. During the exposure process, there is little change in chemical and physical characteristics of the conductive nanomaterial during the exposure process.

Next, as illustrated in FIG. 7, the exposed photosensitive thin film is washed with the solvent and dried, in a process step S55. Thus, a conductive substrate 100 including the conductive coating film 20 having an interconnection pattern 29 may be fabricated. That is, since the non-exposed region 27 has a relatively higher solubility in the solvent than the exposed region 25, more of the photosensitive material and other compositions may be removed in the non-exposed region 27 than in the exposed region 25.

In the conductive substrate 100 fabricated by the method according to the embodiment of the present invention, the conductive coating film 20 may not be directly etched. Further, the conductive coating film 20 having the interconnection pattern 29 capable of flowing currents by controlling an electrical conductivity of a specific region may be formed without damage or a chemical change of the conductive nanomaterial, which is a conductive filler of the conductive coating film 20.

The photosensitive thin film according to the embodiment of the present invention may include the conductive nanomaterial, the 1 photosensitive material, and the binder, and may further include other compositions, such as the dispersant and the additive.

As described above, in the conductive substrate 100 according to the embodiment of the present invention, the conductive coating film 20 including the interconnection pattern 29 in which the electrical conductivity of the exposed region 25 is different from that of the non-exposed region 27 may be formed by forming the photosensitive thin film including the conductive nanomaterial and the photosensitive material on the substrate 10, exposing the photosensitive thin film according to the shape of the interconnection pattern 29 to be formed, and washing the exposed photosensitive thin film.

That is, other compositions, such as the dispersant and the additive, as well as the conductive nanomaterial may be included in the photosensitive thin film. When the photosensitive thin film is exposed to light, physical or chemical bonds between the photosensitive material and the other compositions may be formed or broken, and thus a difference of solubility in a specific solvent such as water may be generated. When in contact with the solvent, a region where more of the photosensitive material and the other compositions are removed may have a higher electrical conductivity, and a region where less of the photosensitive material and the other compositions are removed may have a lower electrical conductivity. For example, when the photosensitive thin film is exposed and then washed with the solvent, more of the photosensitive material and the other compositions may be removed in the non-exposed region 27 than in the exposed region 25. Accordingly, electrical conductivities of the exposed region 25 and the non-exposed region 27 may become sufficiently different from each other for a pattern for flowing currents to be formed.

According to the embodiment of the present invention, the interconnection pattern 29 flowing currents in a specific pattern using a difference in electrical conductivity in a local area of the conductive coating film 20 may be formed by a simple exposure process without directly etching the conductive coating film 20 including the conductive nanomaterial.

In addition, in the conductive substrate 100 according to the embodiment of the present invention, although the conductive coating film 20 having a different electrical conductivity in the local area is formed by forming the interconnection pattern 29 using the exposure and washing process, the conductive nanomaterial corresponding to the conductive filler of the conductive coating film 20 is similarly distributed even in areas having different electrical conductivities, and uniformly distributed throughout the conductive coating film 20.

Further, according to the embodiment of the present invention, the conductive substrate 100 including the conductive nanomaterial, which is not chemically and physically etched, not chemically oxidized or sulfurized, and not physically damaged in a specific region of the conductive coating film 20, may be provided.

Further, in the conductive coating film 20 according to the embodiment of the present invention, since the conductive nanomaterial remains similarly in the exposed region 25 and the non-exposed region 27 even after the exposure and washing process, a phenomenon in which the interconnection pattern is shown may be prevented.

Characteristics of the conductive coating film in the conductive substrate according to the embodiment of the present invention will be described in the following specific experimental examples.

EXPERIMENTAL EXAMPLE 2-1

A conductive substrate according to the experimental example 2-1 of the present invention includes a PET film as a substrate, and silver nanowires as a conductive nanomaterial.

That is, in the experimental example 2-1 of the present invention, a pattern consisting of a high conductive region and a low conductive region is formed by coating the substrate with a silver nanowire coating solution including silver nanowires, a water-soluble photosensitive material, that is, photosensitive polyvinyl alcohol, and a water-dispersible polyurethane binder and performing an exposure and washing process. The silver nanowires have diameters of 25 to 40 nm and lengths of 10 to 30 µm. Here, the silver nanowire coating solution may include silver nanowires (0.15 wt %), photosensitive polyvinyl alcohol (0.6 wt %), which is a water-soluble photosensitive material, HPMC (0.2 wt %), which is a dispersant, and a water-dispersible polyurethane binder (0.01 wt %).

The substrate is coated with the aqueous silver nanowire dispersions by a bar coating method, and the coated substrate is dried at a temperature of 130° C. for 1 minute. The dried photosensitive thin film has a high sheet resistance exceeding a measurement limit of a sheet-resistance measuring instrument (10 MΩ/sq or more). The photosensitive thin film is irradiated with UV light for 1 second to form a specific pattern using a chrome photomask, post-baked at a temperature of 130° C. for 5 minutes, washed with water, the solvent, and dried. Accordingly, the conductive coating film according to the experimental example 2-1 of the present invention may be formed on the substrate.

Figure 16:
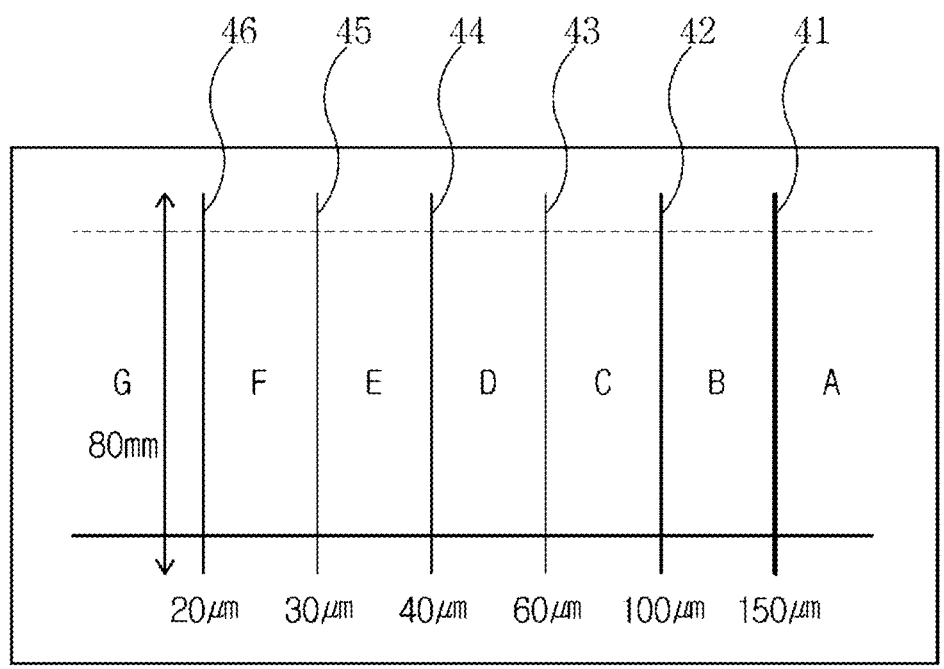
FIG. 16 is a diagram illustrating a pattern structure for testing insulating properties according to line widths of an interconnection pattern of a conductive coating film fabricated according to the experimental example 2-1 of the present invention.

A UV-exposed region of the conductive coating film according to the experimental example 2-1 of the present invention includes straight lines having various line widths as illustrated in FIG. 16. Insulating characteristics according to the line widths of the exposed lines are examined. Here, FIG. 16 illustrates patterns for examining the insulating characteristics of the interconnection patterns according to the line widths in the conductive coating film fabricated according to the experimental example 2-1 of the present invention.

Referring to FIG. 16, the UV-exposed lines of the conductive coating film are slightly visible as semitransparent lines. However, when the conductive coating film is overcoated with another polymer material or another film is attached to the conductive coating film, the semitransparent lines of the exposed lines are invisible.

The exposed lines are straight line shapes having different line widths. A resistance of each of the exposed lines as boundary lines is measured. A first exposed line 41 formed between an area A and an area B has a line width of 150 µm. A second exposed line 42 formed between the area B and an area C has a line width of 100 µm. A third exposed line 43 formed between the area C and an area D has a line width of 60 µm. A fourth exposed line 44 formed between the area D and an area E has a line width of 40 µm. A fifth exposed line 45 formed between the area E and an area F has a line width of 30 µm. In addition, a sixth exposed line 46 formed between the area F and an area G has a line width of 20 µm. The first to sixth exposed lines have a length of 80 mm.

All the resistances of the first to fourth exposed lines 41 to 44 are 10 MΩ/sq or more, which are values exceeding the measurement limit of the resistance measuring instrument. That is, the first to fourth exposed lines 41 to 44 have a high level of insulation. The resistance of the fifth exposed line 45 is 20 to 30 kΩ, and the resistance of the sixth exposed line 46 is about 2 kΩ.

Each of the areas A to G is a non-exposed area in which the photosensitive material is washed and removed, and has a high electrical conductivity. The areas have sheet resistances of 120 to 150 Ω/sq, light transmittances of about 90%, and hazes of about 1.5.

Figure 17:
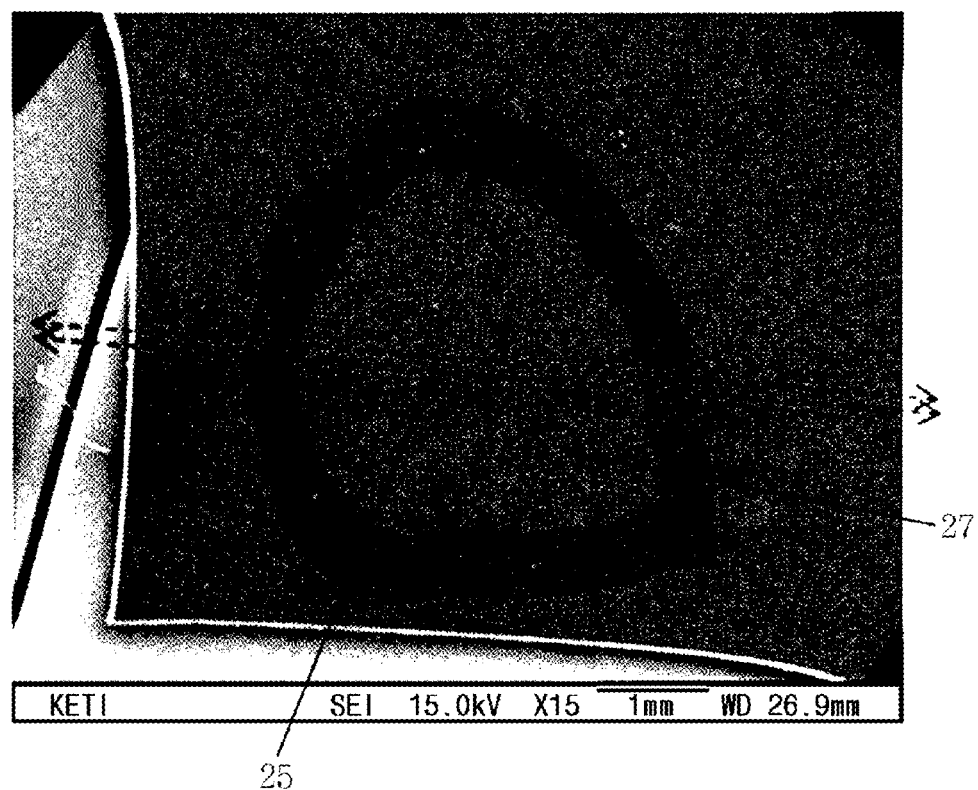
FIGS. 17 to 19 are photographs showing a conductive coating film fabricated according to the experimental example 2-1 of the present invention.
Figure 18:
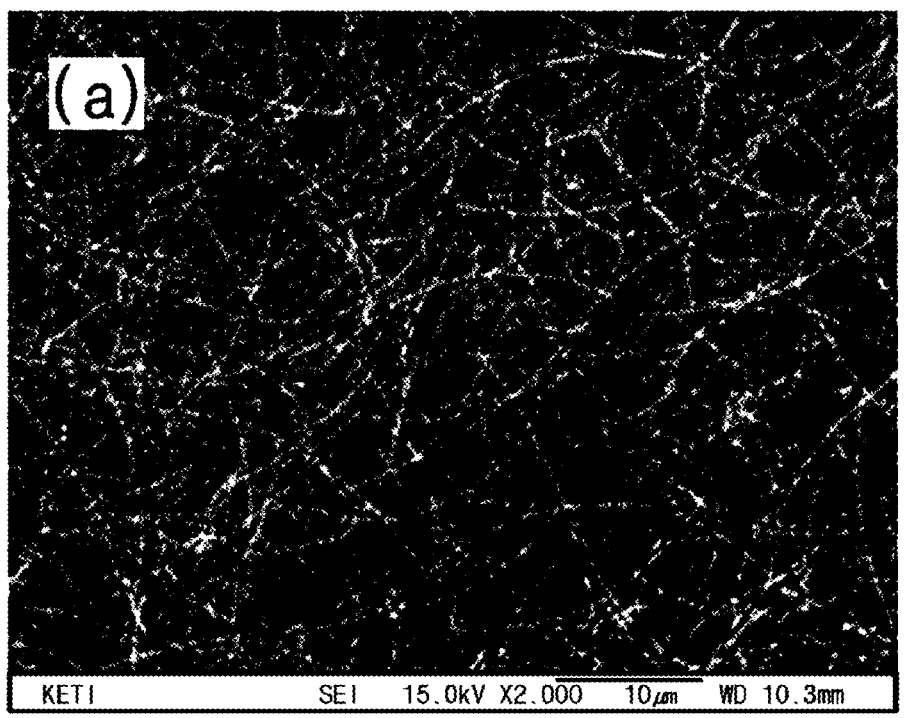
Figure 18:
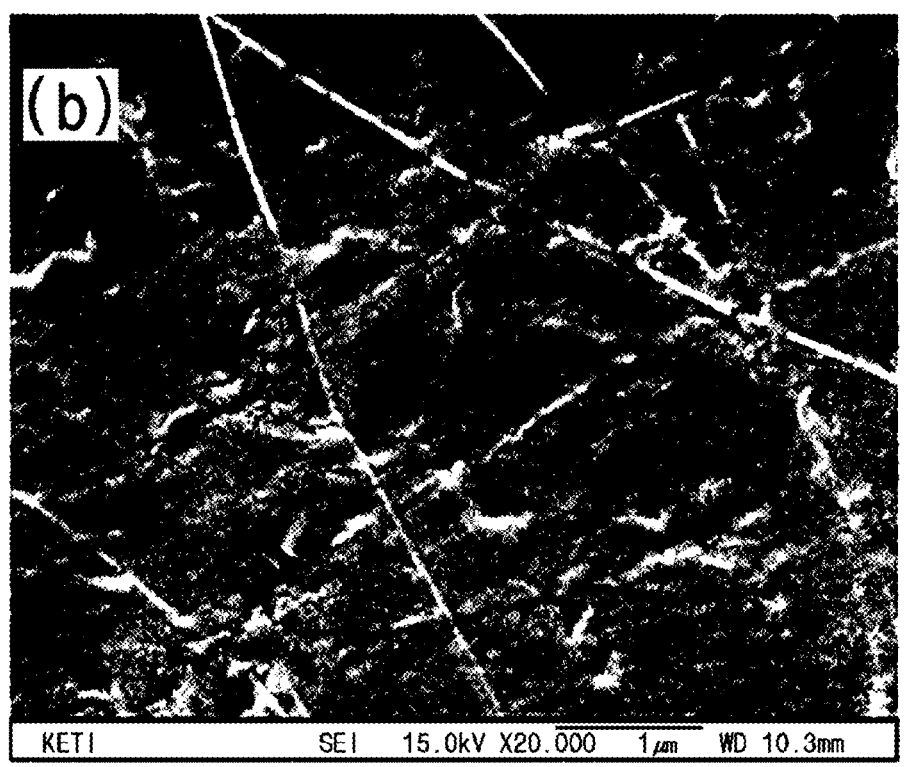
Figure 19:
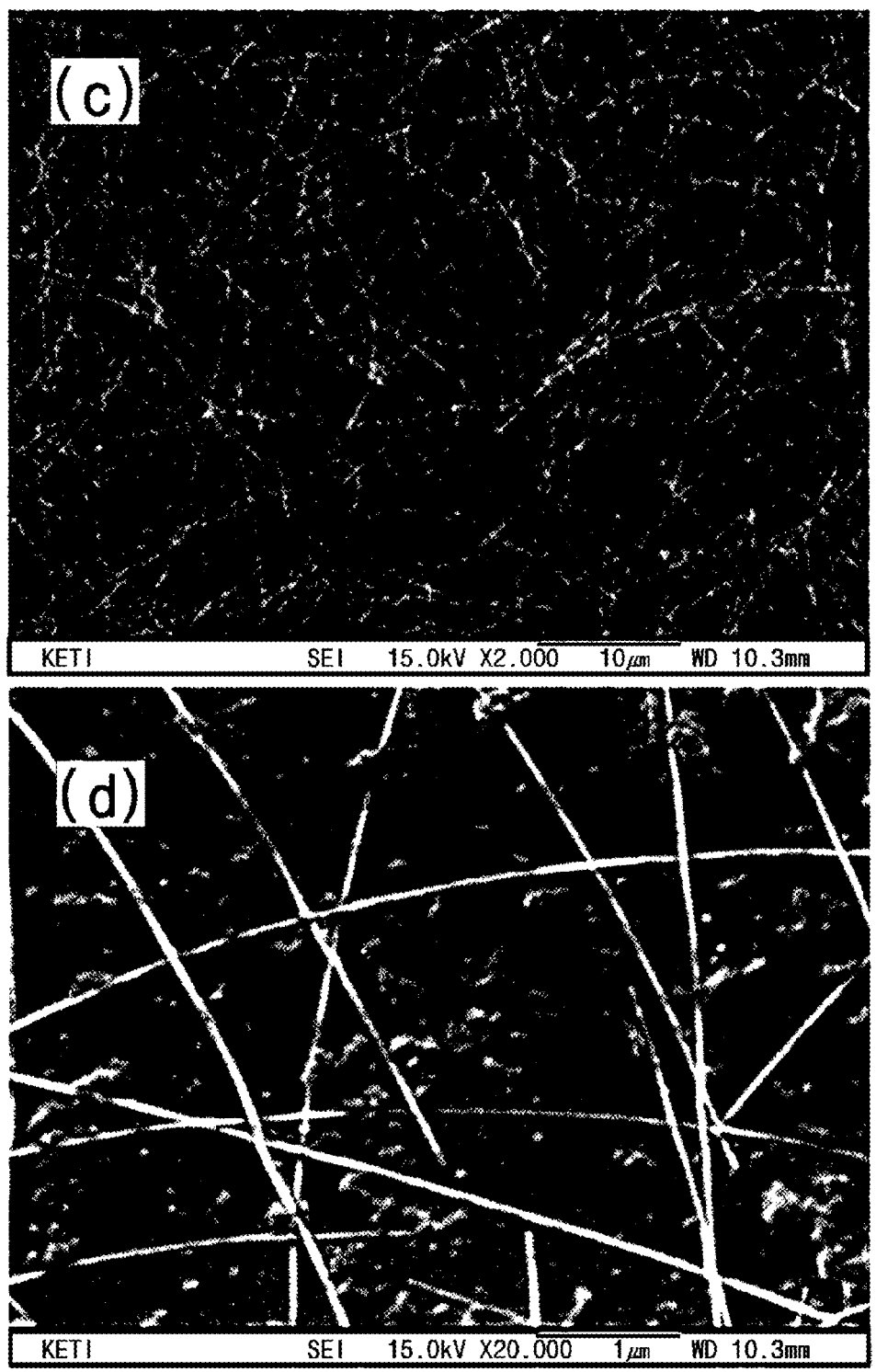

In order to examine surface morphology of the UV-exposed lines and a non-UV-exposed region, the UV-exposed lines and the non-UV-exposed region are observed with an electron microscope, as illustrated in FIGS. 17 to 19. Here, photographs of FIGS. 17 to 19 illustrate conductive coating films fabricated according to the experimental example 2-1 of the present invention.

As a result of the observation, the silver nanowires are distributed similarly in both of the UV-exposed line images (a) and (b) and the non-UV-exposed region images (c) and (d), and it is found that there is little damage in the silver nanowires due to the UV exposure.

However, in enlarged electron microscopic images (b) and (d), the silver nanowires are covered and impregnated by the photosensitive material and the binder more in the UV-exposed line image (b) than in the non-UV-exposed region image (d). Further, since the UV-exposed line area (b) has poor contact characteristics between the silver nanowires, a resistance thereof may increase. In addition, in the images (b) and (d), polyurethanes, the binder, serve to attach the silver nanowires to the substrate, and thus prevent the silver nanowires from falling off during the washing process.

In addition, in order to ensure that there is no damage in the silver nanowires due to the UV exposure by measuring electrical characteristics, the conductive substrate according to the experimental example 2-1 of the present invention is exposed again to UV light of the same power for 5 seconds, and then sheet resistances of the areas A to G are measured again. Before the UV exposure, the areas A to G had the sheet resistances of 120 to 150 Ω/sq and the light transmittances of about 90%. After exposed to UV light for 5 seconds, the areas A to G had the sheet resistances of 120 to 150 Ω/sq and the light transmittances of about 90%, too. Accordingly, it can be seen there is little damage in the silver nanowires due to the UV exposure for 5 seconds or less.

EXPERIMENTAL EXAMPLE 2-2

According to the experimental example 2-2 of the present invention, a pattern consisting of a high conductive region and a low conductive region is formed using a carbon nanotube/silver nanowire photosensitive coating solution.

The carbon nanotube/silver nanowire photosensitive coating solution includes single-wall carbon nanotubes, silver nanowires having diameters of 20 to 40 nm and lengths of 10 to 30 µm, and a polyethyleneimine binder. Here, the carbon nanotube/aqueous silver nanowire dispersions includes carbon nanotubes of 0.1 wt %, silver nanowires of 0.1 wt %, HPMC of 0.1 wt %, CTAB of 0.1 wt %, photosensitive polyvinyl alcohol of 0.6 wt %, which is a water-soluble photosensitive material, and the polyethyleneimine binder 0.01 wt %.

A PET film is coated with the carbon nanotube/aqueous silver nanowire dispersions by a bar coating method, and the coated substrate is dried at a temperature of 130° C. for 1 minute. The dried photosensitive thin film has a high sheet resistance exceeding a measurement limit of a sheet-resistance measuring instrument (10 MΩ/sq or more). The photosensitive thin film is irradiated with UV light for 1 second to form a specific pattern using a chrome photomask, post-baked at a temperature of 130° C. for 5 minutes, washed with water, the solvent, and dried. Accordingly, the conductive coating film according to the experimental example 2-2 of the present invention may be formed on the substrate.

A UV-exposed region of the conductive coating film according to the experimental example 2-2 of the present invention includes straight lines having various line widths as illustrated in FIG. 16. Insulating characteristics according to the line widths of the exposed lines are examined.

As a result, the UV-exposed lines of the conductive coating film are slightly visible as semitransparent lines. However, when the conductive coating film is over-coated with another polymer material or another film is attached to the conductive coating film, the semitransparent lines of the exposed lines are invisible.

All the resistances of the first to fourth exposed lines 41 to 44 are 10 MΩ/sq or more, which are values exceeding the measurement limit of the resistance measuring instrument. The resistance of the fifth exposed line 45 is 30 to 50 kΩ, and the resistance of the sixth exposed line 46 is about 3 kΩ.

Each of the areas A to G is a non-exposed area in which the photosensitive material is washed and removed, and has a high electrical conductivity. The areas have sheet resistances of 110 to 140 Ω/sq, light transmittances of about 89%, and hazes of about 1.3.

Figure 20:
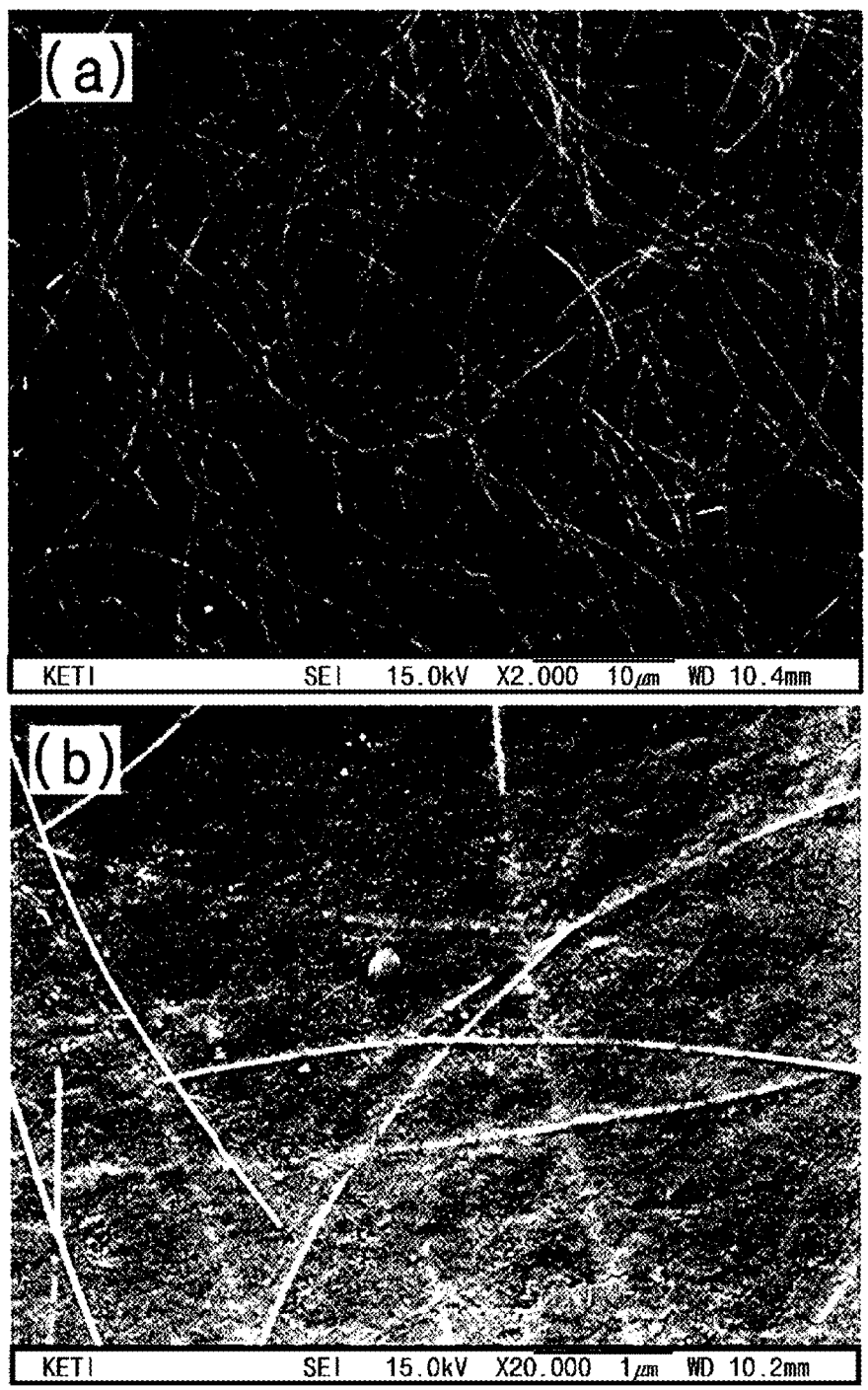
FIGS. 20 and 21 are photographs showing a conductive coating film fabricated according to the experimental example 2-2 of the present invention.
Figure 21:
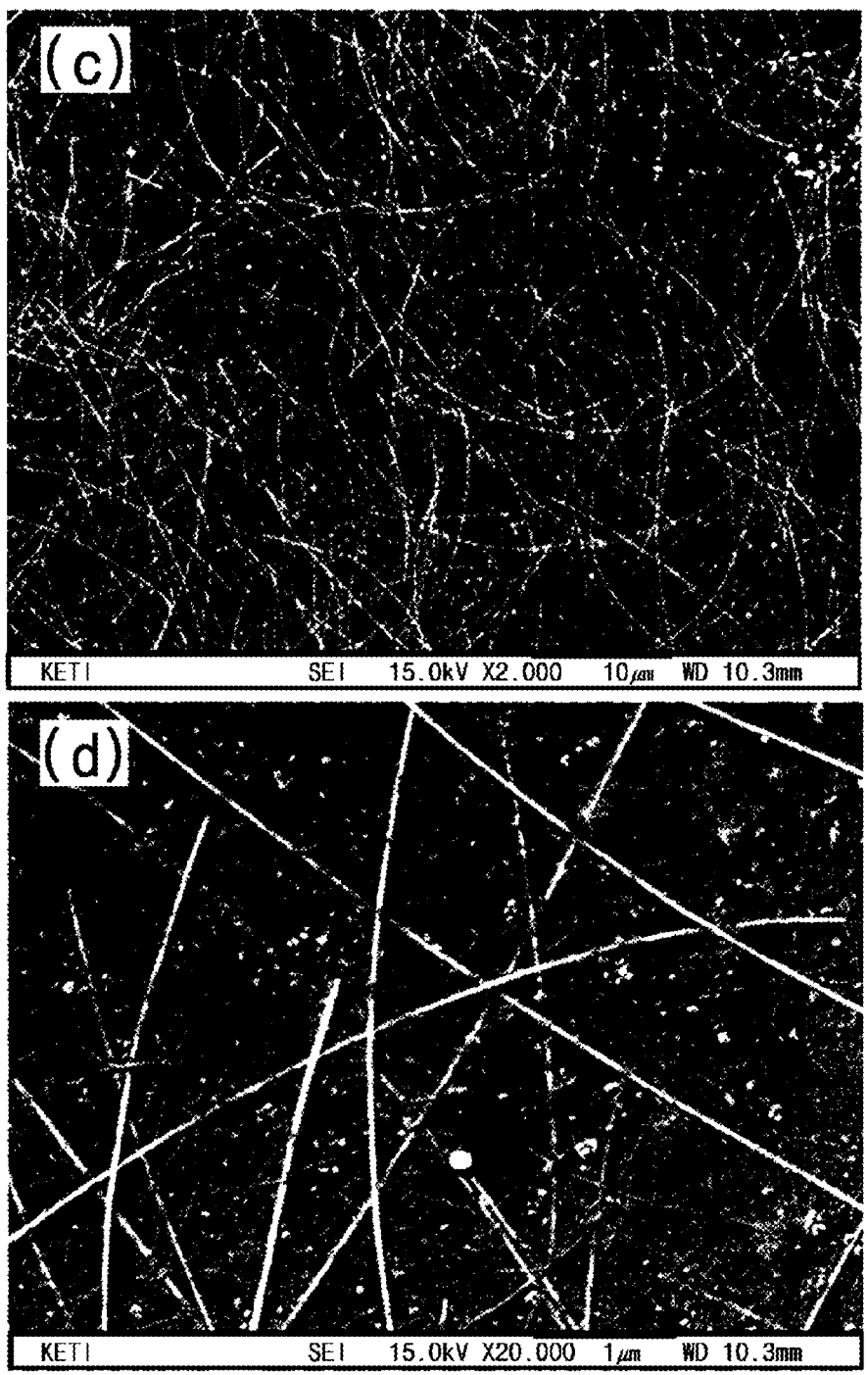

In order to examine surface morphology of the UV-exposed region and a non-UV-exposed region, the UV-exposed region and the non-UV-exposed region are observed with an electron microscope, as illustrated in FIGS. 20 to 21.

As a result of the observation, the silver nanowires are distributed similarly in both the UV-exposed line images of (a) and (b) and the non-UV-exposed region images (c) and (d), and it can be seen that there is little damage in the silver nanowires due to the UV exposure.

However, in enlarged electron microscopic images (b) and (d), the silver nanowires are covered by the photosensitive material and the binder more in the UV-exposed line image (b) than in the non-UV-exposed region image (d). Further, since the UV-exposed line region has poor contact characteristics between the silver nanowires, a resistance thereof may increase. Although not clearly shown in the electron microscopic images due to extremely small particle sizes of the carbon nanotubes, the carbon nanotubes are found in the enlarged images (b) and (d) of the non-UV-exposed region. Although not clearly shown in the image (b) due to the photosensitive material and the other compositions, the carbon nanotubes are found in some areas thereof.

In addition, in order to ensure that there is no damage in the silver nanowires due to the UV exposure by measuring electrical characteristics, the conductive substrate according to the experimental example 2-2 of the present invention is exposed again to UV light of the same power for 5 seconds, and then sheet resistances of the areas A to G are measured again. Before the UV exposure, the areas A to G had the sheet resistances of 110 to 140 Ω/sq, the light transmittances of about 89%, and the hazes of 1.3. After exposed to UV light for 5 seconds, the areas A to G had the sheet resistances of 110 to 140 Ω/sq, the light transmittances of about 89%, and the hazes of 1.3, too. Accordingly, it can be seen there is little degradation in characteristics of the conductive coating film due to the UV exposure for 5 seconds or less.

[Third Embodiment]

Figure 22:
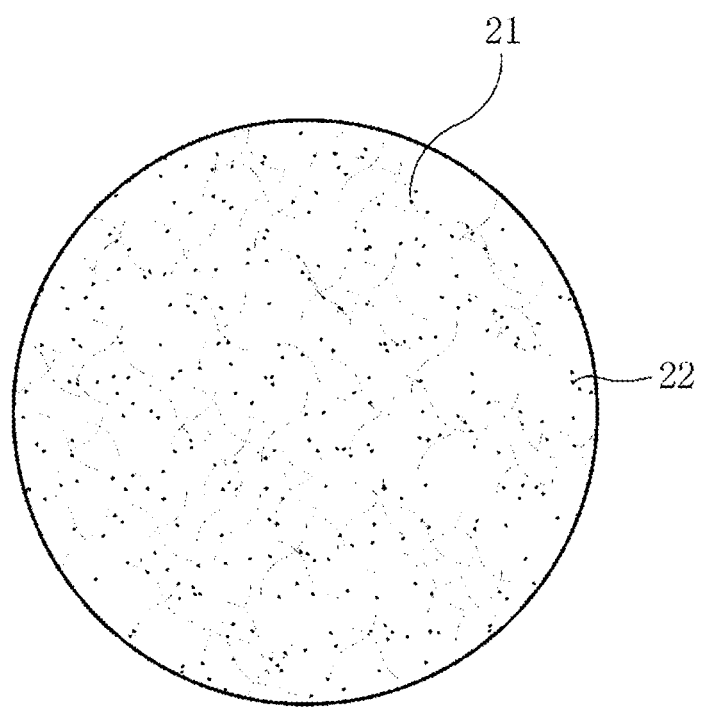
FIG. 22 is an enlarged view of the part B in FIG. 1, which illustrates a conductive coating layer including nanoparticles according to a third embodiment of the present invention.

A conductive substrate 100 according to a third embodiment of the present invention includes, as illustrated in FIGS. 1 and 22, a substrate 10 and a conductive coating film 20 formed on the substrate 10, including a conductive nanomaterial 21, nanoparticles 22, a photosensitive material, and a binder, and having an interconnection pattern 29 formed by an exposure and washing process.

Here, as the substrate 10 and the conductive nanomaterial, materials described in the first embodiment of the present invention may be used.

In addition, the nanoparticles 22, the conductive nanomaterial 21, the photosensitive material, and the binder may be included as the photosensitive coating composition to form the conductive coating film 20, and other compositions, such as a dispersant and an additive may be further included. For example, the photosensitive coating composition may include the conductive nanomaterial 21 in an amount of 0.01 to 5 wt %, the nanoparticles 22 in an amount of 0.01 to 0.5 wt %, the photosensitive material in an amount of 0.01 to 3 wt %, and the binder in an amount of 1 wt % or less, and the water may occupy the rest. The photosensitive coating composition may further include the additive in an amount of 5 wt % or less.

The nanoparticles 22 may be oxide nanowires, oxide nanoparticles, metal nanoparticles, carbon nanoparticles. Since the nanoparticles 22 have a low electrical conductivity or a low aspect ratio compared to the metal nanowires or carbon nanotubes, the nanoparticles 22 may have a low electrical connectivity in conductive coating film 20. Such nanoparticles 22 may not significantly affect an electrical conductivity of the conductive coating film 20, however, may improve insulation stability of the exposed region 25.

The nanoparticles 22 may have a shape of linear, circular, cubic, or amorphous particles having sizes of 5 nm or more. When the photosensitive material forms cross-links under UV light, the nanoparticles 22 may be impregnated in the photosensitive material and may remain in the exposed region 25 without being removed during the washing process. In addition, the nanoparticles 22 have specific sizes, normally have a size and volume stability stable against a temperature variation and an external impact. When composited with the photosensitive material, the nanoparticles 22 may function to minimize a variation in volume and shape of the composited photosensitive material due to the temperature variation and the external impact. Accordingly, the exposed region 25 including the nanoparticles 22 may have structural stability compared to a exposed region which does not include the nanoparticles 22.

Here, the oxide nanowire may have diameters of 10 nm to 1 μm and lengths of 1 μm to 100 μm. The oxide nanowires may be metal oxide nanowires or non-metal oxide nanowires. The oxide nanoparticles, the metal nanoparticles, and the carbon nanoparticles may be circular, cubic, or amorphous nanoparticles having particle sizes of 5 nm to 30 μm. The oxide nanoparticles may be metal oxide nanoparticles or non-metal oxide nanoparticles.

Here, as a concentration of the conductive nanomaterial 21 included in the photosensitive coating solution increases, a resistance of the conductive coating film 20 may be decreased since the electrical conductivity thereof increases. However, when the concentration of the conductive nanomaterial 21 is too high, that is, more than 0.5 wt %, it may be difficult to disperse the conductive nanomaterial 21 in the solution. Accordingly, the conductive nanomaterial 21 of 0.01 to 0.5 wt % is preferably used.

As a concentration of the nanoparticles 22 included in the photosensitive coating solution increases, insulation stability of the conductive coating film 20 may increase. However, when the concentration of the nanoparticles 22 is too high, that is, more than 0.5 wt %, electrical conductivity of the conductive coating film 20 may be decreased or the insulation stability of the conductive coating film 20 may be increased since the nanoparticles 22 are not sufficiently removed from the non-UV-exposed region 27 of the conductive coating film 20 during the washing process. On the contrary, when the concentration of the nanoparticles 22 is 0.01 wt % or less, the nanoparticles 22 may not affect the insulation stability of the conductive coating film 20. Accordingly, the nanoparticles 22 is preferably used in an amount of 0.01 to 0.5 wt %.

In addition, the photosensitive material is a material forming cross-links under a UV exposure and has a low solubility in a solvent during the washing process after the exposure process. Accordingly, the photosensitive material may form a region having a relatively low electrical conductivity. A material exposed to radiation from one or more energy sources, such as light (infrared light, visible light, or ultraviolet light), heat, laser, or the like, is preferably used as the photosensitive material. However, the energy source may not be limited thereto.

The binder, the dispersant, and the additive described in the second embodiment may be used as the binder, the dispersant, and the additive.

In addition, in order to further improve conductivity and adhesion of the conductive coating film 20, the photosensitive coating solution may include conductive polymers, graphene, or the like.

The conductive coating film 20 according to the third embodiment of the present invention may include the conductive nanomaterial 21 uniformly formed on the substrate 10. The conductive coating film 20 may include the exposed region 25 and the non-exposed region 27, and the non-exposed region 27 may be formed as the interconnection pattern 29. The electrical conductivity of the non-exposed region 27 may be twice that of exposed region 25 or more.

In addition, the conductive coating film 20 may be formed as a single layer including the conductive nanomaterial 21, the photosensitive material, and the binder, or may have a structure in which a photosensitive material layer is formed on a conductive nanomaterial layer.

A difference in electrical conductivity between the exposed region 25 and the non-exposed region 27 in the conductive coating film 20 according to the third embodiment of the present invention occurs for the following reason. Before the conductive coating film 20 is formed, that is, before the UV exposure and washing process, the photosensitive thin film including the conductive nanomaterial 21, the photosensitive material, and the binder has a very low electrical conductivity due to the photosensitive material and the binder.

However, when the photosensitive thin film is exposed to UV light, physical or chemical bonds between the photosensitive materials or between the photosensitive material and other compositions may be formed or broken, and thus a difference of solubility in a specific solvent may be generated. However, there is little change in chemical and physical characteristics of the conductive nanomaterial 21 during the exposure process. Here, the specific solvent may be a solvent having a high solubility selectively in the photosensitive material. For example, when a water-soluble photosensitive material is used as the photosensitive material, the water-soluble photosensitive material may have a different solubility in water.

That is, the photosensitive material may have a high solubility in the specific solvent before the exposure process, but have a low solubility in the specific solvent when it is exposed and cured. According to the embodiment of the present invention, the interconnection pattern 29 may be formed using the different solubility of the photosensitive material in the specific solvent.

Accordingly, the exposed region 25 and the non-exposed region 27 of the photosensitive thin film may have different solubilities in the specific solvent. In particular, when the photosensitive thin film includes a large amount of other compositions, the difference in electrical conductivity between the two regions becomes sufficiently large for a transparent electrode and a circuit electrode to be formed. Normally, when in contact with the solvent, a region where more of the photosensitive material and other compositions are removed may have a higher electrical conductivity, and a region where less of the photosensitive material and other compositions are removed may have a lower electrical conductivity.

For example, when the non-exposed region 27 has a higher solubility in the solvent than the exposed region 25, the non-exposed region 27 may be formed as the interconnection pattern 29.

In addition, the coating solution may include the binder, which may serve to fix the metal nanowires or the carbon nanotubes not to be removed during the washing process. Further, the additive or the like may be included to improve coatability, environmental endurance, adhesion, and anticorrosion.

Meanwhile, when only the metal nanowires or the carbon nanotubes are used as the conductive nanomaterial to form the conductive coating film, the insulation stability of the exposed region 25 having a low electrical conductivity may be a little degraded. That is, the insulation stability of the exposed region 25 may be a little degraded, since the metal nanowires or the carbon nanotubes having a high electrical conductivity remain in the exposed region 25 and thus the conductive nanomaterials 21 are connected to each other due to volume changes occurring when an external impact is applied or a temperature is varied.

In order to compensate for this, when the nanoparticles 22 which having a relatively low electrical conductivity or aspect ratio are added to the insulation region, changes in shape or volume of the exposed region 25 according to the external impact or temperature variation may be reduced. In addition, the nanoparticles 22 are interposed between the metal nanowires or the carbon nanotubes and prevent electrical connection of the metal nanowires or the carbon nanotubes. Accordingly, the insulation stability may be maintained.

Since the oxide nanowires, oxide nanoparticles, metal nanoparticles, or carbon nanoparticles of the non-exposed region 27 are partially or fully removed during the washing process and, even when they are not removed, the metal nanowires or carbon nanotubes are electrically connected and ensure the electrical conductivity, the oxide nanowires, oxide nanoparticles, metal nanoparticles, or carbon nanoparticles of the non-exposed region 27 may not affect the electrical conductivity of the non-exposed region 27.

In addition, the non-exposed region 27 has a higher solubility than the exposed region 25 in the third embodiment of the present invention. However, opposite characteristics thereto may be shown depending on the type of the photosensitive material. That is, when the exposed region 25 has a higher solubility than the non-exposed region 27, the interconnection pattern 29 may be formed in the exposed region 25.

Widths of the exposed region 25 and the non-exposed region 27 forming the conductive coating film 20 may be 1 μm or more, and a shape of the interconnection pattern 29 may be determined under the exposure process. Normally, the shape of the interconnection pattern 29 may be determined according to a shape of a mask used in the exposure process.

Figure 23:
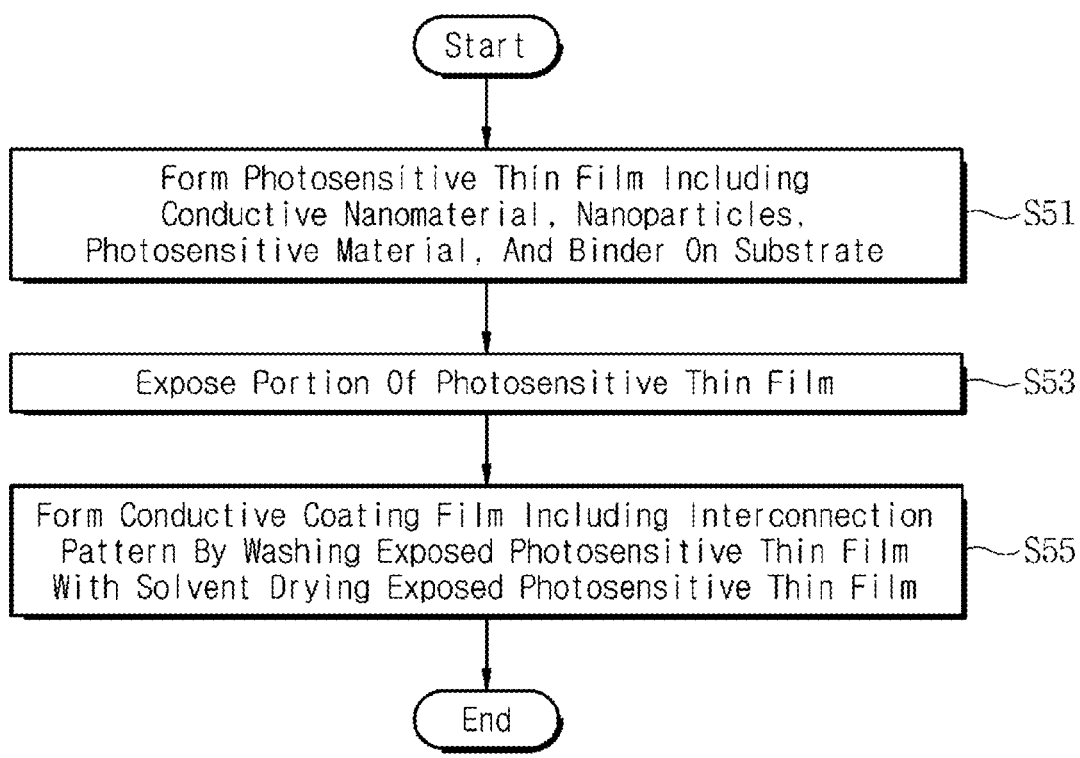
FIG. 23 is a flowchart according to the experimental example 3-3 of a method of fabricating a conductive coating film including nanoparticles according to the third embodiment of the present invention.

A method of fabricating the conductive coating film 20 according to the third embodiment will be described with reference to FIGS. 1, 3 to 7, 22, and 23. Here, FIG. 22 is an enlarged view of the part "B" in FIG. 1 and illustrates the conductive coating film 20 including nanoparticles, according to the third embodiment of the present invention. FIG. 23 is a flowchart of a method of fabricating the conductive coating film 20 including the nanoparticles, according to the third embodiment of the present invention.

First, as illustrated in FIG. 4, a substrate 10 for forming a conductive coating film 20 is prepared.

Next, as illustrated in FIG. 5, a photosensitive thin film 23 including a conductive nanomaterial, nanoparticles, a photosensitive material, and a binder is formed on the substrate 10, in a process step S51. That is, the photosensitive thin film 23 is formed by coating the substrate 10 with a photosensitive coating composition according to the embodiment of the present invention. Here, the photosensitive coating composition may include the conductive nanomaterial, the nanoparticles, the photosensitive material, the binder, and water, and further include other compositions. For example, the photosensitive coating composition may include the conductive nanomaterial in an amount of 0.01 to 5 wt %, the nanoparticles in an amount of 0.01 to 0.5 wt %, the photosensitive material in an amount of 0.01 to 3 wt %, the binder in an amount of 1 wt % or less, and other compositions in an amount of 5 wt % or less, and the water may occupy the rest.

Meanwhile, the photosensitive thin film 23 may be formed as a single layer including the conductive nanomaterial, the nanoparticles, the photosensitive material, and the binder, or may have a structure in which a photosensitive material layer is formed on a conductive nanomaterial layer including the nanoparticles. When the photosensitive thin film 23 is the single layer as described in the former, the photosensitive thin film 23 may further include other compositions, such as the dispersant and the additive. When the photosensitive thin film 23 has the structure described in the latter, the other compositions, such as the dispersant and the additive, may be included in the conductive nanomaterial layer including the nanoparticles.

Next, as illustrated in FIG. 6, portions of the photosensitive thin film 23 are exposed in a process step S53. That is, the photosensitive thin film 23 is exposed to UV light using a mask 30 in which a pattern hole 31 corresponding to a region to be exposed is formed.

During the exposure process, the UV exposure time may be normally several minutes, preferably several seconds. During the exposure process, there is little change in chemical and physical characteristics of the conductive nanomaterial during the exposure process.

Next, as illustrated in FIG. 7, the exposed photosensitive thin film is washed with the solvent and dried, in a process step S55. Thus, a conductive substrate 100 including the conductive coating film 20 having an interconnection pattern 29 may be fabricated. That is, since the non-exposed region 27 has a relatively higher solubility in the solvent than the exposed region 25, the photosensitive material and other compositions may be removed more in the non-exposed region 27 than in the exposed region 25.

In the conductive substrate 100 fabricated by the method according to the embodiment of the present invention, the conductive coating film 20 may not be directly etched. Further, the conductive coating film 20 having the interconnection pattern 29 capable of flowing currents by controlling an electrical conductivity of a specific region may be formed without damages and a chemical change of the conductive nanomaterial, which is a conductive filler of the conductive coating film 20.

The photosensitive thin film according to the third embodiment of the present invention may include the conductive nanomaterial, the nanoparticles, the photosensitive material, and the binder, and may further include other compositions, such as the dispersant and the additive.

As described above, in the conductive substrate 100 according to the third embodiment of the present invention, the conductive coating film 20 including the interconnection pattern 29 in which the electrical conductivity of the exposed region 25 is different from that of the non-exposed region 27 may be formed by forming the photosensitive thin film including the conductive nanomaterial, the nanoparticles, and the photosensitive material on the substrate 10, exposing the photosensitive thin film according to the shape of the interconnection pattern 29 to be formed, and washing the exposed photosensitive thin film.

That is, other compositions, such as the dispersant and the additive, as well as the conductive nanomaterial and the nanoparticles may be included in the photosensitive thin film. When the photosensitive thin film is exposed to light, physical or chemical bonds between the photosensitive materials or between the photosensitive material and the other compositions may be formed or broken, and thus a difference of solubility in a specific solvent such as water may be generated. When in contact with the solvent, a region where more of the photosensitive material and the other compositions are removed may have a higher electrical conductivity, and a region where less of the photosensitive material and the other compositions are removed may have a lower electrical conductivity. For example, when the photosensitive thin film is exposed and washed with the solvent, more of the photosensitive material and the other compositions may be removed in the non-exposed region 27 than in the exposed region 25. Accordingly, electrical conductivities of the exposed region 25 and the non-exposed region 27 may become sufficiently different from each other for a pattern for flowing currents to be formed.

According to the embodiment of the present invention, the interconnection pattern 29 flowing currents in a specific pattern using a difference in electrical conductivity in a local area of the conductive coating film 20 may be formed by a simple exposure process without directly etching the conductive coating film 20 including the conductive nanomaterial.

In addition, in the conductive substrate 100 according to the third embodiment of the present invention, although the conductive coating film 20 having a different electrical conductivity in the local area is formed by forming the interconnection pattern 29 using the exposure and washing process, the conductive nanomaterial corresponding to the conductive filler of the conductive coating film 20 is similarly distributed even in areas having different electrical conductivities, and uniformly distributed throughout the conductive coating film 20.

Further, according to the embodiment of the present invention, the conductive substrate 100 including the conductive nanomaterial, which is not chemically and physically etched, not chemically oxidized or sulfurized, and not physically damaged in a specific region of the conductive coating film 20, may be provided.

Further, in the conductive coating film 20 according to the embodiment of the present invention, since the conductive nanomaterial remains similarly in the exposed region 25 and the non-exposed region 27 even after the exposure and washing process, a phenomenon in which the interconnection pattern is shown may be prevented.

Further, since the conductive coating film 20 according to the embodiment of the present invention includes the nanoparticles, structural stability may be ensured compared to an exposed region 25 which does not include the nanoparticles. Thus, the conductive coating film 20 may provide insulation stability, reliability against an external impact, environmental changes, or the like, and further provide improved pattern accuracy, based on the structural stability in the insulating region.

Characteristics of the conductive coating film in the conductive substrate according to the third embodiment of the present invention will be described in the following specific experimental examples.

EXPERIMENTAL EXAMPLE 3-1

A conductive substrate according to the experimental example 3-1 of the present invention includes a PET film as a substrate, and silver nanowires as a conductive nanomaterial.

That is, in the experimental example 3-1 of the present invention, a pattern consisting of a high conductive region and a low conductive region is formed by coating the substrate with a silver nanowire coating solution including silver nanowires, a water-soluble photosensitive material, that is, photosensitive polyvinyl alcohol, and a water-dispersible polyurethane binder and performing an exposure and washing process. The silver nanowires have diameters of 20 to 40 nm and lengths of 10 to 30 μm. Here, the silver nanowire coating solution may include silver nanowires (0.15 wt %), photosensitive polyvinyl alcohol (0.6 wt %), which is a water-soluble photosensitive material, HPMC (0.2 wt %), which is a dispersant, and a water-dispersible polyurethane binder (0.01 wt %).

The substrate are coated with the aqueous silver nanowire dispersions by a bar coating method, and the coated substrate is dried at a temperature of 130° C. for 1 minute. The dried photosensitive thin film has a high sheet resistance exceeding a measurement limit of a sheet-resistance measuring instrument (10 MΩ/sq or more). The photosensitive thin film is irradiated with UV light for 3 seconds to form a specific pattern using a chrome photomask, post-baked at a temperature of 130° C. for 5 minutes, washed with water, the solvent, and dried. Accordingly, the conductive coating film according to the experimental example 3-1 of the present invention may be formed on the substrate.

Figure 24:
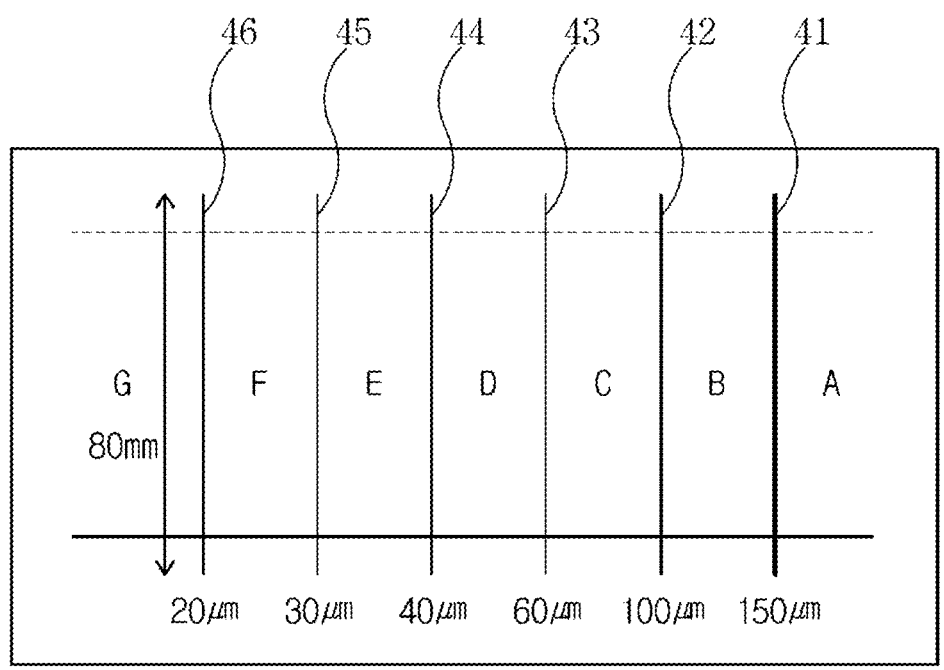
FIG. 24 is a diagram illustrating a pattern structure for testing insulating properties according to line widths of an interconnection pattern of a conductive coating film fabricated according to the experimental example 3-1 of the present invention.

An exposed region of the conductive coating film according to the experimental example 3-1 of the present invention includes straight lines having various line widths as illustrated in FIG. 24. Insulating characteristics according to the line widths of the exposed lines are examined. Here, FIG. 24 illustrates patterns for examining the insulating characteristics of the interconnection patterns according to the line widths in the conductive coating film fabricated according to the experimental example 3-1 of the present invention.

Referring to FIG. 24, the UV-exposed lines of the conductive coating film are slightly visible as semitransparent lines. However, when another polymer material is overcoated thereon or another film is attached thereto, the semitransparent lines of the exposed lines are invisible.

The exposed lines are straight line shapes having different line widths. A resistance of each of the exposed lines as boundary lines is measured. A first exposed line 41 formed between an area A and an area B has a line width of 150 μm. A second exposed line 42 formed between the area B and an area C has a line width of 100 μm. A third exposed line 43 formed between the area C and an area D has a line width of 60 μm. A fourth exposed line 44 formed between the area D and an area E has a line width of 40 μm. A fifth exposed line 45 formed between the area E and an area F has a line width of 30 μm. In addition, a sixth exposed line 46 formed between the area F and an area G has a line width of 20 μm. The first to sixth exposed lines have a length of 80 mm.

All the resistances of the first to fourth exposed lines 41 to 44 are 10 MΩ/sq or more, which are values exceeding the measurement limit of the resistance measuring instrument. That is, the first to fourth exposed lines 41 to 44 have a high level of insulation. The resistance of the fifth exposed line 45 is 20 to 30 kΩ, and the resistance of the sixth exposed line 46 is about 2 kΩ.

Each of the areas A to G is a non-exposed area in which the photosensitive material is washed and removed, and has a high electrical conductivity. The areas have sheet resistances of 120 to 150 Ω/sq, light transmittances of about 90%, and hazes of about 1.5.

Figure 25:
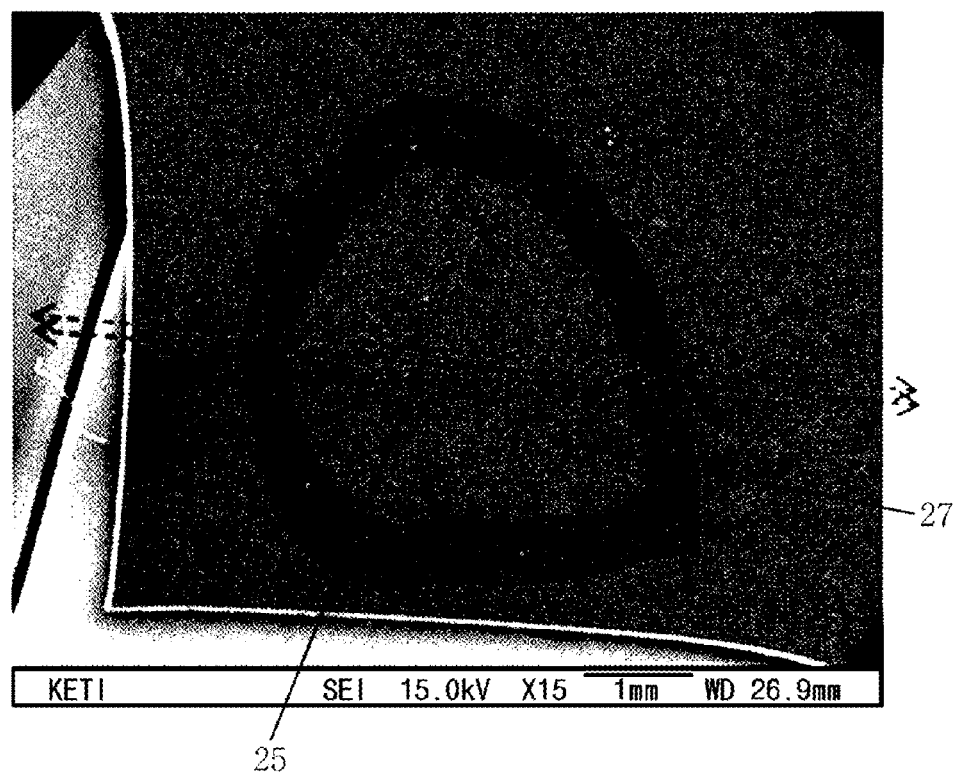
FIGS. 25 to 27 are photographs showing a conductive coating film fabricated according to the experimental example 3-1 of the present invention.
Figure 26:
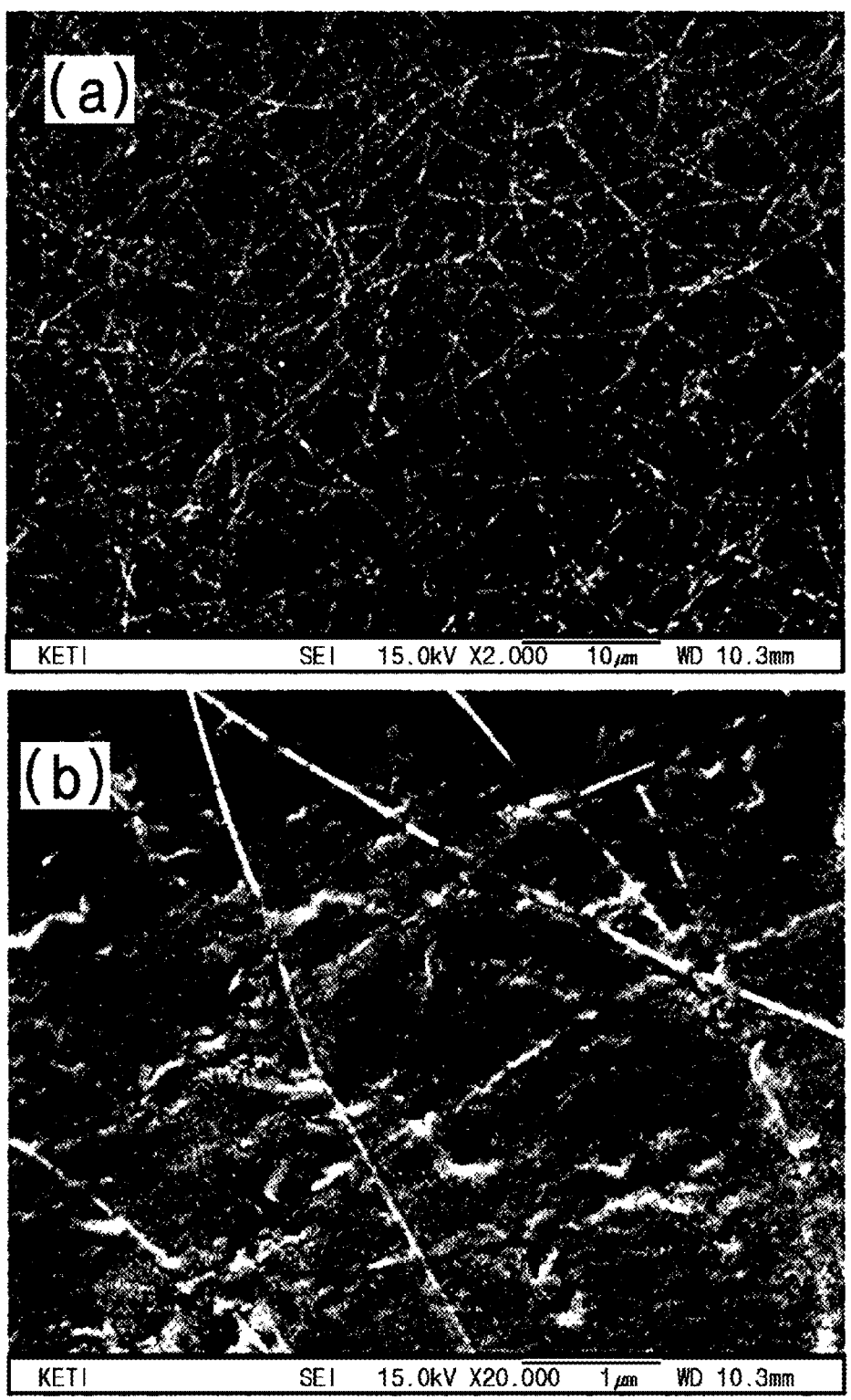
Figure 27:
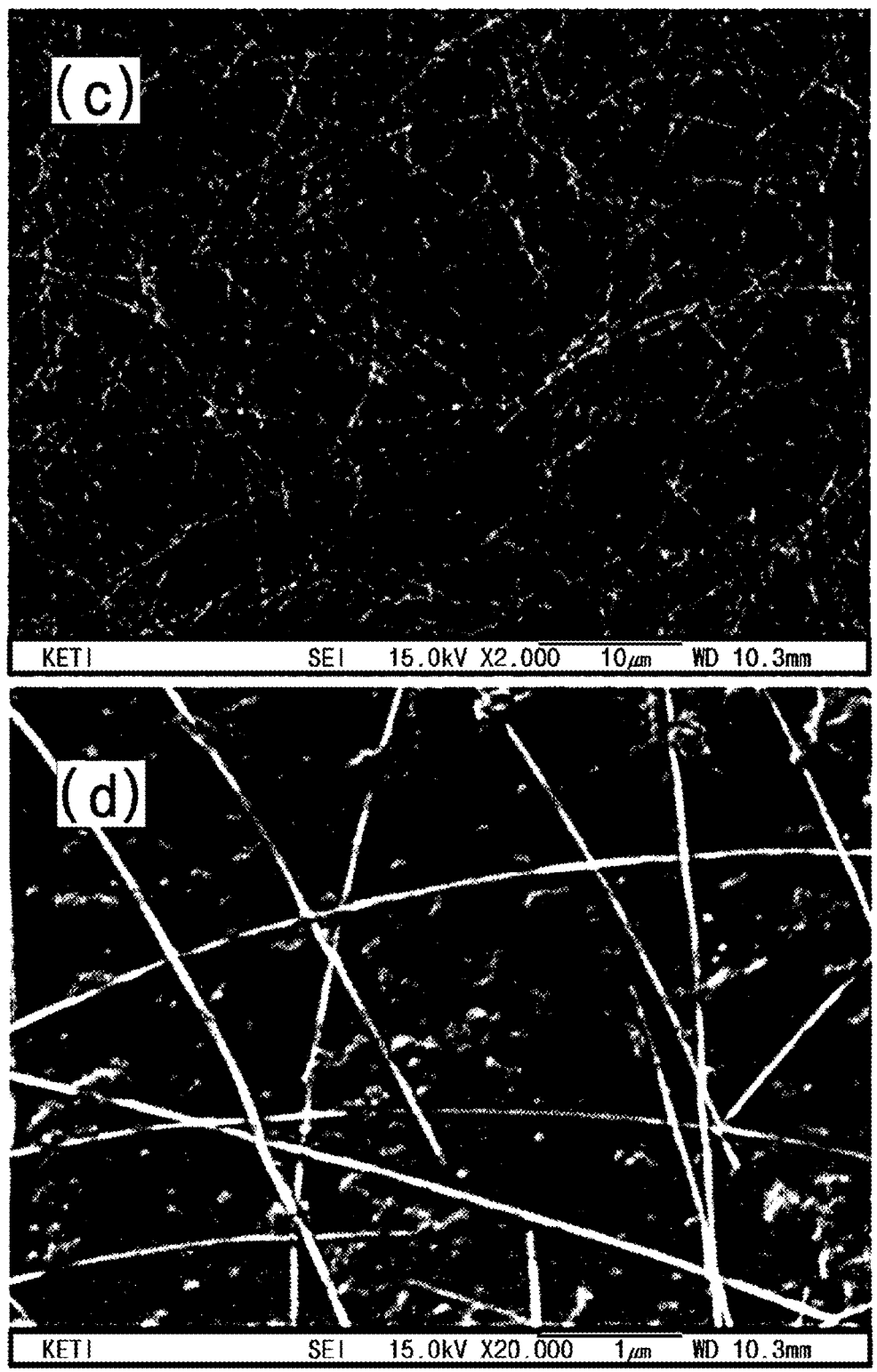

In order to examine surface morphology of the UV-exposed lines and a non-UV-exposed region, the UV-exposed lines and the non-UV-exposed region are observed with an electron microscope, as illustrated in FIGS. 25 to 27. Here, photographs of FIGS. 25 to 27 illustrate conductive coating films fabricated according to the experimental example 3-1 of the present invention.

As a result of the observation, the silver nanowires are distributed similarly in both of UV-exposed line images (a) and (b) in FIG. 26 and non-UV-exposed region images (c) and (d) in FIG. 27, and it is found that there is little damage in the silver nanowires due to the UV exposure.

However, in enlarged electron microscopic images (b) and (d), the silver nanowires are covered by the photosensitive material and the binder more in the UV-exposed line image (b) than in the non-UV-exposed region image (d). Further, since the UV-exposed line area (b) has poor contact characteristics between the silver nanowires, a resistance thereof may increase. In addition, in the images (b) and (d), polyurethanes, the binder, serve to attach the silver nanowires to the substrate, and thus prevent the silver nanowires from falling off during the washing process.

In addition, in order to ensure that there is no damage in the silver nanowires due to the UV exposure by measuring electrical characteristics, the conductive substrate according to the experimental example 3-1 of the present invention is exposed again to UV light in the same conditions for 5 seconds, and then sheet resistances of the areas A to G are measured again. Before the UV exposure, the areas A to G have the sheet resistances of 120 to 150 Ω/sq and the light transmittances of about 90%. After exposed to UV light for 5 seconds, the areas A to G have the sheet resistances of 120 to 150 Ω/sq and the light transmittances of about 90%, too.

Accordingly, it can be seen there is little damage in the silver nanowires due to the UV exposure for 5 seconds or less.

In order to ensure insulation stability of the exposed region, the conductive coating film according to the experimental example 3-1 of the present invention is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, and between the areas C and D are 10 MΩ/sq or more, which are values exceeding the measurement limit of the resistance measuring instrument. However, the resistance between the areas D and E is decreased by about 4.6 kΩ, and the resistances between the areas E and F and between the areas F and G are decreased by 1 kΩ or less. That is, since the photosensitive material and the conductive nanomaterial in the exposed region are rearranged and electrical connections therebetween are generated during the heat treatment, insulating characteristics may be a little degraded.

EXPERIMENTAL EXAMPLE 3-2

In the experimental example 3-2 of the present invention, the same pattern as that in the experimental example 3-1 is formed by coating a substrate with a coating solution including aqueous silver nanowire dispersions, photosensitive polyvinyl alcohol, which is a water-soluble photosensitive material, a water-dispersible polyurethane binder, and zinc oxide nanowires having a diameter of about 100 nm and a length of 1 to 5 μm as nanoparticles. Here, the coating solution may include the silver nanowires (0.15 wt %), the zinc oxide nanowires (0.1 wt %), photosensitive polyvinyl alcohol as the water-soluble photosensitive material (0.6 wt %), HPMC (0.2 wt %) as the dispersant, and the water-dispersible polyurethane binder (0.01 wt %).

As illustrated in FIG. 24, all the resistances between the areas A and B, between the areas B and C, between the areas C and D, and between the areas D and E are 10 MΩ/sq or more, which are values exceeding the measurement limit of the resistance measuring instrument. That is, the exposed lines have a high level of insulation. The resistance between the areas E and F is measured as about 36 kΩ, and the resistance between the areas F and G is measured as about 3 kΩ. That is, the areas A to and G are non-exposed regions in which the photosensitive material and other compositions are washed and removed, and have high electrical conductivities. These areas have sheet resistances of 120 to 150 Ω/sq, light transmittances of about 90%, and hazes of about 1.7.

In addition, in order to ensure insulation stability at high temperature, the conductive coating film, which has the same pattern as that illustrated in FIG. 24, according to the experimental example 3-2 of the present invention is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, between the areas C and D, and between the areas D and E are 10 MΩ/sq or more, which are values exceeding the measurement limit of the resistance measuring instrument. The resistance between the areas E and F is about 34 kΩ, and the resistance between the areas F and G is about 1 kΩ. That is, there is little changes in resistance.

Accordingly, since the exposed region of the conductive coating film according to the experimental example 3-2 of the present invention includes the nanoparticle such as the zinc oxide nanowires, it may have improved insulation stability compared to an exposed region of a conductive coating film which does not include the zinc oxide nanowires.

EXPERIMENTAL EXAMPLE 3-3

In the experimental example 3-2 of the present invention, a pattern consisting of a high conductive region and a low conductive region is formed using a carbon nanotube/silver nanowire photosensitive coating solution.

The carbon nanotube/silver nanowire photosensitive coating solution includes single-wall carbon nanotubes, silver nanowires having diameters of 20 to 40 nm and lengths of 10 to 30 μm, and a polyethylenimine binder. Here, the carbon nanotubes/aqueous silver nanowire dispersions include the carbon nanotubes of 0.1 wt %, the silver nanowires of 0.1 wt %, HPMC of 0.1 wt %, and photosensitive polyvinyl alcohol of 0.6 wt %, a water-soluble photosensitive material, and a polyethylenimine binder of 0.01 wt %.

A PET film is coated with the carbon nanotube/aqueous silver nanowire dispersions by a bar coating method, and the coated substrate is dried at a temperature of 130° C. for 1 minute. The dried photosensitive thin film has a high sheet resistance exceeding the measurement limit of the sheet-resistance measuring instrument (10 MΩ/sq or more). The photosensitive thin film is irradiated with UV light for 3 seconds to form a specific pattern using a chrome photomask, post-baked at a temperature of 130° C. for 5 minutes, washed with water, the solvent, and dried. Accordingly, the conductive coating film according to the experimental example 3-3 of the present invention may be formed on the substrate.

The exposed region of the conductive coating film according to the experimental example 3-3 of the present invention includes straight lines having various line widths as illustrated in FIG. 8. Insulating characteristics according to the line widths of the exposed lines are examined.

As a result, the UV-exposed lines of the conductive coating film are slightly visible as semitransparent lines. However, when the conductive coating film is over-coated with another polymer material or another film is attached to the conductive coating film, the semitransparent lines of the exposed lines are invisible.

All the resistances of the first to fourth exposed lines 41 to 44 are 10 MΩ/sq or more, which are values exceeding the measurement limit of the resistance measuring instrument. That is, the exposed lines have a high level of insulation. The resistance of the fifth exposed line 45 is measured as 30 to 50 kΩ, and the resistance of the sixth exposed line 46 is measured as about 3 kΩ.

Each of the areas A to G is a non-exposed area in which the photosensitive material is washed and removed, and has a high electrical conductivity. The areas have sheet resistances of 110 to 140 Ω/sq, light transmittances of about 89%, and hazes of about 1.3.

Figure 28:
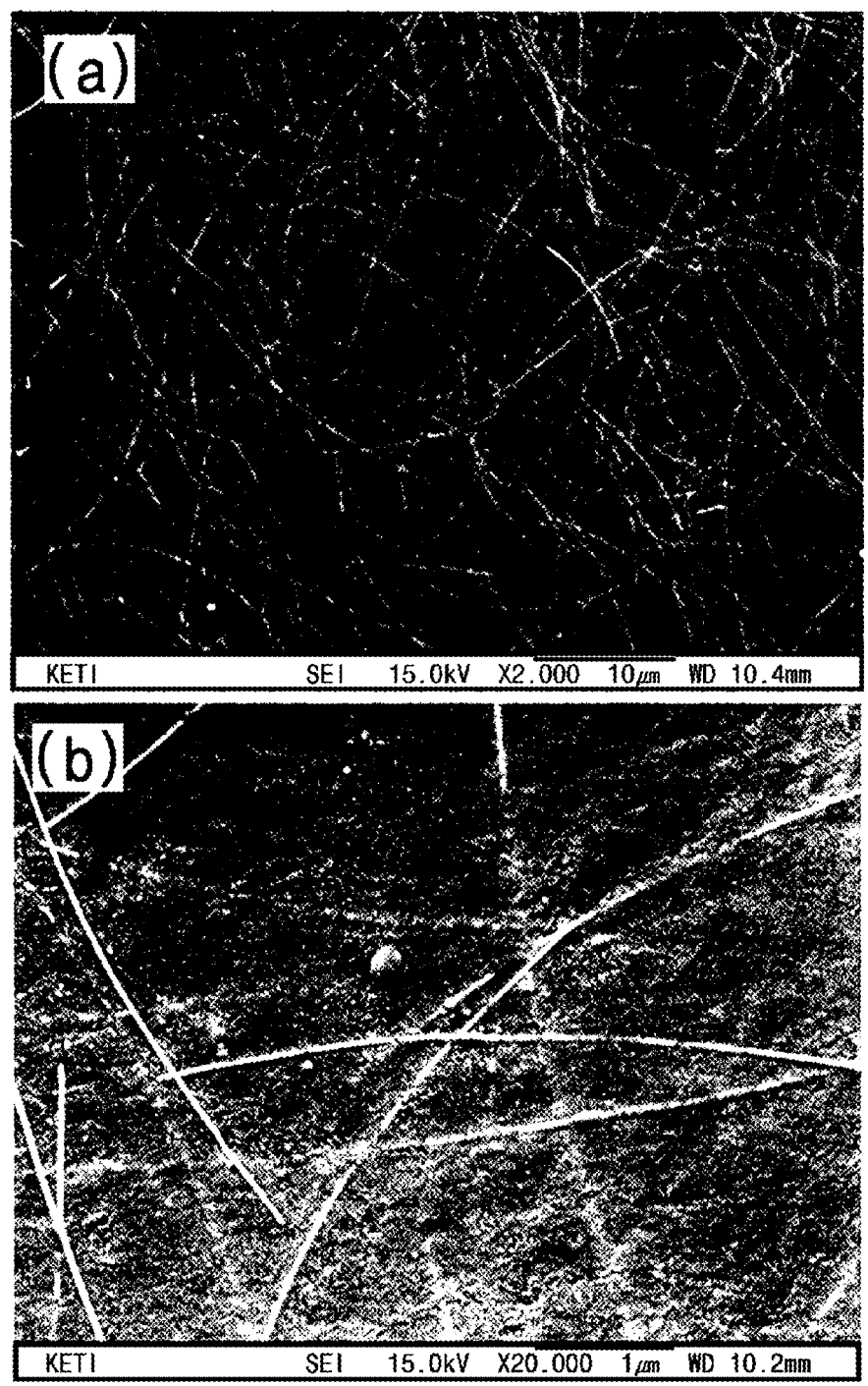
FIGS. 28 and 29 are photographs showing a conductive coating film fabricated according to the experimental example 3-3 of the present invention.
Figure 29:
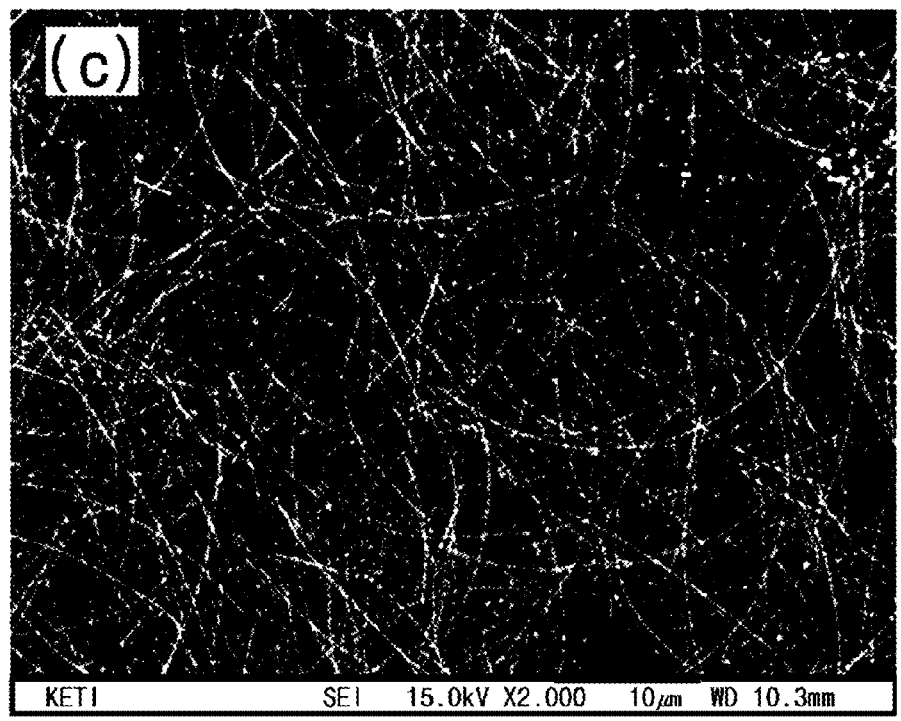
Figure 29:
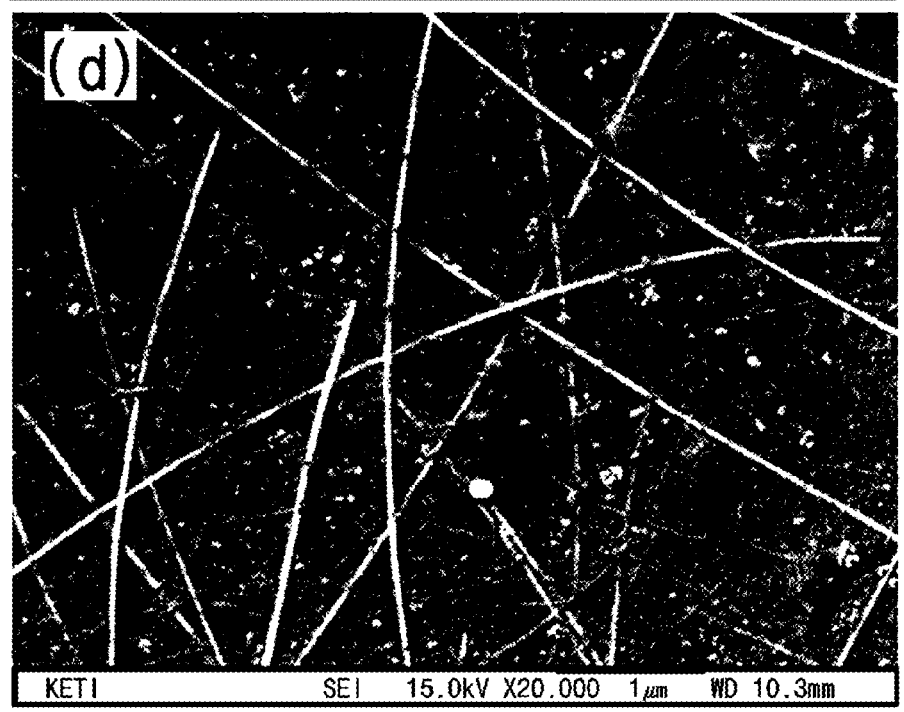

In order to examine surface morphology of the UV-exposed lines and a non-UV-exposed region, the UV-exposed lines and the non-UV-exposed region are observed with an electron microscope, as illustrated in FIGS. 28 and 29.

As a result of the observation, the silver nanowires are distributed similarly in both of UV-exposed line images (a) and (b) in FIG. 28 and non-UV-exposed region images (c) and (d) in FIG. 29, and it is found that there is little damage in the silver nanowires due to the UV exposure.

However, in enlarged electron microscopic images (b) and (d), the silver nanowires are covered by the photosensitive material and the binder more in the UV-exposed line image (b) than in the non-UV-exposed region image (d). Further, since the UV-exposed line area (b) has poor contact characteristics between the silver nanowires, a resistance thereof may increase. Although the carbon nanotubes are not clearly shown in the electronic microscopic images due to very small particle sizes thereof, the carbon nanotubes may be seen in the enlarged non-exposed region images (b) and (d). Although the carbon nanotubes are not clearly shown in the image (b) due to the photosensitive material the other compositions, they may be seen in some areas.

In addition, in order to ensure that there is no damage in the silver nanowires due to the UV exposure by measuring electrical characteristics, the conductive substrate according to the experimental example 3-3 of the present invention is exposed again to UV light in the same conditions for 5 seconds, and then sheet resistances of the areas A to G are measured again. Before the UV exposure, the areas A to G have the sheet resistances of 110 to 140 Ω/sq, the light transmittances of about 89%, and the hazes of about 1.3. After exposed to UV light for 5 seconds, the areas A to G have the sheet resistances of 110 to 135 Ω/sq and the light transmittances of about 89%, and the hazes of about 1.3. Accordingly, it can be seen there is little degradation in characteristics of the conductive coating film due to the UV exposure for 5 seconds or less.

In order to ensure the insulation stability of the exposed region, the conductive coating film, which has the same pattern as that illustrated in FIG. 24, according to the experimental example 3-3 of the present invention is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, and between the areas C and D are 10 MΩ/sq or more, which are values exceeding the measurement limit of the resistance measuring instrument. However, the resistance between the areas D and E is decreased by about 10 kΩ, and the resistances between the areas E and F and between the areas F and G are decreased by 3 kΩ or less. That is, since the photosensitive material and the conductive nanomaterial in the exposed region are rearranged and electrical connections therebetween are generated during the heat treatment at the temperature of 130° C., insulating characteristics may be a little degraded.

EXPERIMENTAL EXAMPLE 3-4

In the experimental example 3-4 of the present invention, the same pattern as that in the experimental example 3-1 is formed by coating a substrate with a coating solution including carbon nanotube/aqueous silver nanowire dispersions, photosensitive polyvinyl alcohol, which is a water-soluble photosensitive material, a polyethylenimine binder, and silicon oxide nanoparticles having particle sizes of 30 to 50 nm. Here, the coating solution may include the carbon nanotubes of 0.1 wt %, the silver nanowires of 0.1 wt %, the silicon oxide nanoparticles of 0.1 wt %, HPMC of 0.1 wt %, photosensitive polyvinyl alcohol of 0.6 wt %, which is the water-soluble photosensitive material, and the polyethylenimine binder of 0.01 wt %.

As illustrated in FIG. 24, all the resistances between the areas A and B, between the areas B and C, between the areas C and D, and between the areas D and E are 10 MΩ/sq or more, which are values exceeding the measurement limit of the resistance measuring instrument. That is, the exposed lines have a high level of insulation. The resistance between the areas E and F is measured as about 36 kΩ, and the resistance between the areas F and G is measured as about 3 kΩ. That is, the areas A to and G are the non-exposed regions in which the photosensitive material and other compositions are washed and removed, and have high electrical conductivities. These areas have sheet resistances of 120 to 150 Ω/sq, light transmittances of about 90%, and hazes of about 1.7.

Figure 30:
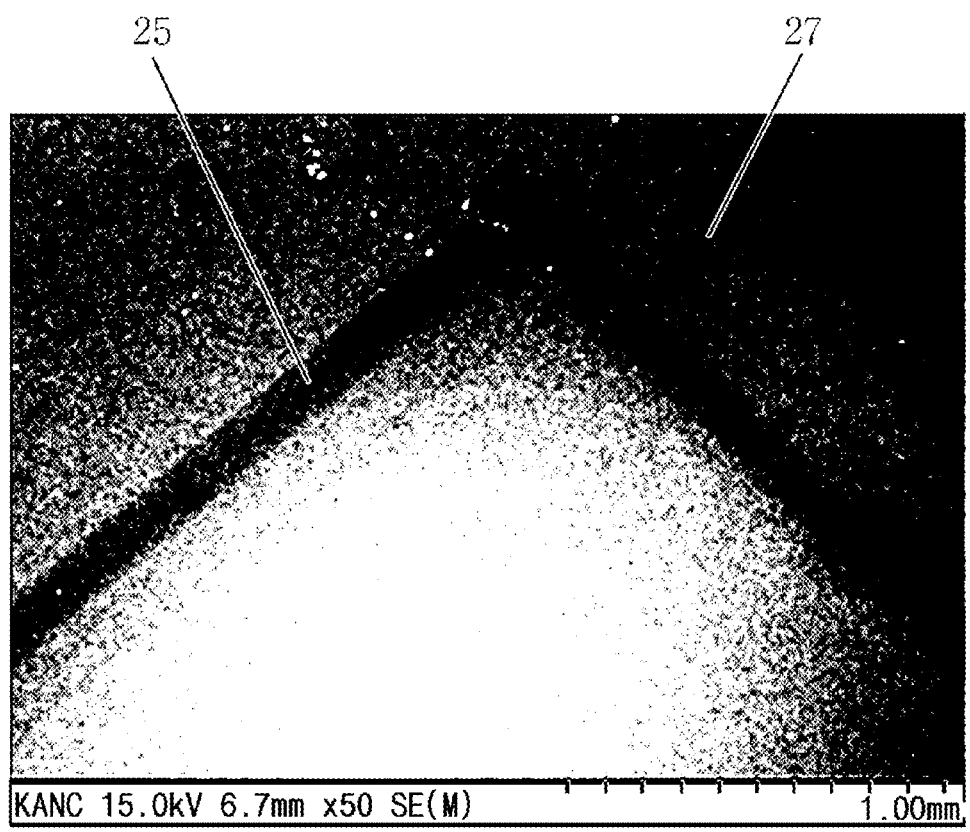
FIGS. 30 to 32 are photographs showing a conductive coating film fabricated according to the experimental example 3-4 of the present invention.
Figure 31:
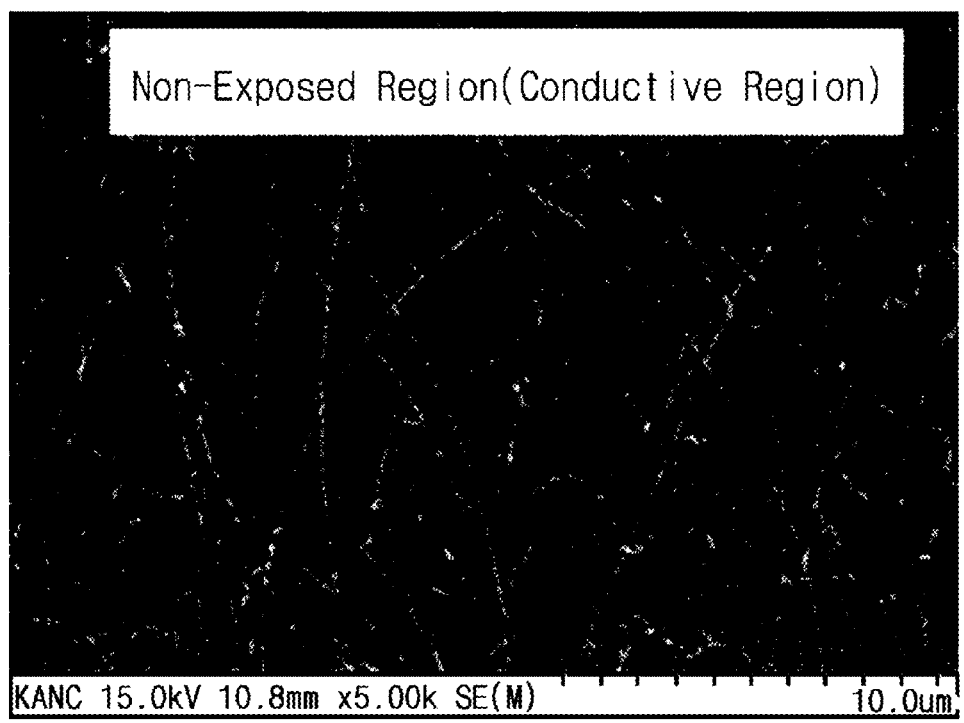
Figure 32:
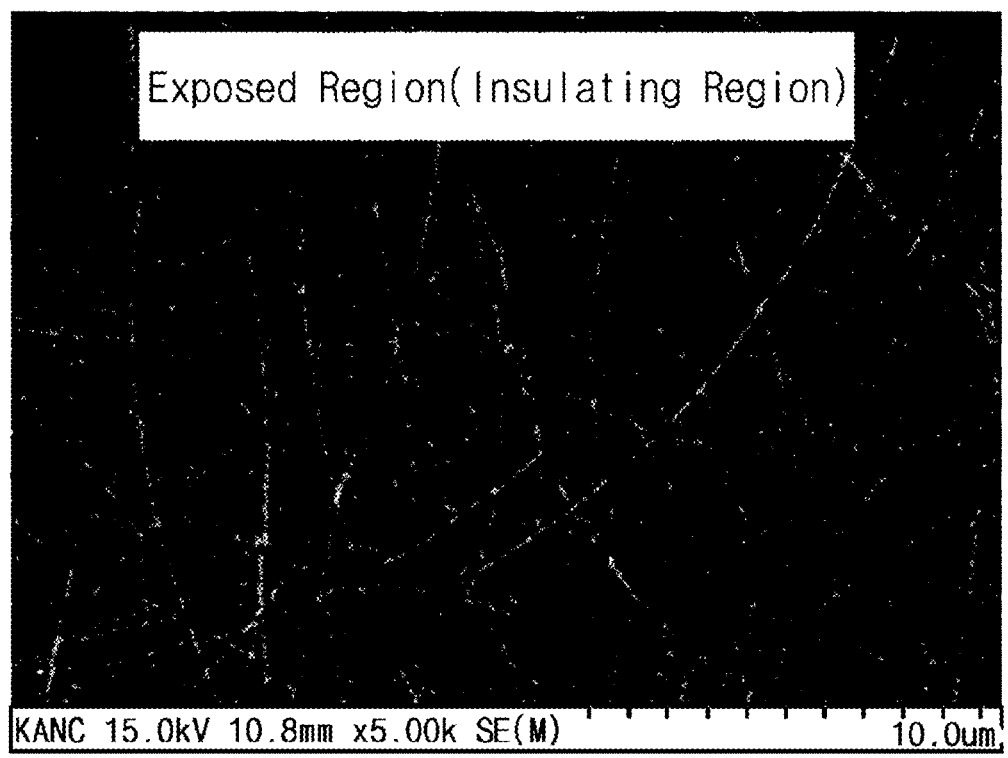

As illustrated in FIGS. 30 to 32, the conductive coating film (a transparent electrode film) including the silicon oxide nanoparticles is observed with SEM. In enlarged photographs of a non-exposed region 27 and an exposed region 25, the nanoparticles are washed out and not observed in the non-exposed region 27. However, a number of silicon oxide nanoparticles are observed in the exposed region 25. The nanoparticles 22 may reduce changes in shape and volume of the exposed region 25 against an external impact or a temperature variation. In addition, since the nanoparticles 22 are interposed between the metal nanowires or the carbon nanotubes, electrical connection of the metal nanowires or the carbon nanotubes may be prevented and the insulating characteristics may be maintained.

In addition, in order to ensure insulation stability at high temperature, the conductive coating film, which has the same pattern as that illustrated in FIG. 24, according to the experimental example 3-4 of the present invention is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, between the areas C and D, and between the areas D and E are 10 MΩ/sq or more, which are values exceeding the measurement limit of the resistance measuring instrument. The resistance between the areas E and F is 30 to 50 kΩ, and the resistance between the areas F and G is about 4 kΩ. That is, there is little changes in resistance.

Accordingly, since the exposed region of the conductive coating film according to the experimental example 3-4 of the present invention includes the silicon oxide nanoparticles, it may have improved insulation stability compared to an exposed region of a conductive coating film which does not include the silicon oxide nanoparticles.

[Fourth Embodiment]

A conductive substrate 100 according to the fourth embodiment of the present invention includes, as illustrated in FIGS. 1 and 2, a substrate 10 and a conductive coating film 20 for a transparent electrode, formed on the substrate 10, including a conductive nanomaterial 21, an interconnecting agent, a photosensitive material, and a binder, and having an interconnection pattern 29 formed by an exposure and washing process.

Here, the substrate 10, the conductive nanomaterial 21, the photosensitive material, and the binder materials described in the second embodiment of the present invention may be used as the substrate 10, the conductive nanomaterial 21, the photosensitive material, and the binder according to the fourth embodiment of the present invention.

In addition, the interconnecting agent, the conductive nanomaterial 21, the photosensitive material, and the binder may be included as the photosensitive coating composition to form the conductive coating film 20, and other compositions, such as a dispersant and an additive, may be further included. For example, the photosensitive coating composition may include the conductive nanomaterial 21 in an amount of 0.01 to 5 wt %, the interconnecting agent in an amount of 0.01 to 3 wt %, the photosensitive material in an amount of 0.01 to 3 wt %, and the binder in an amount of 1 wt % or less, and the water may occupy the rest. In addition, the photosensitive coating composition may further include the other compositions in an amount of 5 wt % or less.

As a concentration of the conductive nanomaterial 21 included in the photosensitive coating solution increases, the electrical conductivity of the conductive coating film 20 may be increased and the resistance of the conductive coating film 20 may be decreased. However, when the concentration of the conductive nanomaterial 21 is too high, that is, more than 5 wt %, it is difficult to disperse the conductive nanomaterial 21 in the solution. Accordingly, the conductive nanomaterial 21 of 0.1 to 5 wt % may be preferably used.

As a concentration of the interconnecting agent included in the photosensitive coating solution increases, the insulation stability of the conductive coating film 20 may increase. However, when the concentration of the interconnecting agent is too high, that is, more than 3 wt %, the electrical conductivity of the conductive coating film 20 may be decreased or the haze of the conductive coating film 20 may be increased since the interconnecting agent is not sufficiently removed from the non-exposed region 27 of the conductive coating film 20 during the washing process. On the contrary, when the concentration of the interconnecting agent is 0.01 wt % or less, the interconnecting agent may not affect the insulation stability of the conductive coating film 20. Accordingly, the interconnecting agent is preferably used in an amount of 0.01 to 0.3 wt %.

In addition, the photosensitive material is a material forming cross-links under UV exposure and has a low solubility in a solvent during the washing process after the exposure process. Accordingly, the photosensitive material may form a region having a relatively low electrical conductivity. A material exposed to radiation from one or more energy sources, such as light (infrared light, visible light, or ultraviolet light), heat, laser, or the like, is preferably used as the photosensitive material. However, the energy source may not be limited thereto.

The interconnecting agent may serve the coating solution and the conductive film compositions to form chemical bonds under UV exposure, or the photosensitive material included in the coating solution and the conductive coating film 20 to form additional chemical bonds. Accordingly, the interconnecting agent may harden the exposed region 25 and improve the hardness of the exposed region 25. Such an interconnecting agent may further improve thermal and mechanical stability of the conductive film composition in the exposed region 25.

The interconnecting agent may be an acid, a photo acid-generator, a thermal acid-generator, or a salt, and a chemical material which initiates a chemical reaction under UV exposure or heat.

Here, the acid may be hydrochloric acid, sulfuric acid, nitric acid, acetic acid, phosphoric acid, dodecylbenzene sulfonic acid, 2-carboxyethyl acrylate, or the like. Such an acid may additionally form chemical bonds in the photosensitive material including a hydroxyl group or a carboxyl group under heat. Such an acid may additionally improve insulation and thermal and mechanical stability of the insulating region when an additional heat treatment is executed on the conductive coating film 20 in which the interconnection pattern 29 flowing currents is formed by the exposure and washing process, to generate an additional chemical reaction in the photosensitive material of the exposed region 25. For example, when the acid is used as the interconnecting agent, the acid may be included as much as pH of the photosensitive coating composition is in the range of 3 to 6 although it depends on the acidity of the interconnecting agent.

The photo acid-generator is a material generating an acid using light such as UV light, and has been commercialized under various trade names. As a representative product of the photo acid-generator, Japanese Wako 320-21193 product, whose chemical name is "diphenyl-2,4,6-trimethylphenylsulfonium p-toluenesulfonate," may be used, and there are various other photo acid-generators. The photo acid-generator generates the acid when exposed to UV light. Accordingly, when the conductive coating film 20 is locally exposed to UV light to locally generate the acid, a chemical reaction may occur in the conductive film composition or an additional chemical reaction may occur in the photosensitive material. In particular, the photo acid-generator generates the chemical reaction in the conductive film composition and photosensitive material having a hydroxyl group or a carboxyl group. For example, when the photo acid-generator is used as the interconnecting agent, the photosensitive coating composition may include the photo acid-generator of 0.01 to 3 wt %, preferably 0.1 to 1 wt %.

The thermal acid-generator is a material which generates an acid under heat. The thermal acid-generator may not be specifically limited as long as it is a compound containing an alkali-soluble group and/or a sulfonic acid group as a functional group. As the thermal acid-generator, bis(4-t-butylphenyl)iodonium trifluoromethanesulfonate, triarylsulfonium hexafluoroantimonate, triarylsulfonium hexafluorophosphate, tetramethylammonium trifluoromethanesulfonate, triethylamnefluorosulfonate, or the like may be used. For example, when the thermal acid-generator is used as the interconnecting agent, the photosensitive coating composition may include the thermal acid-generator in an amount of 0.01 to 3 wt %, preferably 0.1 to 1 wt %.

As a salt, a dichromate, such as ammonium dichromate or sodium dichromate, may have a similar function to the photo acid-generator. The dichromate may induce a chemical reaction in the conductive film composition and photosensitive material having a hydroxyl group or a carboxyl group using UV light. Accordingly, when the conductive coating film 20 is locally exposed to UV light, a chemical reaction may be locally induced or an additional chemical reaction may occur in the photosensitive material. For example, when the dichromate is used as the interconnecting agent, the photosensitive coating composition may include the dichromate in an amount of 0.01 to 1 wt %, preferably 0.01 to 0.1 wt %.

The binder, the dispersant, and the additive described in the second embodiment of the present invention may be used as the binder, the dispersant, and the additive.

In addition, in order to further improve the conductivity and adhesion of the conductive coating film 20, the photosensitive coating solution may further include graphene, graphene oxide, carbon nanoplates, carbon black, or conductive polymers. For example, the photosensitive coating solution may further include graphene, graphene oxide, carbon nanoplates, carbon black, or conductive polymers in an amount of 0.01 to 3 wt %.

The conductive coating film 20 according to the fourth embodiment of the present invention includes the conductive nanomaterial 21 uniformly formed on the substrate 10. The conductive coating film 20 includes the exposed region 25 and the non-exposed region 27, wherein the non-exposed region 27 may be formed as the interconnection pattern 29. The electrical conductivity of the non-exposed region 27 may be twice that of the exposed region 25 or more.

In addition, the conductive coating film 20 may be formed as a single layer including the conductive nanomaterial 21, the photosensitive material, and the binder, or may have a structure in which a photosensitive material layer is formed on a conductive nanomaterial layer.

A difference in electrical conductivity between the exposed region 25 and the non-exposed region 27 in the conductive coating film 20 according to the fourth embodiment of the present invention occurs for the following reason. Before the conductive coating film 20 is formed, that is, before the UV exposure and washing process, the photosensitive thin film including the conductive nanomaterial 21, the photosensitive material, and the binder has a very low electrical conductivity due to the photosensitive material and the binder.

However, when the photosensitive thin film is exposed to UV light, physical or chemical bonds between the photosensitive materials or between the photosensitive material and other compositions may be formed or broken, and thus a difference of solubility in a specific solvent may be generated. However, there is little change in chemical and physical characteristics of the conductive nanomaterial 21 during the exposure process. Here, the specific solvent may be a solvent having a high solubility selectively in the photosensitive material. For example, when a water-soluble photosensitive material is used as the photosensitive material, the water-soluble photosensitive material may have a different solubility in water.

That is, the photosensitive material may have a high solubility in the specific solvent before the exposure process, but have a low solubility in the specific solvent when it is exposed and cured. According to the embodiment of the present invention, the interconnection pattern 29 may be formed using the different solubility of the photosensitive material in the specific solvent.

Accordingly, the exposed region 25 and the non-exposed region 27 of the photosensitive thin film may have different solubilities in the specific solvent. In particular, when the photosensitive thin film includes a large amount of other compositions, the difference in electrical conductivity between the two regions becomes sufficiently large for patterns of a transparent electrode and a circuit electrode to be formed. Normally, when in contact with the solvent, a region where more of the photosensitive material and other compositions are removed may have a higher electrical conductivity, and a region where less of the photosensitive material and other compositions are removed may have a lower electrical conductivity.

For example, when the non-exposed region 27 has a higher solubility in the solvent than the exposed region 25, the non-exposed region 27 may be formed as the interconnection pattern 29.

Meanwhile, when only the metal nanowires or the carbon nanotubes are used as the conductive nanomaterial to form the conductive coating film, the insulation stability of the exposed region 25 having a low electrical conductivity may be degraded more or less. That is, the insulation of the exposed region 25 may be a little degraded, since the metal nanowires or the carbon nanotubes having a high electrical conductivity remain in the exposed region 25 and thus the conductive nanomaterials 21 are connected to each other due to volume changes occurring when an external impact is applied or a temperature is varied.

In order to compensate for this, the interconnecting agent may be added to the coating solution to improve mechanical and chemical stability of the insulating area formed under exposure.

Since the interconnecting agent of the non-exposed region 27 are sufficiently washed and removed together with the photosensitive material and other compositions during the washing process, the electrical conductivity of the non-exposed region 27 may not be affected thereby.

In addition, according to the fourth embodiment of the present invention, the non-exposed region 27 is described as having a higher solubility than the exposed region 25. However, opposite characteristics thereto may be shown depending on the type of the photosensitive material. That is, when the exposed region 25 has a higher solubility than the non-exposed region 27, the exposed region 25 may be formed as the interconnection pattern 29.

Widths of the exposed region 25 and the non-exposed region 27 forming the conductive coating film 20 may be 1 μm or more, and a shape of the interconnection pattern 29 may be determined according to the exposure process. Normally, the shape of the interconnection pattern 29 may be determined according to a shape of a mask used in the exposure process.

In addition, the coating solution may include the binder, which may serve to fix the metal nanowires or the carbon nanotubes not to be removed during the washing process. Further, the additive or the like may be included to improve coatability, environmental endurance, adhesion, and anticorrosion.

Figure 33:
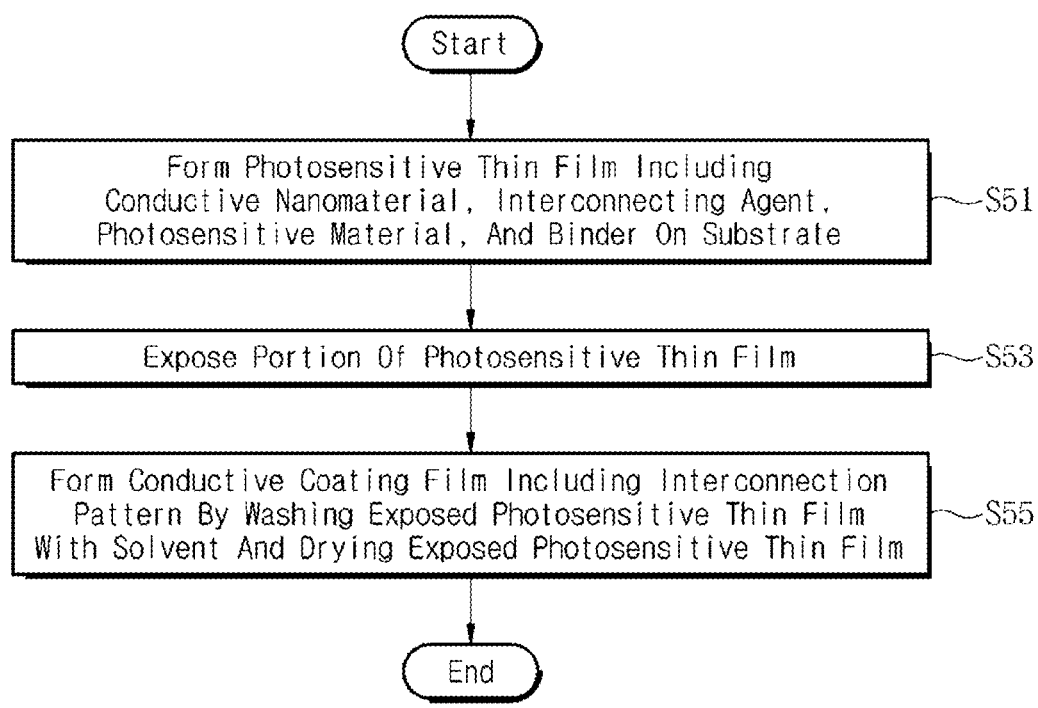
FIG. 33 is a flowchart illustrating a method of fabricating a conductive coating film including an interconnection agent according to a fourth embodiment of the present invention.

A method of fabricating the conductive coating film 20 according to the fourth embodiment will be described with reference to FIGS. 1, 2, 4 to 7, and 33. Here, FIG. 33 is a flowchart of a method of fabricating the conductive coating film 20 including the nanoparticles, according to the fourth embodiment of the present invention.

First, as illustrated in FIG. 4, a substrate 10 for forming a conductive coating film 10 is prepared.

Next, as illustrated in FIG. 5, a photosensitive thin film 23 including a conductive nanomaterial, an interconnecting agent, a photosensitive material, and a binder is formed on the substrate 10, in a process step S51. That is, the photosensitive thin film 23 is formed by coating the substrate 10 with the photosensitive coating composition according to the embodiment of the present invention. Here, the photosensitive coating composition may include the conductive nanomaterial, the interconnecting agent, the photosensitive material, the binder, and water, and further include other compositions. For example, the photosensitive coating composition may include the conductive nanomaterial in an amount of 0.01 to 5 wt %, the interconnecting agent in an amount of 0.01 to 3 wt %, the photosensitive material in an amount of 0.01 to 3 wt %, the binder in an amount of 1 wt % or less, and other compositions in an amount of 5 wt % or less, and the water may occupy the rest.

Meanwhile, the photosensitive thin film 23 may be formed as a single layer including the conductive nanomaterial, the interconnecting agent, the photosensitive material, and the binder, or may have a structure in which a photosensitive material layer is formed on a conductive nanomaterial layer. When the photosensitive thin film 23 is the single layer as described in the former, the photosensitive thin film 23 may further include other compositions, such as the dispersant and the additive. When the photosensitive thin film 23 has the structure described in the latter, the other compositions, such as the dispersant and the additive, may be included in the conductive nanomaterial layer.

Next, as illustrated in FIG. 6, portions of the photosensitive thin film 23 are exposed in a process step S53. That is, the photosensitive thin film 23 is exposed to UV light using a mask 30 in which a pattern hole 31 corresponding to a region to be exposed is formed.

During the exposure process, the UV exposure time may be normally several minutes, preferably several seconds. During the exposure process, there is little change in chemical and physical characteristics of the conductive nanomaterial during the exposure process.

Next, as illustrated in FIG. 7, the exposed photosensitive thin film is washed with the solvent and dried, in a process step S55. Thus, a conductive substrate 100 including the conductive coating film 20 having an interconnection pattern 29 may be fabricated. That is, since the non-exposed region 27 has a relatively higher solubility in the solvent than the exposed region 25, more of the photosensitive material and other compositions may be removed in the non-exposed region 27 than in the exposed region 25.

In the conductive substrate 100 fabricated by the method according to the embodiment of the present invention, the conductive coating film 20 may not be directly etched. Further, the conductive coating film 20 having the interconnection pattern 29 capable of flowing currents by controlling an electrical conductivity of a specific region may be formed without damage and a chemical change of the conductive nanomaterial, which is a conductive filler of the conductive coating film 20.

The photosensitive thin film according to the embodiment of the present invention may include the conductive nanomaterial, the interconnecting agent, the photosensitive material, and the binder, and may further include other compositions, such as the dispersant and the additive.

As described above, in the conductive substrate 100 according to the fourth embodiment of the present invention, the conductive coating film 20 including the interconnection pattern 29 in which the electrical conductivity of the exposed region 25 is different from that of the non-exposed region 27 may be formed by forming the photosensitive thin film including the conductive nanomaterial, the interconnecting agent, and the photosensitive material on the substrate 10, exposing the photosensitive thin film according to the shape of the interconnection pattern 29 to be formed, and washing the exposed photosensitive thin film.

That is, other compositions, such as the dispersant and the additive, as well as the conductive nanomaterial and the interconnecting agent may be included in the photosensitive thin film. When the photosensitive thin film is exposed to light, physical or chemical bonds between the photosensitive materials or between the photosensitive material and the other compositions may be formed or broken, and thus a difference of solubility in a specific solvent such as water may be generated. When in contact with the solvent, a region where more of the photosensitive material and the other compositions are removed may have a higher electrical conductivity, and a region where less of the photosensitive material and the other compositions are removed may have a lower electrical conductivity. For example, when the photosensitive thin film is exposed and washed with the solvent, more of the photosensitive material and the other compositions may be removed in the non-exposed region 27 than in the exposed region 25. Accordingly, electrical conductivities of the exposed region 25 and the non-exposed region 27 may become sufficiently different from each other for a pattern for flowing currents to be formed.

According to the embodiment of the present invention, the interconnection pattern 29 flowing currents in a specific pattern using a difference in electrical conductivity in a local area of the conductive coating film 20 may be formed by a simple exposure process without directly etching the conductive coating film 20 including the conductive nanomaterial.

In addition, in the conductive substrate 100 according to the fourth embodiment of the present invention, although the conductive coating film 20 having a different electrical conductivity in the local area is formed by forming the interconnection pattern 29 using the exposure and washing process, the conductive nanomaterial corresponding to the conductive filler of the conductive coating film 20 is similarly distributed even in areas having different electrical conductivities, and uniformly distributed throughout the conductive coating film 20.

Further, according to the fourth embodiment of the present invention, the conductive substrate 100 including the conductive nanomaterial, which is not chemically and physically etched, not chemically oxidized or sulfurized, and not physically damaged in a specific region of the conductive coating film 20, may be provided.

Further, in the conductive coating film 20 according to the fourth embodiment of the present invention, since the conductive nanomaterial remains similarly in the exposed region 25 and the non-exposed region 27 even after the exposure and washing process, a phenomenon in which the interconnection pattern is shown may be prevented.

Further, since the conductive coating film 20 according to the fourth embodiment of the present invention includes the interconnecting agent, structural stability may be ensured compared to an exposed region 25 that does not include the interconnecting agents. Thus, the conductive coating film 20 may provide insulation stability, reliability against an external impact, environmental changes, or the like, and further provide improved pattern accuracy, based on the structural stability in the insulating region.

Characteristics of the conductive coating film in the conductive substrate according to the fourth embodiment of the present invention will be described in the following specific experimental examples.

EXPERIMENTAL EXAMPLE 4-1

A conductive substrate according to the experimental example 4-1 of the present invention includes a PET film as a substrate, and silver nanowires as a conductive nanomaterial.

That is, according to the experimental example 4-1 of the present invention, a pattern consisting of a high conductive region and a low conductive region is formed by coating the substrate with a silver nanowire coating solution including silver nanowires, photosensitive polyvinyl alcohol, which is a water-soluble photosensitive material, and a water-dispersible polyurethane binder. The silver nanowires have diameters of 20 to 40 nm and lengths of 10 to 30 µm. Here, the silver nanowire coating solution includes the silver nanowires in an amount of 0.15 wt %, the photosensitive polyvinyl alcohol in an amount of 0.6 wt %, which is the water-soluble photosensitive material, HPMC in an amount of 0.2 wt %, which is a dispersant, and the water-dispersible polyurethane binder in an amount of 0.01 wt %.

The PET film is coated with the aqueous silver nanowire dispersions by a bar coating method, and the coated substrate is dried at a temperature of 130° C. for 1 minute. The dried photosensitive thin film has a high sheet resistance exceeding the measurement limit of the sheet-resistance measuring instrument (10 MΩ/sq or more). The photosensitive thin film is irradiated with UV light for 3 seconds to form a specific pattern using a chrome photomask, post-baked at a temperature of 130° C. for 5 minutes, washed with water, the solvent, and dried. Accordingly, the conductive coating film according to the experimental example 4-1 of the present invention may be formed on the substrate.

The exposed region of the conductive coating film according to the experimental example 4-1 of the present invention includes straight lines having various line widths as illustrated in FIG. 24. Insulating characteristics according to the line widths of the exposed lines are examined.

The UV-exposed lines of the conductive coating film are slightly visible as semitransparent lines. However, when the conductive coating film is over-coated with another polymer material or another film is attached to the conductive coating film, the semitransparent lines of the exposed lines are invisible.

The exposed lines are straight line shapes having different line widths. A resistance of each of the exposed lines as boundary lines is measured. A first exposed line 41 formed between an area A and an area B has a line width of 150 µm. A second exposed line 42 formed between the area B and an area C has a line width of 100 µm. A third exposed line 43 formed between the area C and an area D has a line width of 60 µm. A fourth exposed line 44 formed between the area D and an area E has a line width of 40 µm. A fifth exposed line 45 formed between the area E and an area F has a line width of 30 µm. In addition, a sixth exposed line 46 formed between the area F and an area G has a line width of 20 µm. The first to sixth exposed lines have a length of 80 mm.

All the resistances of the first to fourth exposed lines 41 to 44 are 10 MΩ/sq or more, which are values exceeding the measurement limit of the resistance measuring instrument. That is, the first to fourth exposed lines 41 to 44 have a high level of insulation. The resistance of the fifth exposed line 45 is 20 to 30 kΩ, and the resistance of the sixth exposed line 46 is about 2 kΩ.

Each of the areas A to G is a non-exposed area in which the photosensitive material is washed and removed, and has a high electrical conductivity. The areas have sheet resistances of 120 to 150 Ω/sq, light transmittances of about 90%, and hazes of about 1.5.

In addition, in order to ensure that there is no damage in the silver nanowires due to the UV exposure by measuring electrical characteristics, the conductive substrate according to the experimental example 4-1 of the present invention is exposed again to UV light in the same conditions for 5 seconds, and then sheet resistances of the areas A to G are measured again. Before the UV exposure, the areas A to G have the sheet resistances of 120 to 150 Ω/sq and the light transmittances of about 90%. After exposed to UV light for 5 seconds, the areas A to G have the sheet resistances of 120 to 150 Ω/sq and the light transmittances of about 90%. Accordingly, it can be seen there is little degradation in characteristics of the silver nanowires due to the UV exposure for 5 seconds or less.

Further, in order to ensure insulation stability of the exposed region, the conductive coating film according to the experimental example 4-1 of the present invention is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, and between the areas C and D are 10 MΩ/sq or more, which are values exceeding the measurement limit of the resistance measuring instrument. However, the resistance between the areas D and E is decreased by about 4.6 kΩ, and the resistances between the areas E and F and between the areas F and G are decreased by 1 kΩ or less. That is, since the photosensitive material and the conductive nanomaterial in the exposed region are rearranged and electrical connections therebetween are generated during the heat treatment at the temperature of 130° C., insulating characteristics may be a little degraded.

EXPERIMENTAL EXAMPLE 4-2

In the experimental example 4-2 of the present invention, the same pattern as that in the experimental example 4-1 is formed by coating a substrate with a coating solution including ammonium dichromate corresponding to an interconnecting agent, in addition to the aqueous silver nanowire dispersions, the photosensitive polyvinyl alcohol, which is the water-soluble photosensitive material, and the water-dispersible polyurethane binder according to the experimental example 4-1 of the present invention. Here, the coating solution may include the silver nanowires (0.15 wt %), ammonium dichromate (0.1 wt %), photosensitive polyvinyl alcohol (0.6 wt %) as the water-soluble photosensitive material, HPMC (0.2 wt %) as the dispersant, and the water-dispersible polyurethane binder (0.01 wt %).

As illustrated in FIG. 24, all the resistances between the areas A and B, between the areas B and C, between the areas C and D, and between the areas D and E are 10 MΩ/sq or more, which are values exceeding the measurement limit of the resistance measuring instrument. That is, the exposed lines have a high level of insulation. The resistance between the areas E and F is measured as about 36 kΩ, and the resistance between the areas F and G is measured as about 3 kΩ. That is, the areas A to and G are the non-exposed regions in which the photosensitive material and other compositions are washed and removed, and have high electrical conductivities. These areas have sheet resistances of 120 to 150 Ω/sq, light transmittances of about 90%, and hazes of about 1.7.

In addition, in order to ensure that there is no damage in the silver nanowires due to the UV exposure by measuring electrical characteristics, the conductive substrate according to the experimental example 4-2 of the present invention is exposed again to UV light in the same conditions for 5 seconds, and then sheet resistances of the areas A to G are measured again. Before the UV exposure, the areas A to G have the sheet resistances of 120 to 150 Ω/sq, the light transmittances of about 90%, and hazes of about 1.7. After exposed to UV light for 5 seconds, the areas A to G have the sheet resistances of 120 to 150 Ω/sq, the light transmittances of about 90%, and hazes of about 1.7. Accordingly, it can be seen there is little degradation in characteristics of the silver nanowires due to the UV exposure for 5 seconds or less.

Further, in order to ensure insulation stability at high temperature, the conductive coating film according to the experimental example 4-2 of the present invention is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, between the areas C and D, and between the areas D and E are 10 MΩ/sq or more, which are values exceeding the measurement limit of the resistance measuring instrument. The resistance between the areas E and F is about 57 kΩ, and the resistance between the areas F and G is about 3 kΩ. That is, there is little change in resistance.

Accordingly, since the exposed region of the conductive coating film according to the experimental example 4-2 of the present invention includes the interconnecting agent such as ammonium dichromate, it may have improved insulation stability compared to an exposed region of a conductive coating film that does not include ammonium dichromate.

EXPERIMENTAL EXAMPLE 4-3

According to the experimental example 4-3 of the present invention, a pattern including a high conductive region and a low conductive region is formed using a carbon nanotube/silver nanowire photosensitive coating solution.

The carbon nanotube/silver nanowire photosensitive coating solution includes single-wall carbon nanotubes, silver nanowires having diameters of 20 to 40 nm and lengths of 10 to 30 μm, and a polyethylenimine binder. Here, the carbon nanotube/aqueous silver nanowire dispersions may include the carbon nanotubes in an amount of 0.1 wt %, the silver nanowires in an amount of 0.1 wt %, HPMC in an amount of 0.1 wt %, photosensitive polyvinyl alcohol in an amount of 0.6 wt %, which is the water-soluble photosensitive material, and the polyethylenimine binder in an amount of 0.01 wt %.

The carbon nanotube/aqueous silver nanowire dispersions include the single-wall carbon nanotubes, the silver nanowires having diameters of 20 to 40 nm and lengths of 10 to 30 μm, and the polyethylenimine binder. The PET film is coated with the carbon nanotube/aqueous silver nanowire dispersions by a bar coating method, and the coated substrate is dried at a temperature of 130° C. for 1 minute. The dried photosensitive thin film has a high sheet resistance exceeding the measurement limit of the sheet-resistance measuring instrument (10 MΩ/sq or more). The photosensitive thin film is irradiated with UV light for 3 seconds to form a specific pattern using a chrome photomask, post-baked at a temperature of 130° C. for 5 minutes, washed with water, the solvent, and dried. Accordingly, the conductive coating film according to the experimental example 4-3 of the present invention may be formed on the substrate.

The exposed region of the conductive coating film according to the experimental example 4-3 of the present invention includes straight lines having various line widths as illustrated in FIG. 8. Insulating characteristics according to the line widths of the exposed lines are examined.

As a result, the UV-exposed lines of the conductive coating film are slightly visible as semitransparent lines. However, when the conductive coating film is over-coated with another polymer material or another film is attached to the conductive coating film, the semitransparent lines of the exposed lines are invisible.

All the resistances of the first to fourth exposed lines 41 to 44 are 10 MΩ/sq or more, which are values exceeding the measurement limit of the resistance measuring instrument. That is, the exposed lines have a high level of insulation. The resistance of the fifth exposed line 45 is measured as 30 to 50 kΩ, and the resistance of the sixth exposed line 46 is measured as about 3 kΩ.

Each of the areas A to G is a non-exposed area in which the photosensitive material is washed and removed, and has a high electrical conductivity. The areas have sheet resistances of 110 to 140 Ω/sq, light transmittances of about 89%, and hazes of about 1.3.

In addition, in order to ensure that there is no damage in the silver nanowires due to the UV exposure by measuring electrical characteristics, the conductive substrate according to the experimental example 4-3 of the present invention is exposed again to UV light in the same conditions for 5 seconds, and then sheet resistances of the areas A to G are measured again. Before the UV exposure, the areas A to G have the sheet resistances of 110 to 140 Ω/sq, the light transmittances of about 89%, and hazes of about 1.3. After exposed to UV light for 5 seconds, the areas A to G have the sheet resistances of 110 to 135 Ω/sq, the light transmittances of about 89%, and hazes of about 1.3. Accordingly, it can be seen there is little degradation in characteristics of the silver nanowires due to the UV exposure for 5 seconds or less.

Further, in order to ensure insulation stability of the exposed region, the conductive coating film according to the experimental example 4-3 of the present invention, which has straight lines as illustrated in FIG. 8, is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, and between the areas C and D are 10 MΩ/sq or more, which are values exceeding the measurement limit of the resistance measuring instrument. However, the resistance between the areas D and E is decreased by about 10 kΩ, and the resistances between the areas E and F and between the areas F and G are decreased by 3 kΩ or less. That is, since the photosensitive material and the conductive nanomaterial in the exposed region are rearranged and electrical connections therebetween are generated during the heat treatment at the temperature of 130° C., insulating characteristics may be a little degraded.

EXPERIMENTAL EXAMPLE 4-4

In the experimental example 4-4 of the present invention, the same pattern as that in the experimental example 4-3 is formed by coating a substrate with a coating solution including carboxyethyl acrylate corresponding to an interconnecting agent, in addition to the carbon nanotube/aqueous silver nanowire dispersions, the photosensitive polyvinyl alcohol, which is the water-soluble photosensitive material, and the polyethylenimine binder according to the experimental example 4-3 of the present invention. Here, the coating solution may include the carbon nanotubes in an amount of 0.1 wt %, the silver nanowires in an amount of 0.1 wt %, carboxyethyl acrylate in an amount of 0.1 wt %, HPMC in an amount of 0.1 wt %, photosensitive polyvinyl alcohol in an amount of 0.6 wt % as the water-soluble photosensitive material, and the polyethylenimine binder in an amount of 0.01 wt %.

As illustrated in FIG. 24, all the resistances between the areas A and B, between the areas B and C, between the areas C and D, and between the areas D and E are 10 MΩ/sq or more, which are values exceeding the measurement limit of the resistance measuring instrument. That is, the exposed lines have a high level of insulation. The resistance between the areas E and F is measured as about 55 kΩ, and the resistance between the areas F and G is measured as about 6 kΩ. That is, the areas A to and G are the non-exposed regions in which the photosensitive material and other compositions are washed and removed, and have high electrical conductivities. These areas have sheet resistances of about 130 Ω/sq, light transmittances of about 89.5%, and hazes of about 1.6.

In addition, in order to ensure that there is no damage in the silver nanowires due to the UV exposure by measuring electrical characteristics, the conductive substrate according to the experimental example 4-4 of the present invention is exposed again to UV light in the same conditions for 5 seconds, and then sheet resistances of the areas A to G are measured again. Before the UV exposure, the areas A to G have the sheet resistances of 130 Ω/sq, the light transmittances of about 89.5%, and hazes of about 1.6. After exposed to UV light for 5 seconds, the areas A to G have the sheet resistances of 110 to 140 Ω/sq, the light transmittances of about 89.4%, and hazes of about 1.6. Accordingly, it can be seen there is little degradation in characteristics of the silver nanowires due to the UV exposure for 5 seconds or less.

Further, in order to ensure insulation stability at high temperature, the conductive coating film according to the experimental example 4-4 of the present invention is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, between the areas C and D, and between the areas D and E are 10 MΩ/sq or more, which are values exceeding the measurement limit of the resistance measuring instrument. The resistance between the areas E and F is about 32 kΩ, and the resistance between the areas F and G is about 2 kΩ. That is, there is little change in resistance.

Accordingly, since the exposed region of the conductive coating film according to the experimental example 4-4 of the present invention includes carboxyethyl acrylate, it may have improved insulation stability compared to an exposed region of a conductive coating film that does not include carboxyethyl acrylate.

[Fifth Embodiment]

A conductive coating film according to the fifth embodiment of the present invention includes, as illustrated in FIGS. 1 and 2, a substrate 10 is coated with coating solution compositions including a conductive nanomaterial 21, a UV photosensitive material, a binder, and a solvent, and an interconnection pattern 29 is formed by an exposure and washing process.

Here, the substrate 10 and the conductive nanomaterial 21 described in the first embodiment of the present invention may be used as the substrate 10 and the conductive nanomaterial 21.

In addition, the conductive nanomaterial 21, the UV photosensitive material, the binder, and the solvent may configure a photosensitive coating composition to form the conductive coating film 20. For example, the photosensitive coating composition may include the conductive nanomaterial (metal nanowires) in an amount of 0.01 to 5 wt %, the UV photosensitive material in an amount of 0.1 to 5 wt %, and the binder in an amount of 1 wt % or less, and the solvent, such as water or alcohol may occupy the rest to make 100 wt %.

In addition, the photosensitive coating composition may include the additive selected from the group consisting of polyvinylpyrrolidone, hydroxypropyl methyl cellulose, carboxymethyl cellulose, 2-hydroxyethyl cellulose, and 2-hydroxymethyl cellulose.

In addition, the additive may be selectively used to improve coatability and dispersibility of the photosensitive coating composition, prevent corrosion of the metal nanowires, and improve endurance of the conductive coating film 20. For example, the additive may promote the stability of the photosensitive coating composition (e.g. an oil dispersant), improve wetting and coating properties (e.g. a surfactant or a solvent additive), assist the formation or division of secondary particles, prevent formation of a phase-separated structure during the formation of the conductive coating film 20, or promote drying of the conductive coating film 20.

In addition, in order to further improve the conductivity, uniformity, and environmental stability of the conductive coating film 20, the photosensitive coating solution may further include another additive, such as graphene, graphene oxide, carbon nanoplates, carbon black, or conductive polymers, in addition to the metal nanowires. Such an additive may improve properties of the conductive coating film including the metal nanowires.

For example, the photosensitive coating solution may further include graphene, graphene oxide, carbon nanoplates, carbon black, or conductive polymers of 0.01 to 3 wt %.

The additive and the other additive may be included in the ranges of 0.01 to 5 wt % and 0.001 to 5 wt %, respectively.

According to the fifth embodiment of the present invention, the conductive nanomaterial 21 forming a conductive network may include the metal nanowires or metal nanoribbons. For example, the metal nanowires may include silver nanowires, copper nanowires, gold nanowires, or the like and may preferably include silver nanowires, but is not limited thereto. The metal nanowires may have diameters of 300 nm or less and lengths of 1 µm or more.

As a concentration of the metal nanowires included in the photosensitive coating composition increases, the electrical conductivity of the conductive coating film 20 may be increased and the resistance of the conductive coating film 20 may be decreased. However, when the concentration of the metal nanowires is too high, that is, more than 5 wt %, it is difficult to disperse the metal nanowires in the solution.

The photosensitive material is a material forming cross-links under UV exposure and has a low solubility in a solvent during the washing process after the exposure process. Accordingly, the photosensitive material may form a region having a relatively low electrical conductivity. A representative water-soluble material may be a polyvinyl alcohol, such as "poly(vinyl alcohol),N-methyl-4(4'-formylstyryl)pyridinium methosulfate acetal," but the present invention is not limited thereto. A water-soluble or a water-insoluble material forming chemical bonds by an exposure may be used. Besides the photosensitive resin, whatever material, including a non-photosensitive material or a photoinitiator, in which a chemical reaction occurs under UV exposure, may be used.

The photosensitive material may have a different concentration depending on target resistances of an exposed region 25 and a non-exposed region 27. For example, when forming a pattern of a transparent electrode, the concentration of the photosensitive material may be preferably 0.1 to 5 wt %. However, when the UV photosensitive material is added too much, the transparent electrode may be damaged or a resistance thereof may be increased since the metal nanowires are removed together with the photosensitive material in the non-exposed region 27 during the washing process after the exposure process.

In the photosensitive coating composition according to the fifth embodiment of the present invention, the binder may serve to fix the metal nanowires or the carbon nanotubes not to be removed during the washing process. In addition, the additive or the like may be included to improve coatability, environmental endurance, adhesion, and anticorrosion.

The binder, the dispersant, and the additive described in the second embodiment of the present invention may be used as the binder, the dispersant, and the additive in the fifth embodiment of the present invention.

The conductive coating film 20 according to the fifth embodiment of the present invention may include the conductive nanomaterial 21 uniformly formed on the substrate 10. The conductive coating film 20 may include the exposed region 25 and the non-exposed region 27, wherein the non-exposed region 27 may configure the interconnection pattern 29. The non-exposed region 27 may have a higher electrical conductivity than the exposed region 25.

In addition, the conductive coating film 20 may be formed as a single layer including the metal nanowires, the UV photosensitive material, the binder, and the solvent or may have a structure in which a photosensitive material layer is formed on a conductive nanomaterial layer.

The reason that there is a difference in electrical conductivity between the exposed region 25 and the non-exposed region 27 in the conductive coating film 20 according to the fifth embodiment of the present invention is as follows. Before the conductive coating film 20 is formed, that is, before the UV exposure and washing process, the photosensitive thin film including the conductive nanomaterial 21, the UV photosensitive material, and the binder has a very low electrical conductivity due to the photosensitive material and the binder.

However, when the photosensitive thin film is exposed to UV light, physical or chemical bonds between the photosensitive materials or between the photosensitive material and other compositions may be formed or broken, and thus a difference of solubility in a specific solvent may be generated. However, there is little change in chemical and physical characteristics of the conductive nanomaterial 21 during the exposure process. Here, the specific solvent may be a solvent having a high solubility selectively in the photosensitive material. For example, when a water-soluble photosensitive material is used as the photosensitive material, the water-soluble photosensitive material may have a different solubility in water.

That is, the photosensitive material may have a high solubility in the specific solvent before the exposure process, but have a low solubility in the specific solvent when it is exposed and cured. According to the embodiment of the present invention, the interconnection pattern 29 may be formed using the different solubility of the photosensitive material in the specific solvent.

Accordingly, the exposed region 25 and the non-exposed region 27 of the photosensitive thin film may have different solubilities in the specific solvent. In particular, when the photosensitive thin film includes a large amount of other compositions, the difference in electrical conductivity between the two regions becomes large as much as patterns of a transparent electrode and a circuit electrode are formed. Normally, when in contact with the solvent, a region where more of the photosensitive material and other compositions are removed may have a higher electrical conductivity, and a region where less of the photosensitive material and other compositions are removed may have a lower electrical conductivity.

For example, when the non-exposed region 27 has a higher solubility in the solvent than the exposed region 25, the non-exposed region 27 may be formed as the interconnection pattern 29.

According to the fifth embodiment of the present invention, a topcoating layer 40 (please refer to FIG. 32) may be formed on the above-described conductive coating film 20 including the exposed region 25 and the non-exposed region 27.

Figure 34:
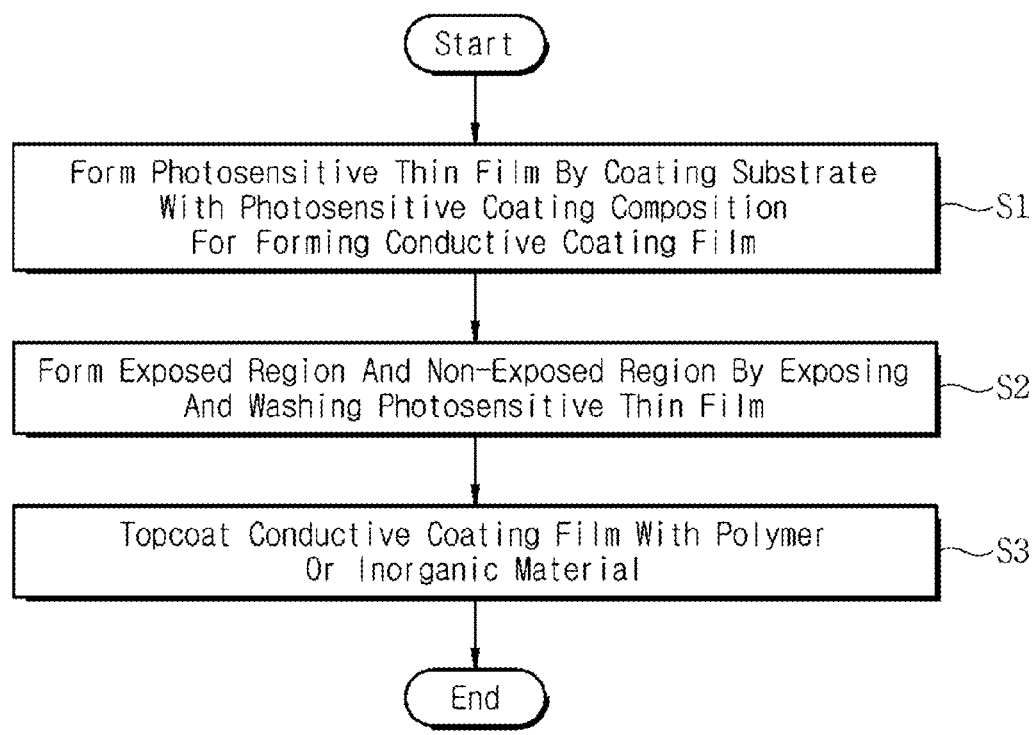
FIG. 34 is a flowchart illustrating a method of fabricating a conductive coating film including a conductive nanomaterial according to a fifth embodiment of the present invention.
Figure 35:
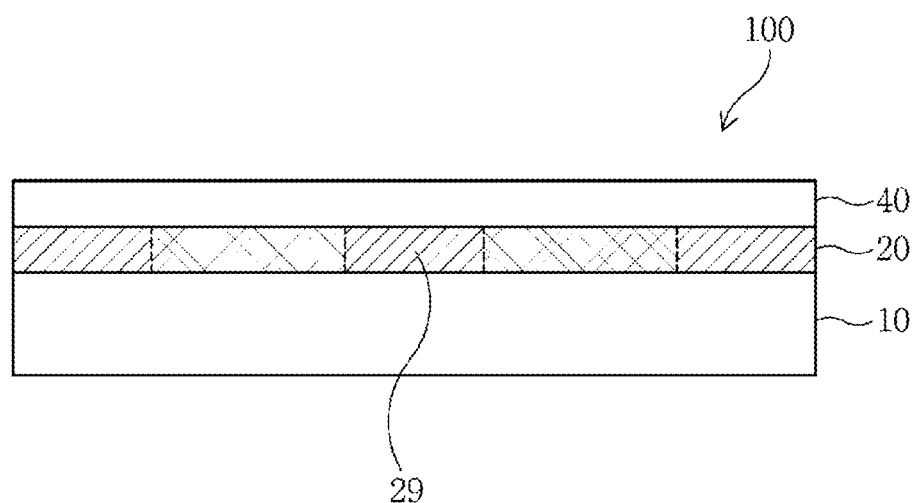
FIG. 35 is a diagram illustrating a process of forming a topcoating layer in the fabricating method of FIG. 4.

A method of fabricating the conductive coating film 20 according to the fifth embodiment of the present invention will be described with reference to FIGS. 1, 2, 4 to 7, 34, and 35. Here, FIG. 34 is a flowchart illustrating the method of fabricating the conductive coating film 20 including the conductive nanomaterial according to the fifth embodiment of the present invention. FIG. 35 illustrates a process of forming the topcoating layer 40 in the fabrication method of FIG. 34.

First, as illustrated in FIG. 4, a substrate 10 for forming a conductive coating film 20 is prepared.

Next, as illustrated in FIG. 5, a photosensitive thin film 23 is formed on the substrate 10 by coating the substrate 10 with photosensitive coating composition for forming the conductive coating film, in a process step S1. Here, the photosensitive coating composition may include the metal nanowires in an amount of 0.01 to 5 wt %, the UV photosensitive material in an amount of 0.1 to 5 wt %, and the binder in an amount of 1 wt % or less, and the solvent may occupy the rest.

Meanwhile, the photosensitive thin film 23 may be formed as a single layer including the metal nanowires, the UV photosensitive material, the binder, and the solvent, or may have a structure in which a photosensitive material layer is formed on a metal nanowire layer.

Next, as illustrated in FIG. 6, portions of the photosensitive thin film 23 are exposed in a process step S2. That is, the photosensitive thin film 23 is exposed to UV light using a mask 30 in which a pattern hole 31 corresponding to a region to be exposed is formed.

During the exposure process, the UV exposure time may be normally several minutes, preferably several seconds. During the exposure process, there is little change in chemical and physical characteristics of the metal nanowires during the exposure process.

Next, as illustrated in FIG. 7, the photosensitive thin film exposed in the process step S2 is washed with the solvent and dried. Thus, a conductive coating film 20 having an interconnection pattern 29 may be fabricated. That is, since the non-exposed region 27 has a relatively higher solubility in the solvent than the exposed region 25, more of the photosensitive material and other compositions may be removed in the non-exposed region 27 than in the exposed region 25.

In addition, as illustrated in FIG. 35, a topcoating layer 40 is formed by topcoating the conductive coating film 20 with polymers or an inorganic material in a process step S3. Here, the topcoating layer 40 may be formed by coating the conductive coating film 20 with the polymer selected from the group consisting of polyurethane, polyacrylate, epoxy, polyimide, polyester, polyacrylic acid, polyvinyl alcohol, and polyethyleneimine, or a sol solution including silicon oxide or titanium oxide as a main component by a topcoating method.

When polyvinyl alcohol or polyacrylic acid which has an excellent moisture absorption is applied as the topcoating material forming the topcoating layer 40 according to the embodiment of the present invention, a phenomenon in which shrinkage of the conductive coating film due to an abrupt drying of moisture, and degradation in insulation may be minimized since the polyvinyl alcohol or polyacrylic acid induces absorption of the moisture and decreases a drying speed of existing moisture adsorbed onto a patterned film.

In the conductive substrate 100 fabricated by the method according to the embodiment of the present invention, the conductive coating film 20 may not be directly etched. Further, the conductive coating film 20 having the interconnection pattern 29 capable of flowing currents by controlling an electrical conductivity of a specific region may be formed without damage and a chemical change of the metal nanowires, which are conductive fillers of the conductive coating film 20.

The photosensitive thin film according to the embodiment of the present invention may include the metal nanowires, the UV photosensitive material, and the binder, and may further include other compositions, such as the dispersant and the additive.

When the photosensitive thin film is exposed to UV light, physical or chemical bonds between the photosensitive materials or between the photosensitive material and the other compositions may be formed or broken, and thus a difference of solubility in a specific solvent such as water may be generated. When in contact with the solvent, a region where more of the photosensitive material and the other compositions are removed may have a higher electrical conductivity, and a region where less of the photosensitive material and the other compositions are removed may have a lower electrical conductivity. For example, when the photosensitive thin film is exposed and washed with the solvent, more of the photosensitive material and the other compositions may be removed in the non-exposed region 27 than in the exposed region 25. Accordingly, electrical conductivities of the exposed region 25 and the non-exposed region 27 may become sufficiently different from each other for a pattern for flowing currents to be formed.

According to the embodiment of the present invention, the interconnection pattern 29 flowing currents in a specific pattern using a difference in electrical conductivity in a local area of the conductive coating film 20 may be formed by a simple exposure process without directly etching the conductive coating film 20 including the conductive nanomaterial.

In addition, according to the embodiment of the present invention, a conductive substrate 100 including the conductive nanomaterial, which is not chemically and physically etched, not chemically oxidized or sulfurized, and not physically damaged in a specific region of the conductive coating film 20, may be provided.

Further, in the conductive coating film 20 according to the embodiment of the present invention, since the metal nanowires remain similarly in the exposed region 25 and the non-exposed region 27 even after the exposure and washing process, a phenomenon in which the interconnection pattern is shown may be prevented.

According to the embodiment of the present invention, a topcoating layer may be formed on the conductive coating film 20 including the exposed region 25 and the non-exposed region 27 as described above.

When polyethyleneimine is topcoated as a topcoating material to form the topcoating layer 40, environmental stability may be secured since an amine functional group has an anti-corrosion effect on silver when silver nanowires are used as the metal nanowires according to the embodiment of the present invention.

According to the embodiment of the present invention, since the conductive coating film 20 patterned by an etch-free process is coated with the topcoating layer 40, the difference in level between an insulating region and a non-insulating region may be relieved and surface roughness caused by the patterning process may be reduced. In addition, since the metal nanowires is coated with the topcoating layer 40, oxidation of the metal nanowires due to a contact with air and an abrupt adsorption of moisture and an abrupt drying of moisture due to environmental changes may be prevented. Accordingly, degradation in insulation due to changes in volume of the insulating region may be minimized.

The topcoating layer 40 according to the embodiment of the present invention may further include a corrosion inhibitor or a color coordinate control material.

The topcoating layer 40 according to the embodiment of the present invention may preferably have a thickness of 0.001 to 1000 μm. When the thickness of the topcoating layer 40 is out of the range, the effect of improving visibility may be insignificant.

The conductive coating film 20 fabricated according to the embodiment of the present invention has a thickness with excellent haze characteristics of 0.4 to 1.4.

Characteristics of the conductive coating film according to the embodiment of the present invention will be described in the following specific experimental examples.

EXPERIMENTAL EXAMPLE 5-1

A conductive coating film according to the experimental example 5-1 of the present invention includes a PET film as a substrate, and silver nanowires as a conductive nanomaterial.

That is, according to the experimental example 5-1 of the present invention, a pattern consisting of a high conductive region and a low conductive region is formed by coating the substrate with a silver nanowire coating solution including silver nanowires, photosensitive polyvinyl alcohol, which is a water-soluble photosensitive material, and a water-dispersible polyurethane binder. The silver nanowires have diameters of 20 to 40 nm and lengths of 10 to 20 μm. Here, the silver nanowire coating solution includes the silver nanowires in an amount of 0.15 wt %, the photosensitive polyvinyl alcohol in an amount of 0.5 wt %, which is the water-soluble photosensitive material, HPMC in an amount of 0.3 wt %, which is a dispersant, and the water-dispersible polyurethane binder in an amount of 0.04 wt %.

A topcoating layer is formed by topcoating the conductive coating film, formed by coating the substrate with the silver nanowire coating solution, with polyacrylate in a thickness of 0.1 μm. Accordingly, the conductive coating film is formed.

COMPARATIVE EXAMPLE 5-1

According to the comparative example 5-1, a conductive coating film is formed by the same method as described in the experimental example 5-1 of the present invention, except that a polyacrylate topcoating layer is not formed.

The conductive coating film fabricated according to the experimental example 5-1 of the present invention has hazes of 1.3 to 1.4, but the conductive coating film fabricated according to the comparative example 5-1 has hazes of 1.6 to 1.7. In addition, while the exposed region is not visible in the transparent conductive film fabricated according to the experimental example 5-1 of the present invention, but is visible slightly visible as semitransparent lines in the transparent conductive film fabricated according to the comparative example 5-1. Accordingly, a pattern visibility of the transparent electrode in the comparative example 5-1 is poor compared to that in the experimental example 5-1 of the present invention. Further, when an opposite side of a coating side of the etch-free pattern film formed on the PET film is strongly rubbed, insulation characteristics are partially degraded in the conductive coating film fabricated according to the comparative example 5-1. However, the insulation characteristics are maintained in the conductive coating film fabricated according to the experimental example 5-1 of the present invention. This is because the difference in level of an insulating region is decreased due to the topcoating layer and thus the concentration of pressure on the insulating region is prevented. In addition, when exposed to air, the transparent conductive film of the experimental example 5-1 has better resistance stability and insulation stability than that of the comparative example 5-1. For example, after the transparent conductive film is retained for one month under a normal atmospheric environment, the resistance variation thereof is measured to be less than 5% in the experimental example 5-1 of the present invention, and the insulation characteristics thereof are maintained. However, the resistance variation of the transparent conductive film is measured to be about 9% in the comparative example 5-1, and the insulation characteristics are partially degraded in the insulating pattern.

[Sixth Embodiment]

A conductive substrate 100 according to the embodiment of the present invention includes, as illustrated in FIGS. 1 and 2, a substrate 10 and a conductive coating film 20 for forming a transparent electrode, which is formed on the substrate 10, includes a conductive nanomaterial 21, a UV photosensitive material, a binder, a volume-shrinkage inhibitor, and a solvent, and has an interconnection pattern 29 formed by an exposure and washing process.

Here, materials described in the first embodiment of the present invention may be used as the substrate 10 and the conductive nanomaterial 21 according to the embodiment of the present invention.

In addition, the photosensitive coating composition forming the conductive coating film 20 may include the metal nanowires, the UV photosensitive material, the binder, the volume-shrinkage inhibitor, and the solvent. For example, the photosensitive coating composition may include the conductive nanomaterial 21 (metal nanowires) in an amount of 0.01 to 5 wt %, the UV photosensitive material in an amount of 0.1 to 5 wt %, the binder in an amount of 1 wt % or less, and the volume-shrinkage inhibitor in an amount of 0.001 to 3 wt %, and the solvent, such as water or alcohol may occupy the rest to make 100 wt %.

In addition, the photosensitive coating composition may include an additive selected from the group consisting of polyvinylpyrrolidone, hydroxypropyl methyl cellulose, carboxymethyl cellulose, 2-hydroxyethyl cellulose, and 2-hydroxymethyl cellulose.

In addition, the additive may be selectively used to improve coatability and dispersibility of the photosensitive coating solution, prevent corrosion of the metal nanowires, and improve endurance of the conductive coating film 20. For example, the additive may promote the stability of the photosensitive coating solution (e.g. an oil dispersant), improve wetting and coating properties (e.g. a surfactant or a solvent additive), assist the formation or division of secondary particles, prevent formation of a phase-separated structure during the formation of the conductive coating film 20, or promote drying of the conductive coating film 20.

In addition, in order to further improve the conductivity, uniformity, and environmental stability of the conductive coating film 20, the photosensitive coating composition may further include another additive, such as carbon nanotubes, graphene, graphene oxide, or conductive polymers, in addition to the metal nanowires. Such an additive may form a secondary conductive layer or function as the binder, and thus improve properties of the conductive coating film including the metal nanowires.

The additive and the other additive may be included in the ranges of 0.01 to 5 wt % and 0.001 to 5 wt %, respectively.

According to the six embodiment of the present invention, the conductive nanomaterial 21 forming a conductive network may include the metal nanowires or metal nanoribbons. For example, the metal nanowires may include silver nanowires, copper nanowires, gold nanowires, or the like and may preferably include silver nanowires, but are not limited thereto. The metal nanowires may have diameters of 300 nm or less and lengths of 1 µm or more.

As a concentration of the metal nanowires included in the photosensitive coating solution increases, the electrical conductivity of the conductive coating film 20 may be increased and the resistance of the conductive coating film 20 may be decreased. However, when the concentration of the metal nanowires is too high, that is, more than 5 wt %, it is difficult to disperse the metal nanowires in the solution.

The photosensitive material according to the embodiment of the present invention is a material forming cross-links under UV exposure and has a low solubility in a solvent during the washing process after the exposure process. Accordingly, the photosensitive material may form a region having a relatively low electrical conductivity. A representative water-soluble material may be a polyvinyl alcohol, such as "poly(vinyl alcohol) n-methyl-4(4'-formylstyryl) pyridinium methosulfate acetal," but the present invention is not limited thereto. A water-soluble or a water-insoluble material forming chemical bonds under exposure may be used. Besides the photosensitive resin, whatever material, including a non-photosensitive material or a photoinitiator, in which a chemical reaction occurs under UV exposure, may be used.

The volume-shrinkage inhibitor used in the embodiment of the present invention is a material which prevents a thin film from shrinking while the solvent is evaporated during the drying process after the coating process, or increases volume of the thin film by water absorption or temperature variation. As a representative volume-shrinkage inhibitor, ethylene glycol, diethylene glycol, triethylene glycol, polyethylene glycol, polyethylene glycol derivatives, polyethylene oxide, polyvinyl alcohol, poly(hydroxyethyl methacrylate), poly(hydroxymethyl methacrylate), water-soluble or alcohol-soluble hydrogel, or the like may be used. The volume-shrinkage inhibitor may be dissolved in water or alcohol, which is a solvent of the coating solution, to form a coating solution composition. Since the volume-shrinkage inhibitor normally has a high boiling point and does not completely dried in the drying process after the coating process, it prevents the shrinkage of a thin film, absorbs moisture in the atmospheric humidity environment, or increases in volume according to the temperature variation. When the volume-shrinkage inhibitor is added to the coating solution composition and the substrate is coated with the coating solution composition, shrinkage of the thin film occurring while the solvent is evaporated during the drying process after the coating process may be minimized. In addition, the volume-shrinkage inhibitor absorbs moisture and increases in volume while the thin film is washed with water or alcohol after exposed to UV light, or exposed to the atmospheric environment. Due to such a process of volume shrinkage prevention or volume increase, specific chemical materials of the coating solution existing in the exposed region may increase distances between the metal nanowires and improve insulating characteristics. The chemical materials of the coating solution existing in the non-exposed region may be fully or partially removed during the washing process. Accordingly, conductive properties of the non-exposed region may be maintained.

The UV photosensitive material may have a different concentration depending on target resistances of the exposed region 25 and the non-exposed region 27. For example, when forming a pattern of a transparent electrode, the concentration of the photosensitive material may be preferably 0.1 to 5 wt %. However, when the UV photosensitive material is added too much, the transparent electrode may be damaged or a resistance thereof may be increased since the metal nanowires are removed together with the photosensitive material in the non-exposed region 27 during the washing process after the exposure process.

In the photosensitive coating composition according to the embodiment of the present invention, the binder may serve to fix the metal nanowires or the carbon nanotubes not to be removed during the washing process. In addition, the additive or the like may be included to improve coatability, environmental endurance, adhesion, and anti-corrosion.

The binder, the dispersant, and the additive described in the second embodiment of the present invention may be used as the binder, the dispersant, and the additive in the embodiment of the present invention.

The conductive coating film 20 according to the embodiment of the present invention may include the conductive nanomaterial 21 uniformly formed on the substrate 10. The conductive coating film 20 includes the exposed region 25 and the non-exposed region 27, wherein the non-exposed region 27 may configure the interconnection pattern 29. The non-exposed region 27 may have a higher electrical conductivity than the exposed region 25.

In addition, the conductive coating film 20 may be formed as a single layer including the metal nanowires, the UV photosensitive material, the binder, the volume-shrinkage inhibitor, and the solvent, or may have a structure in which a photosensitive material layer is formed on a conductive nanomaterial layer.

A difference in electrical conductivity between the exposed region 25 and the non-exposed region 27 in the conductive coating film 20 according to the sixth embodiment of the present invention occurs for the following reason. Before the conductive coating film 20 is formed, that is, before the UV exposure and washing process, the photosensitive thin film including the metal nanowires 21, the UV photosensitive material, and the binder has a very low electrical conductivity due to the photosensitive material and the binder.

However, when the photosensitive thin film is exposed to UV light, physical or chemical bonds between the photosensitive materials or between the photosensitive material and other compositions may be formed or broken, and thus a difference of solubility in a specific solvent may be generated. However, there is little change in chemical and physical characteristics of the metal nanowires 21 during the exposure process. Here, the specific solvent may be a solvent having a high solubility selectively in the photosensitive material. For example, when a water-soluble photosensitive material is used as the photosensitive material, the water-soluble photosensitive material may have a different solubility in water.

That is, the photosensitive material may have a high solubility in the specific solvent before the exposure process, but have a low solubility in the specific solvent when it is exposed and cured. According to the embodiment of the present invention, the interconnection pattern 29 may be formed using the different solubility of the photosensitive material in the specific solvent.

Accordingly, the exposed region 25 and the non-exposed region 27 of the photosensitive thin film may have different solubilities in the specific solvent. In particular, when the photosensitive thin film includes a large amount of other compositions, the difference in electrical conductivity between the two regions becomes sufficiently large for patterns of a transparent electrode and a circuit electrode are formed. Normally, when in contact with the solvent, a region where more of the photosensitive material and other compositions are removed may have a higher electrical conductivity, and a region where less of the photosensitive material and other compositions are removed may have a lower electrical conductivity.

For example, when the non-exposed region 27 has a higher solubility in the solvent than the exposed region 25, the non-exposed region 27 may be formed as the interconnection pattern 29.

Figure 36:
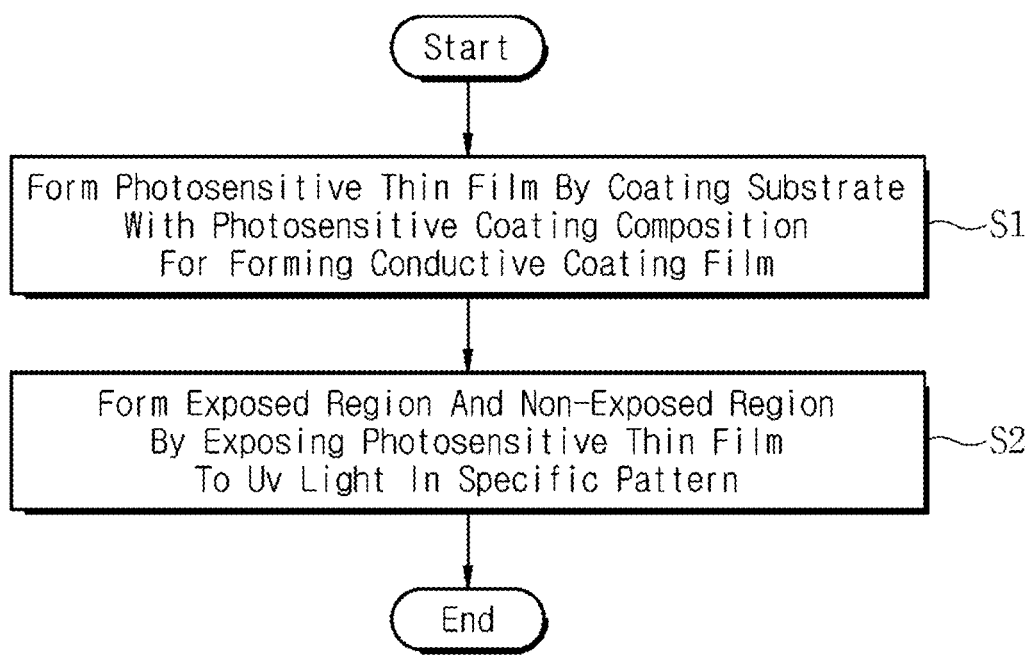
FIG. 36 is a flowchart illustrating a method of fabricating a conductive coating film including a conductive nanomaterial according to a sixth embodiment of the present invention.

A method of fabricating the conductive coating film 20 according to the fifth embodiment of the present invention will be described with reference to FIGS. 1, 2, 4 to 7, and 36. Here, FIG. 36 is a flowchart illustrating the method of fabricating the conductive coating film 20 including the conductive nanomaterial according to the sixth embodiment of the present invention.

First, as illustrated in FIG. 4, a substrate 10 for forming a conductive coating film 20 is prepared.

Next, as illustrated in FIG. 5, a photosensitive thin film 23 is formed on the substrate 10 by coating the substrate 10 with photosensitive coating composition for forming the conductive coating film, in a process step S1. Here, the photosensitive coating composition may include metal nanowires in an amount of 0.01 to 5 wt %, a UV photosensitive material in an amount of 0.1 to 5 wt %, a binder in an amount of 1 wt % or less, and a volume-shrinkage inhibitor in an amount of 0.001 to 3 wt %, and a solvent may occupy the rest.

Meanwhile, the photosensitive thin film 23 may be formed as a single layer including the metal nanowires, the UV photosensitive material, the binder, the volume-shrinkage inhibitor, and the solvent, or may have a structure in which a photosensitive material layer is formed on a metal nanowire layer.

Next, as illustrated in FIG. 6, portions of the photosensitive thin film 23 are exposed in a process step S2. That is, the photosensitive thin film 23 is exposed to UV light using a mask 30 in which a pattern hole 31 corresponding to a region to be exposed is formed.

During the exposure process, the UV exposure time may be normally several minutes, preferably several seconds. During the exposure process, there is little change in chemical and physical characteristics of the metal nanowires during the exposure process.

Next, as illustrated in FIG. 7, the photosensitive thin film exposed in the process step S2 is washed with the solvent and dried. Thus, a conductive substrate 100 in which a conductive coating film 20 having an interconnection pattern 29 is formed may be fabricated. That is, since the non-exposed region 27 has a relatively higher solubility in the solvent than the exposed region 25, more of the photosensitive material and other compositions may be removed in the non-exposed region 27 than in the exposed region 25.

In the conductive substrate 100 fabricated by the method according to the embodiment of the present invention, the conductive coating film 20 may not be directly etched. Further, the conductive coating film 20 having the interconnection pattern 29 capable of flowing currents by controlling an electrical conductivity of a specific region may be formed without damage and a chemical change of the metal nanowires, which are conductive fillers of the conductive coating film 20.

The photosensitive thin film according to the sixth embodiment of the present invention may include the conductive nanomaterial, the UV photosensitive material, the binder, and the volume-shrinkage inhibitor, and may further include other compositions, such as the dispersant and the additive.

When the photosensitive thin film is exposed to UV light, physical or chemical bonds between the photosensitive materials or between the photosensitive material and the other compositions may be formed or broken, and thus a difference of solubility in a specific solvent such as water may be generated. When in contact with the solvent, a region where more of the photosensitive material and the other compositions are removed may have a higher electrical conductivity, and a region where less of the photosensitive material and the other compositions are removed may have a lower electrical conductivity. For example, when the photosensitive thin film is exposed and washed with the solvent, more of the photosensitive material and the other compositions may be removed in the non-exposed region 27 than in the exposed region 25. Accordingly, electrical conductivities of the exposed region 25 and the non-exposed region 27 may become sufficiently different from each other for a pattern for flowing currents to be formed.

According to the embodiment of the present invention, the interconnection pattern 29 flowing currents in a specific pattern using a difference in electrical conductivity in a local area of the conductive coating film 20 may be formed by a simple exposure process without directly etching the conductive coating film 20 including the conductive nanomaterial.

In addition, according to the embodiment of the present invention, a conductive substrate 100 including the conductive nanomaterial, which is not chemically and physically etched, not chemically oxidized or sulfurized, and not physically damaged in a specific region of the conductive coating film 20, may be provided.

Further, in the conductive coating film 20 according to the sixth embodiment of the present invention, since the metal nanowires remain similarly in the exposed region 25 and the non-exposed region 27 even after the exposure and washing process, a phenomenon in which the interconnection pattern 21 is visible may be prevented.

In addition, since the conductive coating film 20 according the sixth embodiment of the present invention includes the volume-shrinkage inhibitor, when the volume-shrinkage inhibitor is added to the coating solution composition and the substrate is coated with the coating solution composition, shrinkage of the thin film occurring while the solvent is evaporated during the drying process after the coating process may be minimized and the thin film may be increased in volume by absorbing moisture while the thin film is washed with water or alcohol after exposed to UV light or exposed to the atmospheric environment. Due to such a process of volume increase, the volume-shrinkage inhibitor existing in the exposed region 25 may increase distances between the metal nanowires and improve insulating characteristics. The volume-shrinkage inhibitor existing in the non-exposed region 27 may be fully or partially removed during the washing process. Accordingly, conductive properties of the non-exposed region may be maintained.

Characteristics of the conductive coating film in the conductive substrate according to the sixth embodiment of the present invention will be described in the following specific experimental examples.

EXPERIMENTAL EXAMPLE 6-1

A conductive substrate according to the experimental example 6-1 of the present invention includes a PET film as a substrate, and silver nanowires as a conductive nanomaterial.

That is, according to the experimental example 6-1 of the present invention, a pattern consisting of a high conductive region and a low conductive region is formed by coating the substrate with a silver nanowire coating solution including silver nanowires, photosensitive polyvinyl alcohol, which is a water-soluble photosensitive material, and a water-dispersible polyurethane binder. The silver nanowires have diameters of 20 to 40 nm and lengths of 10 to 20 µm. Here, the silver nanowire coating solution includes the silver nanowires (0.15 wt %), the photosensitive polyvinyl alcohol (0.5 wt %), which is the water-soluble photosensitive material, HPMC (0.3 wt %), which is a dispersant, the water-dispersible polyurethane binder (0.04 wt %), and diethylene glycol (0.5 wt %).

The substrate is coated with the aqueous silver nanowire dispersions by a bar coating method, and the coated substrate is dried at a temperature of 130° C. for 1 minute. The dried photosensitive compound conductive film has a high sheet resistance exceeding the measurement limit of the sheet-resistance measuring instrument (10 MΩ/sq or more). The photosensitive compound conductive film is irradiated with UV light for 3 seconds to form a specific pattern using a chrome photomask, post-baked at a temperature of 130° C. for 5 minutes, washed with water, the solvent, and dried. An exposed region of the photosensitive compound conductive film includes straight lines having various line widths as illustrated in FIG. 24. Insulating characteristics according to the line widths of the exposed lines are examined.

As a result, the UV-exposed lines of the conductive coating film are slightly visible as semitransparent lines. However, when the conductive coating film is over-coated with another polymer material or another film is attached to the conductive coating film, the semitransparent lines of the exposed lines are invisible. The exposed lines have straight lines having various line widths as illustrated in the following FIG. 24, and a resistance of each of the exposed lines as boundary lines is measured.

All the resistances between the areas A and B, between the areas B and C, between the areas C and D, and between the areas D and E in FIG. 24 are 10 MΩ/sq or more, which are values exceeding the measurement limit of the resistance measuring instrument. The resistance between the areas E and F is in the range of 50 to 60 kΩ, and the resistance between the areas F and G is in the range of 10 to 20 kΩ. Each of the areas A to G is a non-exposed area in which the photosensitive material, chemical materials, and other components are washed and removed, and has a high electrical conductivity. The areas have sheet resistances of 110 to 140 Ω/sq, light transmittances of about 90%, and hazes of about 1.6.

In addition, in order to ensure that there is no damage in the silver nanowires due to the UV exposure by measuring electrical characteristics by measuring electrical characteristics, the substrate coated with silver nanowires is exposed again to UV light in the same conditions for 5 seconds, and then sheet resistances of the areas A to G are measured again. Before the UV exposure, the areas A to G have the sheet resistances of 110 to 140 Ω/sq, the light transmittances of about 90%, and hazes of about 1.6. After exposed to UV light for 5 seconds, the areas A to G have the sheet resistances of 110 to 140 Ω/sq, the light transmittances of about 90%, and hazes of about 1.6. Accordingly, it can be seen there is little degradation in characteristics of the silver nanowires due to the UV exposure for 5 seconds or less.

In order to ensure insulation stability at high temperature, the film of FIG. 24 is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, between the areas C and D, and between the areas D and E are 10 MΩ/sq or more, which are values exceeding the measurement limit of the resistance measuring instrument. The resistance between the areas E and F is in the range of 40 to 60 kΩ, and the resistance between the areas F and G is in the range of 3 to 10 kΩ. That is, there is little change in resistance.

EXPERIMENTAL EXAMLPE 6-2

A coating solution including carbon nanotubes (0.03 wt %), silver nanowires (0.15 wt %), photosensitive polyvinyl alcohol (0.5 wt %), which is a water-soluble photosensitive material, a polyurethane binder (0.04 wt %), and triethylene glycol (0.5 wt %) is fabricated.

The carbon nanotubes are single-wall carbon nanotubes, and the silver nanowires have diameters of 20 to 40 nm and lengths of 10 to 30 µm. A PET film is coated with the coating solution by a bar coating method, and the coated substrate is dried at a temperature of 130° C. for 1 minute. The dried photosensitive conductive film has a high sheet resistance exceeding the measurement limit of the sheet-resistance measuring instrument (10 MΩ/sq or more). The photosensitive conductive film is irradiated with UV light for 3 seconds to form a specific pattern using a chrome photomask, post-baked at a temperature of 130° C. for 5 minutes, washed with water, the solvent, and dried. An exposed region of the photosensitive compound conductive film includes straight lines having various line widths as illustrated in FIG. 24. Insulating characteristics according to the line widths of the exposed lines are examined.

As a result, the UV-exposed lines of the conductive coating film are slightly visible as semitransparent lines. However, when the conductive coating film is over-coated with another polymer material or another film is attached to the conductive coating film, the semitransparent lines of the exposed lines are invisible. The exposed lines have straight lines having various line widths as illustrated in the following FIG. 24, and a resistance of each of the exposed lines as boundary lines is measured. The resistances between the areas A and B, between the areas B and C, between the areas C and D, and between the areas D and E are 10 MΩ/sq or more, which are values exceeding the measurement limit of the resistance measuring instrument. That is, the exposed lines have a high level of insulation. The resistance between the areas E and F is in the range of 40 to 60 kΩ, and the resistance between the areas F and G is about 10 kΩ. Each of the areas A to G is a non-exposed area in which the photosensitive material, a volume-shrinkage inhibitor, and other compositions are washed and removed, and has a high electrical conductivity. The areas have sheet resistances of 110 to 130 Ω/sq, light transmittances of about 89.5%, and hazes of about 1.5.

In addition, in order to ensure that there is no damage in the silver nanowires due to the UV exposure by measuring electrical characteristics by measuring electrical characteristics, the conductive coating substrate is exposed again to UV light in the same conditions for 5 seconds, and then sheet resistances of the areas A to G are measured again. Before the UV exposure, the areas A to G have the sheet resistances of 110 to 140 Ω/sq, the light transmittances of about 89%, and hazes of about 1.5. After exposed to UV light for 5 seconds, the areas A to G have the sheet resistances of 110 to 130 Ω/sq, the light transmittances of about 89.4%, and hazes of about 1.5. Accordingly, it can be seen there is little degradation in characteristics of the silver nanowires due to the UV exposure for 5 seconds or less.

In order to ensure insulation stability of the UV-exposed region, the film of FIG. 24 is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, between the areas C and D, and between the areas D and E are 10 MΩ/sq or more, which are values exceeding the measurement limit of the resistance measuring instrument. The resistance between the areas E and F is about 40 kΩ, and the resistance between the areas F and G is about 4 kΩ. That is, there is little change in resistance.

COMPARATIVE EXAMPLE 6-1

A substrate is coated with the same silver nanowire coating solution as that in the experimental example 6-1 of the present invention, except that the silver nanowire coating solution does not include diethylene glycol, and the coated substrate is exposed and washed to form a pattern including a high conductive region and a low conductive region.

All the resistances between the areas A and B, between the areas B and C, between the areas C and D, and between the areas D and E in FIG. 24 are 10 MΩ/sq or more, which are values exceeding the measurement limit of the resistance measuring instrument. That is, the exposed lines have a high level of insulation. The resistance between the areas E and F is in the range of 20 to 40 kΩ, and the resistance between the areas F and G is in the range of 3 to 10 kΩ. Each of the areas A to G is a non-exposed area in which the photosensitive material and other compositions are washed and removed, and has a high electrical conductivity. The areas have sheet resistances of 120 to 150 Ω/sq, light transmittances of about 90%, and hazes of about 1.5.

In order to ensure insulation stability of the UV-exposed region, the film of is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, and between the areas C and D are 10 MΩ/sq or more, which are values exceeding the measurement limit of the resistance measuring instrument. However, the resistance between the areas D and E is decreased by about 4 to 10 kΩ, and the resistances between the areas E and F and between the areas F and G are decreased by 10 kΩ or less. That is, since the photosensitive material and the conductive particles in the exposed region are rearranged and electrical connections therebetween are generated during the heat treatment at the temperature of 130° C., insulating characteristics may be a little degraded.

COMPARATIVE EXAMPLE 6-2

A pattern is formed by coating a PET film with the same aqueous carbon nanotube/silver nanowire dispersions as that in the experimental example 6-2 of the present invention, except that the aqueous carbon nanotube/silver nanowire dispersions do not include triethylene glycol, using a bar coating method.

All the resistances between the areas A and B, between the areas B and C, between the areas C and D, and between the areas D and E in FIG. 24 are 10 MΩ/sq or more, which are values exceeding the measurement limit of the resistance measuring instrument. That is, the exposed lines have a high level of insulation. The resistance between the areas E and F is about 55 kΩ, and the resistance between the areas F and G is about 4 kΩ. Each of the areas A to G is a non-exposed area in which the photosensitive material and other compositions are washed and removed, and has a high electrical conductivity. The areas have sheet resistances of 120 to 150 Ω/sq, light transmittances of about 90%, and hazes of about 1.5.

In order to ensure insulation stability at high temperature, the film in which the pattern is formed is retained in an oven at a temperature of 130° C. for 1 hour, resistances between the areas A and B, between the areas B and C, between the areas C and D, between the areas D and E, between the areas E and F, and between the areas F and G are measured. As a result of the measurement, the resistances between the areas A and B, between the areas B and C, and between the areas C and D are 10 MΩ/sq or more, which are values exceeding the measurement limit of the resistance measuring instrument. However, the resistance between the areas D and E is decreased to 18 kΩ, and the resistances between the areas E and F and between the areas F and G are decreased to 10 kΩ or less.

That is, since the the thin film shrinks during the heat treatment at the temperature of 130° C., the photosensitive material and the conductive particles in the exposed region are rearranged, electrical connections therebetween are generated, and insulating characteristics may be degraded in some degrees.

Embodiments and accompanying drawings are merely provided so that this disclosure is thorough and complete and fully conveys the inventive concept to those skilled in the art. However, the inventive concept should not be construed as limited to the embodiments set forth herein. It will be apparent to those skilled in the art that various modifications can be made to the above-described exemplary embodiments of the present invention without departing from the spirit or scope of the invention.

The invention claimed is:

1. A photosensitive coating composition for fabricating a conductive coating film,
the composition comprising:
a conductive nanomaterial, which forms a conductive network;
nanoparticles which have a low electrical conductivity or a low aspect ratio, compared to the conductive nanomaterial;

a photosensitive material;
a binder; and
a solvent,
wherein the conductive nanomaterial is metal nanowires or carbon nanotubes,
wherein the nanoparticles are oxide nanowires, oxide nanoparticles, metal nanoparticles, or carbon nanoparticles, and
wherein the photosensitive material is a polyvinyl alcohol having a photosensitive functional group N-methyl-4 (4'-formylstyryl) pyridinium methosulfate acetal.

2. The photosensitive coating composition for fabricating a conductive coating film of claim 1, wherein the composition comprises the conductive nanomaterial in an amount of 0.01 to 5 wt %, the nanoparticles in an amount of 0.01 to 0.5 wt %, the photosensitive material in an amount of 0.01 to 3 wt %, and the binder in an amount of 1 wt % or less.

3. The photosensitive coating composition for fabricating a conductive coating film for a transparent electrode of claim 2, wherein the composition further comprises an interconnecting agent in an amount of 0.01 to 3 wt %,
wherein the interconnecting agent includes an acid, a photo acid-generator, a thermal acid-generator, or a dichromate.

4. The photosensitive coating composition for fabricating a conductive coating film for a transparent electrode of claim 3, wherein the interconnecting agent is one of the photo acid-generator in an amount of 0.01 to 3 wt %, the thermal acid-generator in an amount of 0.01 to 3 wt %, the dichromate in an amount of 0.01 to 1 wt %, and the acid configured to control pH of the photosensitive coating composition to be in the range of 3 to 6.

5. The photosensitive coating composition for fabricating a conductive coating film of claim 2, wherein the composition further comprises a volume shrinkage inhibitor in an amount of 0.001 to 30 wt %,
wherein the volume shrinkage inhibitor is one selected from the group consisting of ethylene glycol, diethylene glycol, triethylene glycol, polyethylene glycol, polyethylene glycol derivatives, polyethylene oxide, a polyvinyl alcohol, poly(hydroxyethyl methacrylate), poly(hydroxymethyl methacrylate), and a water-soluble or alcohol-soluble hydrogel.

6. The photosensitive coating composition for fabricating a conductive coating film of claim 1, wherein the solvent includes water or alcohol.

7. A conductive coating film formed on a substrate,
the film comprising:
a conductive nanomaterial which forms a conductive network;
nanoparticles which have a low electrical conductivity or a low aspect ratio compared to the conductive nanomaterial;
a photosensitive material; and
a binder,
wherein the conductive nanomaterial is metal nanowires or carbon nanotubes,
wherein the nanoparticles are oxide nanowires, oxide nanoparticles, metal nanoparticles, or carbon nanoparticles,
wherein the photosensitive material is a polyvinyl alcohol having a photosensitive functional group N-methyl-4 (4'-formylstyryl) pyridinium methosulfate acetal,
wherein an exposed region and a non-exposed region are formed by an exposure and washing process; and
wherein the electrical conductivity of the non-exposed region is twice that of the exposed region or more.

8. A conductive coating film formed on a substrate by coating the substrate with a photosensitive coating solution including a conductive nanomaterial that forms a conductive network in an amount of 0.01 to 5 wt %, nanoparticles that have a low electrical conductivity or a low aspect ratio compared to the conductive nanomaterial in an amount of 0.01 to 0.5 wt %, a photosensitive material in an amount of 0.01 to 3 wt %, and a binder in an amount of 1 wt % or less,
wherein an exposed region and a non-exposed region are formed by exposing and washing the conductive coating film,
wherein the electrical conductivity of the exposed region is different from that of the non-exposed region,
wherein the conductive nanomaterial is metal nanowires or carbon nanotubes;
wherein the nanoparticles are oxide nanowires, oxide nanoparticles, metal nanoparticles, or carbon nanoparticles, and
wherein the photosensitive material is a polyvinyl alcohol having a photosensitive functional group N-methyl-4 (4'-formylstyryl) pyridinium methosulfate acetal.

9. The conductive coating film of claim 8, wherein the photosensitive coating solution further includes an interconnecting agent in an amount of 0.01 to 3 wt %,
wherein the interconnecting agent includes an acid, a photo acid-generator, a thermal acid-generator, or a dichromate.

10. The conductive coating film of claim 9, wherein the interconnecting agent of the photosensitive coating solution is one of the photo acid-generator in an amount of 0.01 to 3 wt %, the thermal acid-generator in an amount of 0.01 to 3 wt %, the dichromate in an amount of 0.01 to 1 wt %, and the acid configured to control pH of the photosensitive coating solution to be in a range of 3 to 6.

11. The conductive coating film of claim 8, wherein the photosensitive coating solution further includes a volume shrinkage inhibitor in an amount of 0.001 to 30 wt %, and
the volume shrinkage inhibitor is one selected from the group consisting of ethylene glycol, diethylene glycol, triethylene glycol, polyethylene glycol, polyethylene glycol derivatives, polyethylene oxide, a polyvinyl alcohol, poly(hydroxyethyl methacrylate), poly(hydroxymethyl methacrylate), and a water-soluble or alcohol-soluble hydrogel.

12. The conductive coating film of claim 8, further comprising a topcoating layer obtained by coating the conductive coating film with a polymer or an inorganic material.

13. A method of fabricating a conductive coating film, the method comprising:
forming a photosensitive thin film, which includes a conductive nanomaterial that forms a conductive network, nanoparticles that have a low electrical conductivity or a low aspect ratio compared to the conductive nanomaterial, a photosensitive material and a binder, on a substrate;
exposing a portion of the photosensitive thin film; and
forming a conductive coating film including an interconnection pattern by washing the exposed photosensitive thin film with a solvent and thereby generating a difference in electrical conductivity between an exposed region and a non-exposed region,
wherein the conductive nanomaterial is metal nanowires or carbon nanotubes,
wherein the nanoparticles are oxide nanowires, oxide nanoparticles, metal nanoparticles, or carbon nanoparticles, and wherein the photosensitive material is polyvinyl alcohol having a photosensitive functional group N-methyl-4 (4'-formylstyryl) pyridinium methosulfate acetal.

14. The method of claim 13, wherein the difference in electrical conductivity between the exposed region and the non-exposed region is generated by a difference in solubility between the exposed region and the non-exposed region in the solvent when forming the conductive coating film, and whichever of the exposed region and the non-exposed region has a higher solubility during the washing process forms the interconnection pattern.

15. The method of claim 13, wherein the forming of the photosensitive thin film includes one of forming the photosensitive thin film as a single layer including the conductive nanomaterial and the photosensitive material and forming the photosensitive thin film by forming a conductive nanomaterial layer on the substrate and then forming a photosensitive material layer on the conductive nanomaterial layer.

16. The method of claim 13, further comprising forming a topcoating layer with a polymer or an inorganic material on the conductive coating film.

* * * * *